United States Patent
Masuyama et al.

(10) Patent No.: US 10,520,810 B2
(45) Date of Patent: Dec. 31, 2019

(54) PROCESS FOR PRODUCING PHOTORESIST PATTERN AND PHOTORESIST COMPOSITION

(71) Applicant: SUMITOMO CHEMICAL COMPANY, LIMITED, Tokyo (JP)

(72) Inventors: Tatsuro Masuyama, Osaka (JP); Koji Ichikawa, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/591,488

(22) Filed: May 10, 2017

(65) Prior Publication Data

US 2017/0329224 A1 Nov. 16, 2017

(30) Foreign Application Priority Data

May 13, 2016 (JP) ................................ 2016-097146

(51) Int. Cl.
| | |
|---|---|
| *G03F 7/038* | (2006.01) |
| *G03F 7/20* | (2006.01) |
| *G03F 7/004* | (2006.01) |
| *G03F 7/32* | (2006.01) |
| *G03F 7/38* | (2006.01) |
| *C08F 220/18* | (2006.01) |
| *C08F 220/28* | (2006.01) |
| *G03F 7/16* | (2006.01) |

(52) U.S. Cl.
CPC ............ *G03F 7/038* (2013.01); *C08F 220/18* (2013.01); *C08F 220/28* (2013.01); *G03F 7/0045* (2013.01); *G03F 7/0046* (2013.01); *G03F 7/162* (2013.01); *G03F 7/168* (2013.01); *G03F 7/2006* (2013.01); *G03F 7/2041* (2013.01); *G03F 7/325* (2013.01); *G03F 7/38* (2013.01); *C08F 2220/283* (2013.01)

(58) Field of Classification Search
None
See application file for complete search history.

(56) References Cited

U.S. PATENT DOCUMENTS

| | | |
|---|---|---|
| 2002/0120053 A1 | 8/2002 | Mills et al. |
| 2006/0194982 A1 | 8/2006 | Harada et al. |
| 2007/0027336 A1 | 2/2007 | Yoshida et al. |
| 2010/0209740 A1 | 8/2010 | Ayama et al. |
| 2013/0022920 A1* | 1/2013 | Ichikawa ............. G03F 7/0397 430/281.1 |
| 2016/0002494 A1 | 1/2016 | Yamamoto et al. |
| 2017/0329219 A1* | 11/2017 | Masuyama ........... G03F 7/0045 |
| 2017/0329223 A1* | 11/2017 | Masuyama ........... C08F 220/18 |

FOREIGN PATENT DOCUMENTS

| | | | | |
|---|---|---|---|---|
| JP | 2012-232972 | * | 12/2012 | ............. G03F 7/039 |
| JP | 2013-41257 A | | 2/2013 | |
| JP | 2013-234209 A | | 11/2013 | |
| JP | 2013-235252 | * | 11/2013 | ............. G03F 7/039 |
| JP | 2014-016600 | * | 1/2014 | ............. G03F 7/039 |
| JP | 2014-115631 A | | 6/2014 | |
| JP | 2014-166983 | * | 9/2014 | ............. G03F 7/039 |
| JP | 2014-199268 | * | 10/2014 | ............. G03F 7/039 |
| JP | 2015-027994 | * | 2/2015 | ............. G03F 7/039 |
| JP | 2015-99899 A | | 5/2015 | |
| WO | WO 2013/024866 A1 | | 2/2013 | |

OTHER PUBLICATIONS

Machine translation of JP 2013-2354252 (Nov. 2013).*
Machine translation of JP 2014-016600 (Jan. 2014).*
Machine translation of JP 2015-027994 (Feb. 2015).*
Machine translation of JP 2014-166983 (Sep. 2014).*

* cited by examiner

*Primary Examiner* — Martin J Angebranndt
(74) *Attorney, Agent, or Firm* — Birch, Stewart, Kolasch & Birch, LLP

(57) ABSTRACT

A process for producing a photoresist pattern comprising steps (1) to (5);
(1) applying a photoresist composition onto a substrate, said photoresist composition comprising an acid generator and a resin which comprises a structural unit having an acid-liable group;
(2) drying the applied composition to form a composition layer;
(3) exposing the composition layer;
(4) heating the exposed composition layer; and
(5) developing the heated composition layer with a developer which comprises butyl acetate,
wherein a distance of Hansen solubility parameters between the resin and butyl acetate is from 3.3 to 4.3,
the distance is calculated from formula (1):

$$R = (4 \times (\delta d_R - 15.8)^2 + (\delta p_R - 3.7)^2 + (\delta h_R - 6.3)^2)_{1/2} \quad (1)$$

in which $\delta d_R$ represents a dispersion parameter of the resin, $\delta p_R$ represents a polarity parameter of the resin, $\delta h_R$ represents a hydrogen bonding parameter of the resin, and R represents the distance, and
a film retention ratio of the photoresist pattern relative to the composition layer is adjusted to 65% or more.

7 Claims, No Drawings

PROCESS FOR PRODUCING PHOTORESIST PATTERN AND PHOTORESIST COMPOSITION

This application claims priority to Japanese Application No. 2016-097146 filed on May 13, 2016. The entire disclosures of Japanese Application No. 2016-097146 is incorporated hereinto by reference.

FIELD OF THE INVENTION

The disclosure relates to a process for producing a photoresist pattern and a photoresist composition.

BACKGROUND ART

As to production of negative photoresist patterns, JP2014-115631A proposes a photoresist composition containing a resin which has not structural unit having an acid-labile group but a structural unit represented by formula (I) and a structural unit represented by formula (a4), a resin which has a structural unit represented by formula (II) and a structural unit having an acid-labile group, and an acid generator.

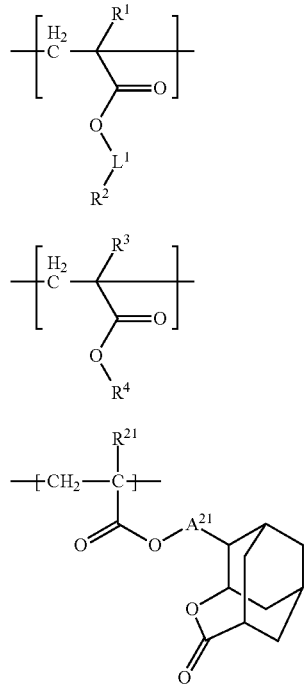

(In the formulae, $R^2$ represents a C3 to C18 alicyclic hydrocarbon group, $R^4$ represents a C1 to C20 saturated hydrocarbon group having a fluorine atom, $A^{21}$ represents a single bond or the like.)

SUMMARY OF THE DISCLOSURE

The disclosure provides following inventions.

[1] A process for producing a photoresist pattern comprising steps (1) to (5);

(1) applying a photoresist composition onto a substrate, the photoresist composition comprising an acid generator and a resin which comprises a structural unit having an acid-liable group;

(2) drying the applied composition to form a composition layer;

(3) exposing the composition layer;

(4) heating the exposed composition layer; and (5) developing the heated composition layer with a developer which comprises butyl acetate, wherein a distance of Hansen solubility parameters between the resin and butyl acetate is from 3.3 to 4.3, the distance is calculated from formula (1):

$$R=(4\times(\delta d_R-15.8)^2+(\delta p_R-3.7)^2+(\delta h_R-6.3)^2)_{1/2} \quad (1)$$

in which $\delta d_R$ represents a dispersion parameter of a resin, $\delta p_R$ represents a polarity parameter of a resin, $\delta h_R$ represents a hydrogen bonding parameter of a resin, and R represents a distance of Hansen solubility parameters, and a film retention ratio of the photoresist pattern relative to the composition layer is adjusted to 65% or more.

[2] A photoresist composition comprising an acid generator and a resin which comprises a structural unit having an acid-liable group;

wherein a distance of Hansen solubility parameters between the resin and butyl acetate is from 3.3 to 4.3, the distance is calculated from formula (1):

$$R=(4\times(\delta d_R-15.8)^2+(\delta p_R-3.7)^2+(\delta h_R-6.3)^2)_{1/2} \quad (1)$$

in which $\delta d_R$ represents a dispersion parameter of a resin, $\delta p_R$ represents a polarity parameter of a resin, $\delta h_R$ represents a hydrogen bonding parameter of a resin, and R represents a distance of Hansen solubility parameters, and the photoresist composition shows a film retention ratio of the photoresist pattern relative to the composition layer in the range of 65% or more.

[3] The photoresist composition according to [2] wherein the distance of Hansen solubility parameters is from 3.6 to 4.0.

[4] The photoresist composition according to [2] wherein the resin comprises at least one selected from the group consisting of a structural unit represented by formula (a1-0) and a structural unit represented by formula (a1-2):

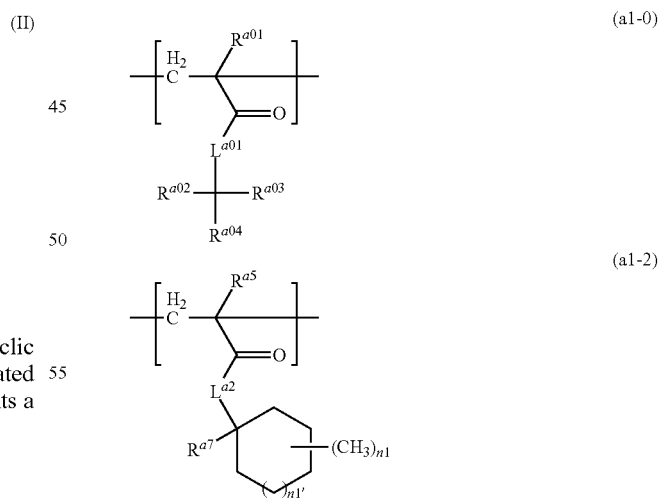

in each formula, $L^{a01}$ and $L^{a2}$ represent —O— or *—O—$(CH_2)_{k01}$—CO—O—, $k01$ represents an integer of 1 to 7, * represents a binding position to —CO—, $R^{a01}$ and $L^{a5}$ represent a hydrogen atom or a methyl group, and $R^{a02}$, $R^{a03}$ and $R^{a04}$ independently represent a C1 to C8 alkyl group, a C3 to C18 alicyclic hydrocarbon group or combination thereof, $R^{a7}$ represents a C1 to C8 alkyl group, a C3 to C18 alicyclic hydrocarbon group or a combination thereof, n1 represents an integer of 0 to 10, and n1' represents an integer of 0 to 3, and the total proportion of the structural unit represented by formula (a1-0) and the structural unit represented by formula (a1-2) is 30% by mole or more with respect to all of the structural units having an acid-labile group.

[5] The photoresist composition according to [2] wherein the resin further comprises a structural unit having a lactone ring and no acid-labile group.

[6] The photoresist composition according to [5] wherein the structural unit having a lactone ring is a structural unit represented by formula (a3-4):

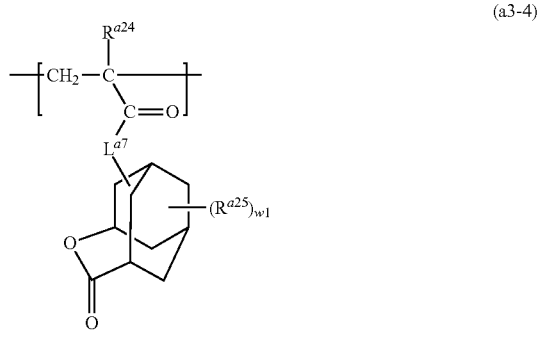

(a3-4)

wherein $R^{a24}$ represents a hydrogen atom, a halogen atom or a C1 to C6 alkyl group which can have a halogen atom, $L^{a7}$ represents —O—, *—O-$L^{a8}$-O—, *—O-$L^{a8}$-CO—O—, *—O-$L^{a8}$-CO—O-$L^{a9}$-CO—O— or *—O-$L^{a8}$-O—CO-$L^{a9}$-O— where * represents a binding position to a carbonyl group, $L^{a8}$ and $L^{a9}$ independently represents a C1 to C6 alkanediyl group, and $R^{a25}$ in each occurrence represents a carboxy group, a cyano group or a C1 to C4 aliphatic hydrocarbon group, and w1 represents an integer of 0 to 8.

[7] The photoresist composition according to [6] wherein the total proportion of the structural unit represented by formula (a3-4) is 35% by mole or more with respect to the structural units of the resin.

[8] The photoresist composition according to [2] wherein the resin further comprises a structural unit having a hydroxyl group and no acid-labile group.

[9] The photoresist composition according to [2] wherein the acid generator is represented by formula (B1):

(B1)

wherein $Q^1$ and $Q^2$ each respectively represent a fluorine atom or a C1 to C6 perfluoroalkyl group, $L^{b1}$ represents a C1 to C24 divalent saturated hydrocarbon group where a methylene group can be replaced by an oxygen atom or a carbonyl group and a hydrogen atom can be replaced by a hydroxyl group or fluorine atom, and Y represents an optionally substituted methyl group or an optionally substituted C3 to C18 alicyclic hydrocarbon group where a methylene group can be replaced by an oxygen atom, a carbonyl group or a sulfonyl group, and $Z^+$ represents an organic cation.

[10] The photoresist composition according to [2] further comprising a resin which comprises a structural unit having a fluorine atom and no acid-labile group.

[11] The photoresist composition according to [2] further comprising a salt which generates an acid having an acidity weaker than an acid generated from the acid generator.

DETAILED DESCRIPTION OF DISCLOSURE

The indefinite articles "a" and "an" are taken as the same meaning as "one or more".

In the specification, the term "solid components" means components other than solvents in a photoresist composition.

<Process for Producing a Photoresist Composition>

The process of the present disclosure includes the following steps.

(1) applying a photoresist composition onto a substrate (2) drying the applied composition to form a composition layer (3) exposing the composition layer (4) heating the exposed composition layer;

(5) developing the heated composition layer with a developer which comprises butyl acetate In the step (1), the photoresist composition contains an acid generator and a resin which comprises a structural unit having an acid-liable group. Here, the resin is sometimes referred to as "resin (A)".

First, the photoresist composition used for the process is described in detail.

<Photoresist Composition>

The photoresist composition of the disclosure contains a resin (A) and an acid generator (which is sometimes referred to as "acid generator (B)").

The composition of the disclosure can contain another resin than Resin (A). The "another resin" is sometimes referred to as "Resin (X)".

Further, the photoresist composition preferably contains a quencher (which is sometimes referred to as "quencher (C)") and/or a solvent (which is sometimes referred to as "solvent (E)") in addition to the Resin (A) and the acid generator (B).

<Resin (A)>

Resin (A) shows Hansen solubility parameters which satisfy a requirement as to a distance of the parameters between the resin and butyl acetate, as described later.

Hansen solubility parameters consist of three dimensions and is represented by the following coordinates. One of the coordinates is the parameter "δd", determined from dispersibility of one substance, another one is the parameter "δp", determined from polarity of one substance, and the other is the parameter "δh", determined from hydrogen bonding force of one substance.

These parameters are related to solubility of one substance.

The parameter "δd" is a coordinate which represents a level of dispersibility, the parameter "δp" is a coordinate which represents a level of dipole-dipole force, and the parameter "δh" is a coordinate which represents a level of hydrogen bonding force.

The definition and calculation as to Hansen solubility parameters are described in "Hansen Solubility Parameters: A Users Handbook (CRC Press, 2007)", authored by Charles M. Hansen.

When the Hansen solubility parameters of any compound have not been continued, each coordinate of parameters, which coordinate is sometimes referred to as "HSP coordinate", can easily be calculated from their chemical structures by using a computer software "Hansen Solubility Parameters in Practice (HSPiP)"

In the present application, as to butyl acetate and monomers whose HSP coordinates have been registered in a database, their registered data is used for calculating Hansen solubility parameters of Resin (A) and a distance of the parameters as to Resin (A). As to monomers about whose HSP coordinates have not been registered, the parameters [δd, δp and δh] were calculated using HSPiP Version 4.1.

The Hansen solubility parameters of the resins can be determined as the product sum of the values obtained by multiplying a HSP coordinate of each one monomer by the mole ratio of the monomer.

The distance of Hansen solubility parameters between the Resin (A) and butyl acetate is from 3.3 to 4.3, i.e. 3.3≤R≤4.3.

The distance is calculated from formula (1):

$$R = (4 \times (\delta d_R - 15.8)^2 + (\delta p_R - 3.7)^2 + (\delta h_R - 6.3)^2)_{1/2} \quad (1)$$

in which $\delta d_R$ represents a dispersion parameter of a resin, $\delta p_R$ represents a polarity parameter of a resin, $\delta h_R$ represents a hydrogen bonding parameter of a resin, and R represents a distance of Hansen solubility parameters.

In formula (1), the parameters δd, δp, δh of butyl acetate are 15.8 $(MPa)^{1/2}$, 3.7 $(MPa)^{1/2}$, and 6.3 $(MPa)^{1/2}$, respectively.

R is usually from 3.3 to 4.3, preferably from 3.6 to 4.0, more preferably from 3.7 to 3.9. When Resin (A) shows R within the above-mentioned range, a photoresist pattern free from scums or residues can be obtained from a photoresist composition which contains the resin.

Resin (A) has a structural unit having an acid-labile group (which is sometimes referred to as "structural unit (a1)"). The resin is preferably decomposed by an action of acid to decrease in solubility in butyl acetate. Here the "acid-labile group" means a group having a leaving group capable of detaching by contacting with an acid to thereby form a hydrophilic group such as a hydroxy group or a carboxy group.

Resin (A) further has a structural unit having no acid-labile group (which is sometimes referred to as "structural unit (s)").

<Structural Unit (a1)>

The structural unit (a1) is derived from a monomer having an acid-labile group, which monomer is sometimes referred to as "monomer (a1)".

In Resin (A), the acid-labile group is preferably one represented by formula (1) or formula (2).

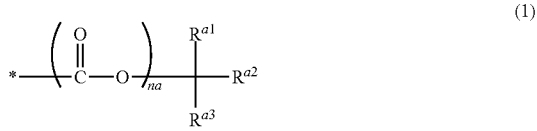

In the formula, $R^{a1}$ to $R^{a3}$ independently represent a C1 to C8 alkyl group, a C3 to C20 alicyclic hydrocarbon group or combination thereof, or $R^{a1}$ and $R^{a2}$ can be bonded together with a carbon atom bonded thereto to form a C3 to C20 divalent alicyclic hydrocarbon group, na represents an integer of 0 or 1, and * represents a binding position.

In the formula, $R^{a1'}$ and $R^{a2'}$ independently represent a hydrogen atom or a C1 to C12 hydrocarbon group, $R^{a3'}$ represents a C1 to C20 hydrocarbon group, or $R^{a2'}$ and $R^{a3'}$ can be bonded together with a carbon atom and X bonded thereto to form a divalent C3 to C20 heterocyclic group, and a methylene group contained in the hydrocarbon group or the divalent heterocyclic group can be replaced by an oxygen atom or sulfur atom, X represents —O— or —S—, and * represents a binding position.

Examples of the alkyl group for $R^{a1}$ to $R^{a3}$ include methyl, ethyl, propyl, n-butyl, n-pentyl, n-hexyl, n-heptyl and n-octyl groups.

Examples of the alicyclic hydrocarbon group for $R^{a1}$ to $R^{a3}$ include monocyclic groups such as a cycloalkyl group, i.e., cyclopentyl, cyclohexyl, cycloheptyl, cyclooctyl groups, and polycyclic hydrocarbon groups such as decahydronaphtyl, adamantyl and norbornyl groups as well as groups below.

* represents a binding position.

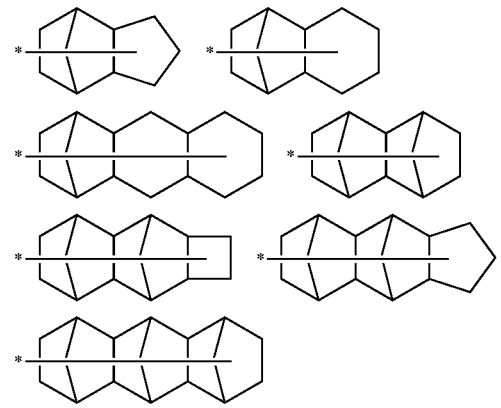

The alicyclic hydrocarbon group of $R^{a1}$ to $R^{a3}$ preferably has 3 to 16 carbon atoms.

Examples of groups combining the alkyl group and the alicyclic hydrocarbon group include methylcyclohexyl, dimethylcyclohexyl, methylnorbornyl, cyclohexylmethyl, adamantylmethyl and norbornyletyl groups.

na is preferably an integer of 0.

When $R^{a1}$ and $R^{a2}$ are bonded together to form a divalent alicyclic hydrocarbon group, examples of the group represented by —C($R^{a1}$)($R^{a2}$)($R^{a3}$) include groups below. The divalent alicyclic hydrocarbon group preferably has 3 to 12 carbon atoms. * represent a binding position to —O—.

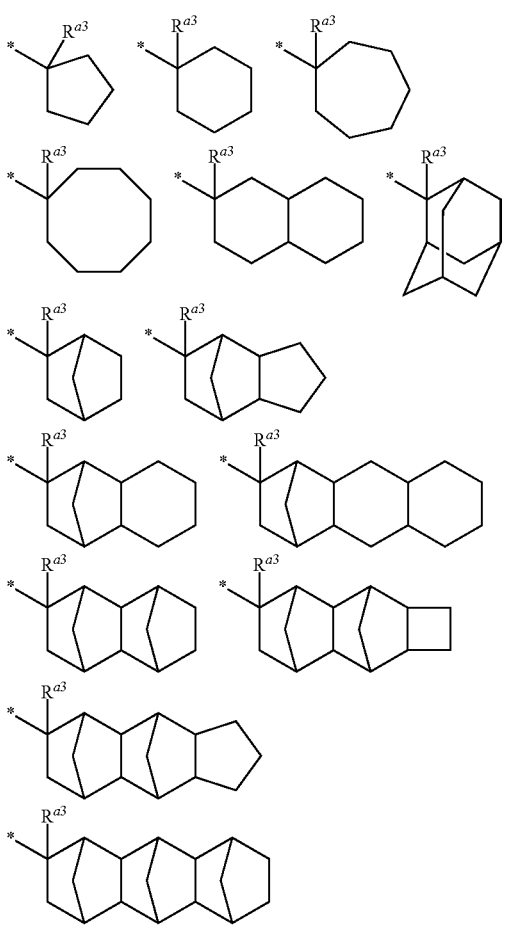

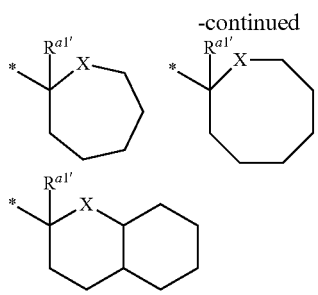

At least one of $R^{a1'}$ and $R^{a2'}$ is preferably a hydrogen atom.

Specific examples of the group represented by formula (2) include a group below. * represents a binding position.

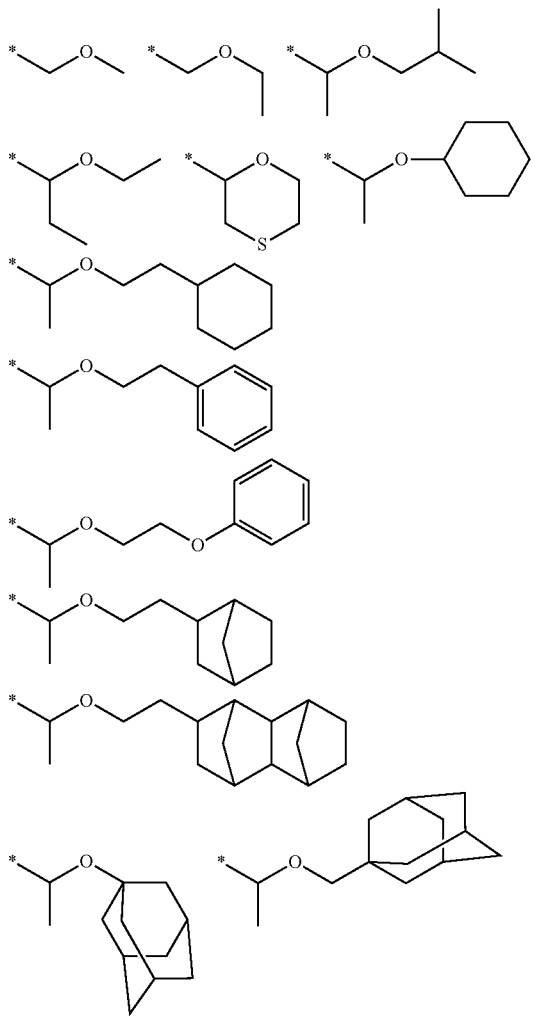

Specific examples of the group represented by formula (1) include 1,1-dialkylalkoxycarbonyl group (a group represented by formula (1) in which $R^{a1}$ to $R^{a3}$ are alkyl groups, preferably tert-butoxycarbonyl group), 2-alkyladamantane-2-yloxycarbonyl group (a group represented by formula (1) in which $R^{a1}$, $R^{a2}$ and a carbon atom form adamantyl group, and $R^{a3}$ is alkyl group), and 1-(adamantane-1-yl)-1-alkylalkoxycarbonyl group (a group represented by formula (1) in which $R^{a1}$ and $R^{a2}$ are alkyl group, and $R^{a3}$ is adamantyl group).

The hydrocarbon group for $R^{a1'}$ to $R^{a3'}$ includes an alkyl group, an alicyclic hydrocarbon group, an aromatic hydrocarbon group and a combination thereof.

Examples of the alkyl group and the alicyclic hydrocarbon group are the same examples as described above.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the divalent heterocyclic group formed by binding with $R^{a2'}$ and $R^{a3'}$ include groups below. * represents a binding position.

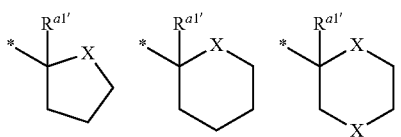

The monomer (a1) is preferably a monomer having an acid-labile group and an ethylene unsaturated bond, and more preferably a (meth)acrylic monomer having an acid-labile group.

Among the (meth)acrylic monomer having an acid-labile group, a monomer having a C5 to C20 alicyclic hydrocarbon group is preferred. When a resin (A) having a structural unit derived from a monomer (a1) having a bulky structure such as the alicyclic hydrocarbon group is used for a photoresist composition, the photoresist composition having excellent resolution tends to be obtained.

Examples of a structural unit derived from the (meth)acrylic monomer having the group represented by formula (1) preferably include structural units represented by formula (a1-0), formula (a1-1) and formula (a1-2) below. These may be used as one kind of the structural unit or as a combination of two or more kinds of the structural units. The structural unit represented by formula (a1-0), the structural unit represented by formula (a1-1) and a structural unit represented by formula (a1-2) are sometimes referred to as "structural unit (a1-0)", "structural unit (a1-1)" and "structural unit (a1-2)"), respectively, and monomers deriving the structural unit (a1-0), the structural unit (a1-1) and the structural unit (a1-2) are sometimes referred to as "monomer (a1-0)", "monomer (a1-1)" and "monomer (a1-2)"), respectively.

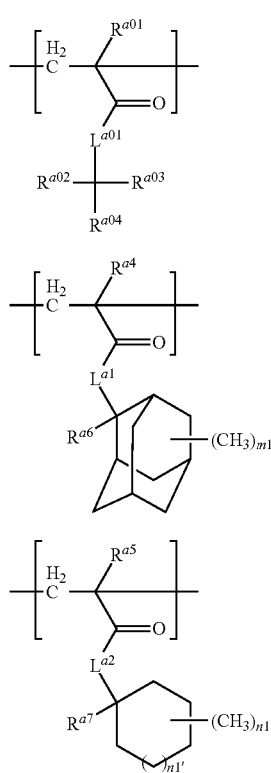

In these formulae, $L^{a01}$, $L^{a1}$ and $L^{a2}$ independently represent —O— or *—O—$(CH_2)_{k1}$—CO—O— where k1 represents an integer of 1 to 7 and * represents a binding position to —CO—, $R^{a01}$, $R^{a4}$ and $R^{a5}$ independently represent a hydrogen atom or a methyl group, $R^{a02}$, $R^{a03}$ and $R^{a04}$ independently represent a C1 to C8 alkyl group, a C3 to C18 alicyclic hydrocarbon group or combination thereof, $R^{a6}$ and $R^{a7}$ independently represent a C1 to C8 alkyl group, a C3 to C18 alicyclic hydrocarbon group or a combination thereof, $R^{a6}$ and $R^{a7}$ independently represent a C1 to C8 alkyl group, a C3 to C18 alicyclic hydrocarbon group or a combination thereof, m1 represents an integer of 0 to 14, n1 represents an integer of 0 to 10, and n1' represents an integer of 0 to 3.

$L^{a01}$, $L^{a1}$ and $L^{a2}$ is preferably an —O— or *—O—$(CH_2)_{k01}$—CO—O— in which k01 is preferably an integer of 1 to 4, more preferably an integer of 1, still more preferably an —O—.

$R^{a4}$ and $R^{a5}$ are preferably a methyl group.

Examples of the alkyl group, an alicyclic hydrocarbon group and combination thereof for $R^{a02}$, $R^{a03}$, $R^{a04}$, $R^{a6}$ and $R^{a7}$ are the same examples as the group described in $R^{a1}$ to $R^{a3}$ in formula (1).

The alkyl group for $R^{a02}$, $R^{a03}$, $R^{a04}$, $R^{a6}$ and $R^{a7}$ is preferably a C1 to C6 alkyl group.

The alicyclic hydrocarbon group for $R^{a02}$, $R^{a03}$, $R^{a04}$, $R^{a6}$ and $R^{a7}$ is preferably a C3 to C8 alicyclic hydrocarbon group, more preferably a C3 to C6 alicyclic hydrocarbon group.

The group formed by combining the alkyl group and the alicyclic hydrocarbon group has preferably 18 or less of carbon atom. Examples of those groups include methylcyclohexyl, dimethylcyclohexyl, methylnorbornyl, methyladamantyl, cyclohexylmethyl, methyl cyclohexylmethyl, adamantylmethyl and norbornylmethyl groups.

Each of $R^{a02}$, $R^{a03}$, $R^{a04}$, $R^{a6}$ and $R^{a7}$ is preferably a C1 to C6 alkyl group, more preferably a methyl group or an ethyl group.

$R^{a04}$ is preferably a C1 to C6 alkyl group or a C5 to C12 alicyclic hydrocarbon group, more preferably a methyl, ethyl, cyclohexyl or adamantyl group.

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the structural unit (a1-0) preferably include those represented by formula (a1-0-1) to formula (a1-0-12) and these in which a methyl group corresponding to $R^{a01}$ has been replaced by a hydrogen atom, and more preferably those represented by formula (a1-0-1) to formula (a1-0-6), formula (a1-0-8) and formula (a1-0-9) below.

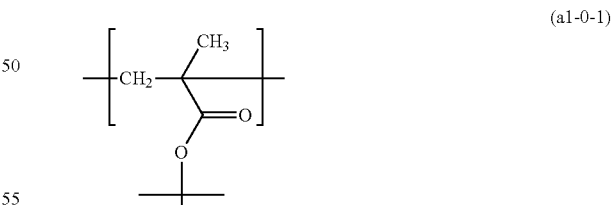

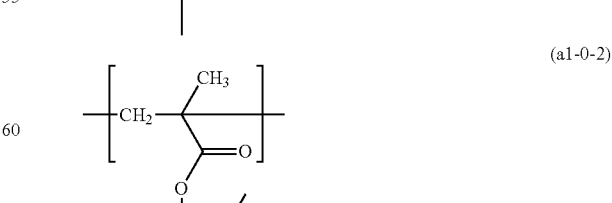

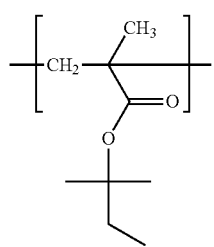
(a1-0-3)
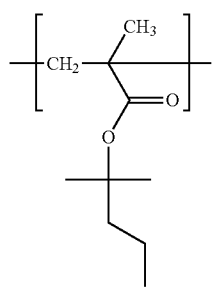
(a1-0-4)
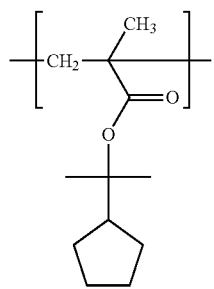
(a1-0-5)
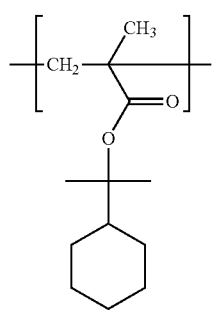
(a1-0-6)
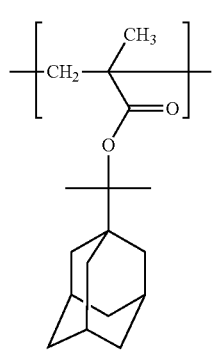
(a1-0-7)
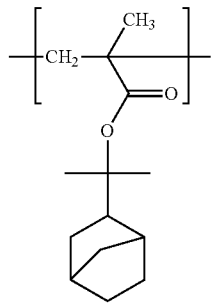
(a1-0-8)
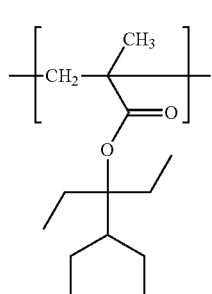
(a1-0-9)
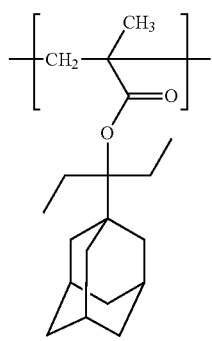
(a1-0-10)
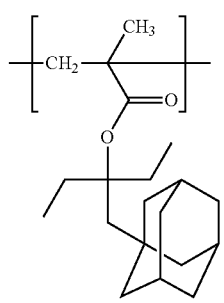
(a1-0-11)
(a1-0-12)
Examples of the structural unit (a1-1) include those derived from monomers described in JP 2010-204646A1.

Among them, preferred are the structural units represented by formula (a1-1-1) to formula (a1-1-4).

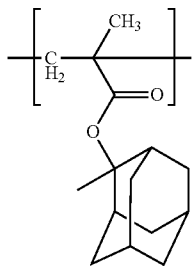

(a1-1-1)

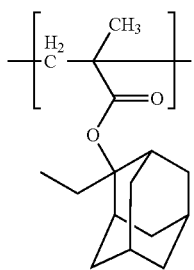

(a1-1-2)

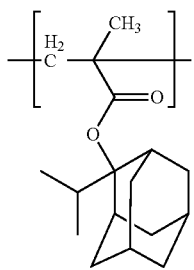

(a1-1-3)

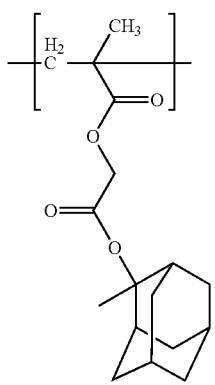

(a1-1-4)

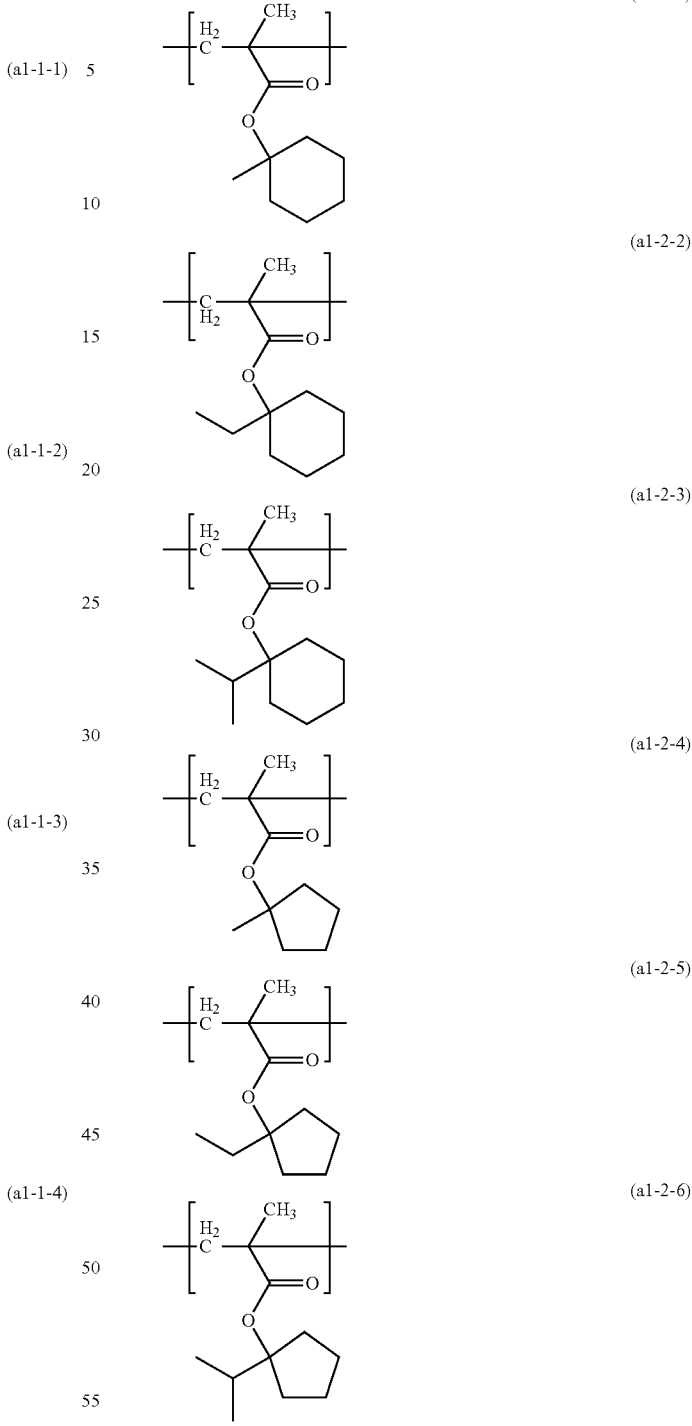

Examples of the structural unit (a1-2) include the structural units represented by formula (a1-2-1) to formula (a1-2-6), and preferably those represented by formula (a1-2-2) and formula (a1-2-5).

Specific examples of the structural unit (a1-2) include the structural units represented by formula (a1-2-1) to formula (a1-2-6) in which a methyl group has been replaced by a hydrogen atom.

When Resin (A) has one or both of the structural unit (a1-0) and the structural unit (a1-2), the total proportion thereof is generally 30 to 100% by mole, preferably 50 to 100% by mole, with respect to all of the structural units (a1).

When Resin (A) has the structural unit represented by formula (a1-1), the amount of the structural unit is preferably 35% by mole or less with respect to the total structural units (100% by mole) constituting Resin (A).

Examples of the structural unit (a1) further include the following ones.

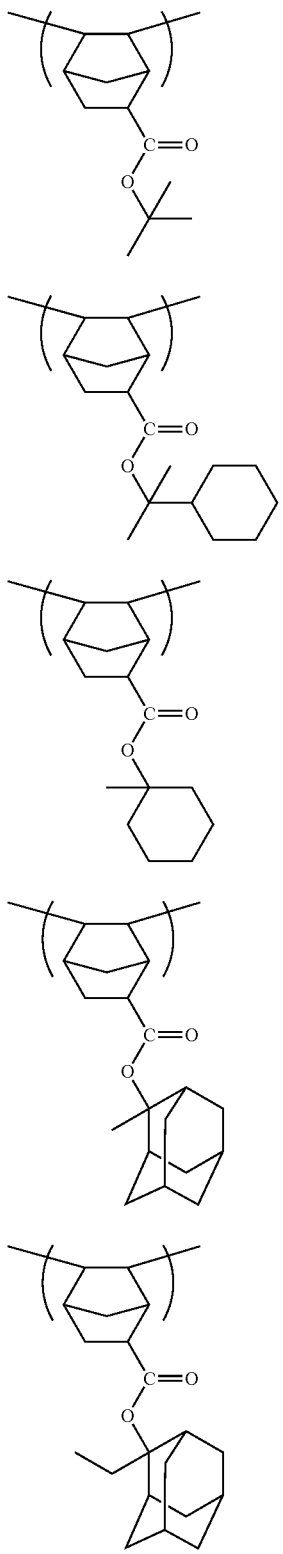

(a1-3-1)
(a1-3-2)
(a1-3-3)
(a1-3-4)
(a1-3-5)

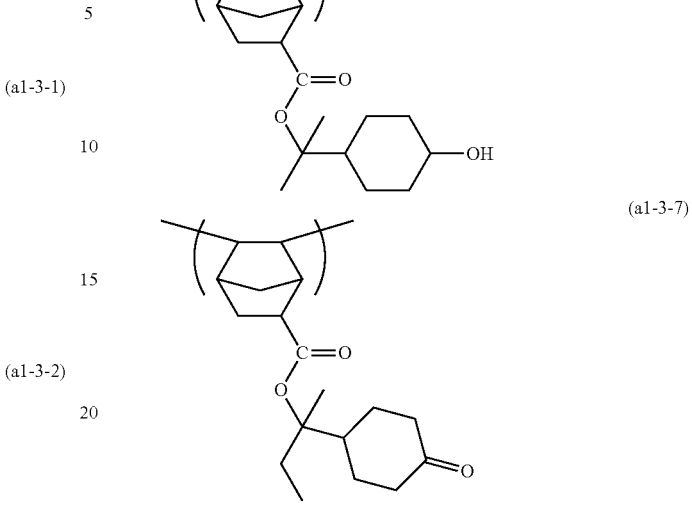

(a1-3-6)
(a1-3-7)

When Resin (A) has any one of the structural units represented by formula (a1-3-1) to formula (a1-3-7), the total proportion of these structural units is generally 10 to 95% by mole, preferably 15 to 90% by mole, more preferably 20 to 85% by mole, with respect to all of the structural units of the resin (A).

Examples of a structural unit having an acid-labile group, which is derived from a (meth)acrylic monomer include a structural unit represented by formula (a1-5). Such structural unit is sometimes referred to as "structural unit (a1-5)".

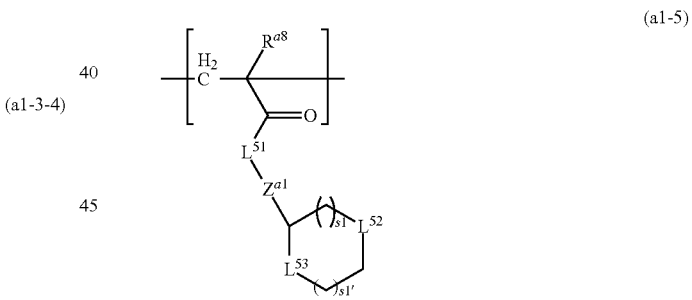

(a1-5)

In the formula, $R^{a8}$ represents a hydrogen atom, a halogen atom or a C1 to C6 alkyl group which can have a halogen atom, $Z^{a1}$ represents a single bond or *—$(CH_2)_{h3}$—CO-$L^{54}$-, where h3 represents an integer of 1 to 4, $L^{54}$ represents —O— or —S— and * represents a binding position to $L^{51}$, $L^{51}$, $L^{52}$ and $L^{53}$ independently represent —O— or —S—, s1 represents an integer of 1 to 3, and
s1' represents an integer of 0 to 3.

Examples of the halogen atom include fluorine, chlorine, bromine and iodine atoms, and preferably a fluorine atom.

Examples of the alkyl group which can have a halogen atom include methyl, ethyl, propyl, butyl, pentyl, hexyl, heptyl, octyl, fluoromethyl and trifluoromethyl groups.

In formula (a1-5), $R^{a8}$ is preferably a hydrogen atom, a methyl group or trifluoromethyl group. $L^{51}$ is preferably —O—. $L^{52}$ and $L^{53}$ are independently preferably —O— or —S—, and more preferably one is —O— and another is —S—.

s1 is preferably 1.

s1' is preferably an integer of 0 to 2. $Z^{a1}$ is preferably a single bond or *—$CH_2$—CO—O— where * represents a binding position to $L^{51}$.

Examples of a monomer from which the structural unit (a1-5) is derived include a monomer described in JP 2010-61117A. Among them, the monomers are preferably monomers represented by formula (a1-5-1) to formula (a1-5-4), and more preferably monomers represented by formula (a1-5-1) to formula (a1-5-2) below.

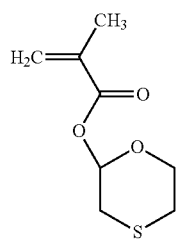
(a1-5-1)

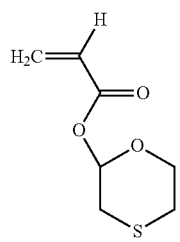
(a1-5-2)

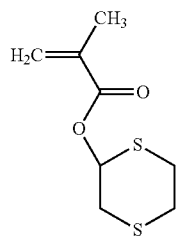
(a1-5-3)

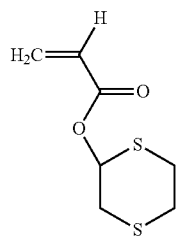
(a1-5-4)

When Resin (A) has the structural unit (a1-5), the proportion thereof is generally 1% by mole to 50% by mole, preferably 3% by mole to 45% by mole, and more preferably 5% by mole to 40% by mole, with respect to the total structural units (100% by mole) constituting Resin (A).

Examples of a structural unit (a1) having a group represented by formula (2) include a structural unit represented by formula (a1-4). The structural unit is sometimes referred to as "structural unit (a1-4)".

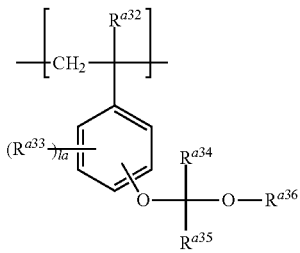
(a1-4)

In the formula, $R^{a32}$ represents a hydrogen atom, a halogen atom or a C1 to C6 alkyl group which can have a halogen atom, $R^{a33}$ in each occurrence independently represent a halogen atom, a hydroxy group, a C1 to C6 alkyl group, a C1 to C6 alkoxy group, a C2 to C4 acyl group, a C2 to C4 acyloxy group, an acryloyloxy group or methacryloyloxy group, la represents an integer 0 to 4, $R^{a34}$ and $R^{a35}$ independently represent a hydrogen atom or a C1 to C12 hydrocarbon group; and $R^{a36}$ represents a C1 to C20 hydrocarbon group, or $R^{a35}$ and $R^{a36}$ can be bonded together with a C—O bonded thereto to form a C3 to C20 divalent heterocyclic group, and a methylene group contained in the hydrocarbon group or the divalent heterocyclic group can be replaced by an oxygen atom or sulfur atom.

Examples of the alkyl group for $R^{a32}$ and $R^{a33}$ include methyl, ethyl, propyl, isopropyl, butyl, pentyl and hexyl groups. The alkyl group is preferably a C1 to C4 alkyl group, and more preferably a methyl group or an ethyl group, and still more preferably a methyl group.

Examples of the halogen atom for $R^{a32}$ and $R^{a33}$ include fluorine, chlorine, bromine and iodine atoms.

Examples of the alkyl group which can have a halogen atom include trifluoromethyl, difluoromethyl, methyl, perfluoromethyl, 1,1,1-trifluoroethyl, 1,1,2,2-tetrafluoroethyl, ethyl, perfluoropropyl, 1,1,1,2,2-pentafluoropropyl, propyl, perfluorobutyl, 1,1,2,2,3,3,4,4-octafluorobutyl, butyl, perfluoropentyl, 1,1,1,2,2,3,3,4,4-nonafluoropentyl, n-pentyl, n-hexyl and n-perfluorohexyl groups.

Examples of an alkoxy group include methoxy, ethoxy, propoxy, butoxy, pentyloxy, and hexyloxy groups. The alkoxy group is preferably a C1 to C4 alkoxy group, more preferably a methoxy group or an ethoxy group, and still more preferably a methoxy group.

Examples of the acyl group include acetyl, propanonyl and butylyl groups.

Examples of the acyloxy group include acetyloxy, propanonyloxy and butylyloxy groups.

Examples of the hydrocarbon group for $R^{a34}$ and $R^{a35}$ are the same examples as described in $R^{a1'}$ to $R^{a2'}$ in formula (2).

Examples of hydrocarbon group for $R^{a36}$ include a C1 to C18 alkyl group, a C3 to C18 alicyclic hydrocarbon group, a C6 to C18 aromatic hydrocarbon group and a combination thereof.

In formula (a1-4), $R^{a32}$ is preferably a hydrogen atom.

$R^{a33}$ is preferably a C1 to C4 alkoxy group, more preferably a methoxy group or an ethoxy group, and still more preferably a methoxy group.

la is preferably 0 or 1, and more preferably 0.

$R^{a34}$ is preferably a hydrogen atom.

$R^{a35}$ is preferably a C1 to C12 hydrocarbon group, and more preferably a methyl group or an ethyl group.

The hydrocarbon group for $R^{a36}$ is preferably a C1 to C18 alkyl group, a C3 to C18 alicyclic hydrocarbon group, a C6 to C18 aromatic hydrocarbon group and a combination thereof, and more preferably a C1 to C18 alkyl group, a C3 to C18 alicyclic hydrocarbon group or a C7 to C18 aralkyl group. Each of the alkyl group and the alicyclic hydrocarbon group for $R^{a36}$ is preferably not substituted. When the aromatic hydrocarbon group of $R^{a36}$ has a substituent, the substituent is preferably a C6 to C10 aryloxy group.

Examples of the structural unit (a1-4) include the following ones.

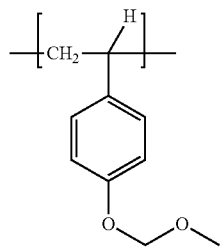
(a1-4-1)

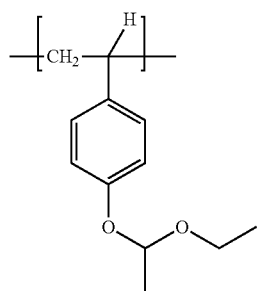
(a1-4-2)

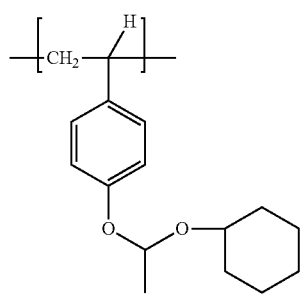
(a1-4-3)

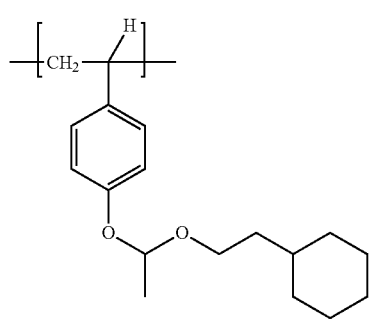
(a1-4-4)

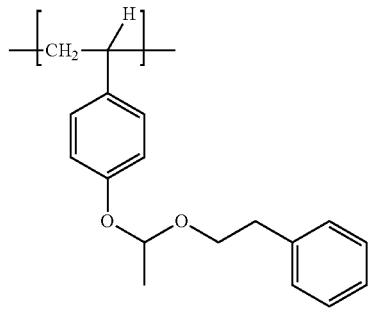
(a1-4-5)

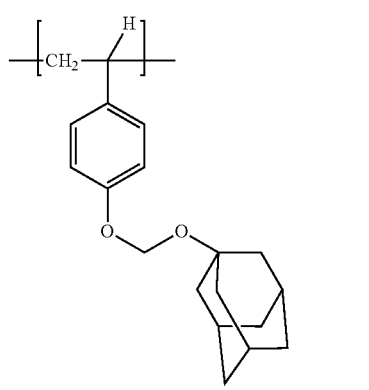
(a1-4-6)

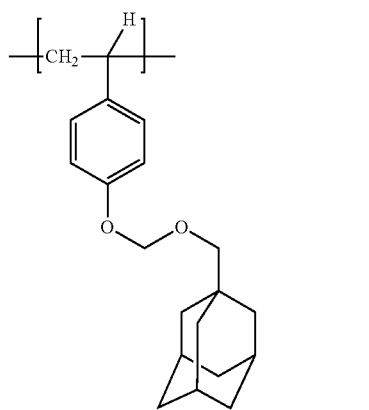
(a1-4-7)

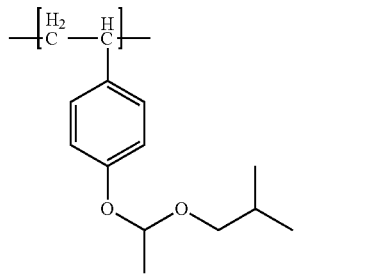
(a1-4-8)

When Resin (A) contains the structural unit (a1), the proportion thereof is generally 10% by mole to 95% by mole, preferably 15% by mole to 90% by mole, more preferably 20% by mole to 85% by mole, still more preferably 35% by mole to less than 65% by mole, further still more preferably 35 to 50% by mole, with respect to the total structural units constituting Resin (A) (100% by mole).

<Structural Unit (s)>

The structural unit (s) is derived from a monomer having no acid-labile group, which monomer is sometimes referred to as "monomer (s)".

For the monomer (s) from which a structural unit (s) is derived, a known monomer having no acid-labile group can be used.

As the structural unit (s), preferred is a structural unit having a hydroxy group or a lactone ring but having no acid-labile group. When the photoresist composition contains a resin which has a structural unit (s) having a hydroxy group (such structural unit is sometimes referred to as "structural unit (a2)") and/or a structural unit (s) having a lactone ring (such structural unit is sometimes referred to as "structural unit (a3)"), the adhesiveness of photoresist obtained therefrom to a substrate and resolution of photoresist pattern tend to be improved.

<Structural Unit (a2)>

A hydroxy group which the structural unit (a2) has can be an alcoholic hydroxy group or a phenolic hydroxy group.

When KrF excimer laser lithography (248 nm), or high-energy irradiation such as electron beam or EUV (extreme ultraviolet) is used for the photoresist composition, the structural unit having a phenolic hydroxy group is preferably used as structural unit (a2).

When ArF excimer laser lithography (193 nm) is used, the structural unit having an alcoholic hydroxy group is preferably used as structural unit (a2), and the structural represented by formula (a2-1) is more preferred.

The structural unit (a2) can be used as one kind of the structural unit or as a combination of two or more kinds of the structural units.

When Resin (A) has the structural unit (a2) having the phenolic hydroxy group, the proportion thereof is generally 5% by mole to 95% by mole, preferably 10% by mole to 80% by mole, more preferably 15% by mole to 80% by mole, still more preferably 15% by mole to less than 65% by mole, with respect to the total structural units (100% by mole) constituting Resin (A).

Examples of the structural unit (a2) having alcoholic hydroxy group include the structural unit represented by formula (a2-1) (which is sometimes referred to as "structural unit (a2-1)").

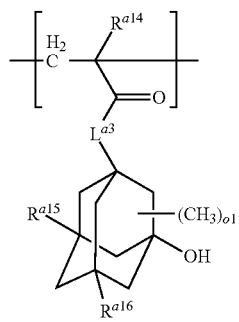

(a2-1)

In the formula, $L^{a3}$ represents —O— or *—O—$(CH_2)_{k2}$—CO—O—, k2 represents an integer of 1 to 7, * represents a binding position to —CO—, $R^{a14}$ represents a hydrogen atom or a methyl group, $R^{a15}$ and $R^{a16}$ each independently represent a hydrogen atom, a methyl group or a hydroxy group, and o1 represents an integer of 0 to 10.

In formula (a2-1), $L^{a3}$ is preferably —O—, —O—$(CH_2)_{f1}$—CO—O—, here f1 represents an integer of 1 to 4, and more preferably —O—. $R^{a14}$ is preferably a methyl group. $R^{a15}$ is preferably a hydrogen atom. $R^{a16}$ is preferably a hydrogen atom or a hydroxy group, more preferably a hydroxy group. o1 is preferably an integer of 0 to 3, and more preferably an integer of 0 or 1.

Preferred examples of the structural unit (a2-1) include those represented by formula (a2-1-1) to formula (a2-1-3), and more preferably those represented by formula (a2-1-1) to formula (a2-1-2).

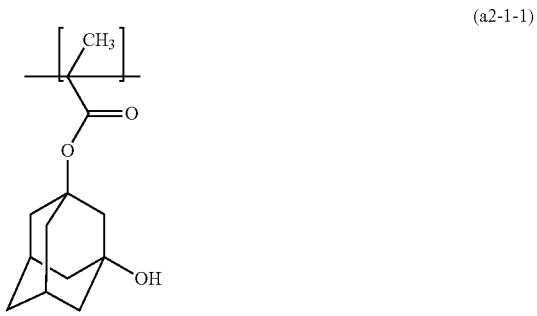

(a2-1-1)

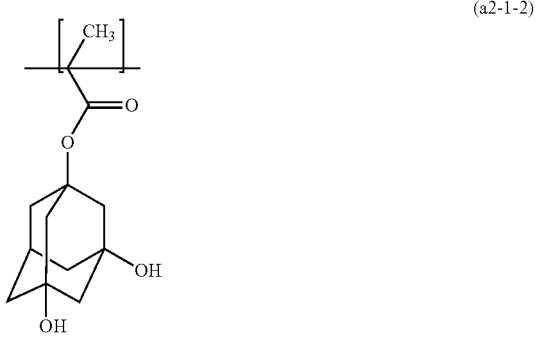

(a2-1-2)

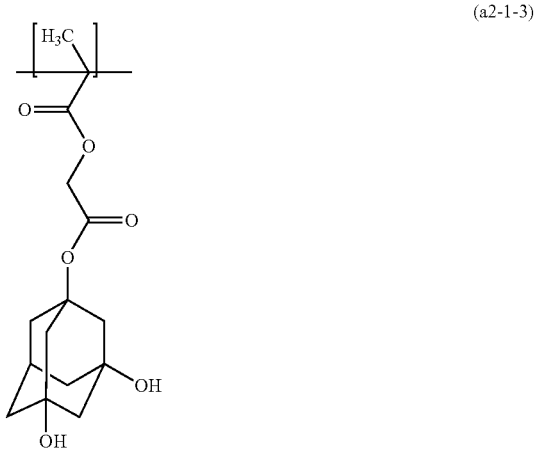

(a2-1-3)

Examples of the structural unit (a2-1) also include those represented by formulae (a2-1-1) to (a2-1-3) in which a methyl group has been replaced by a hydrogen atom.

When Resin (A) has the structural unit (a2-1), the proportion thereof is generally 1% by mole to 45% by mole, preferably 1% by mole to 40% by mole, more preferably 1% by mole to 35% by mole, and still more preferably 2% by mole to 20% by mole, with respect to the total structural units (100% by mole) constituting Resin (A).

<Structural Unit (a3)>

The lactone ring included in the structural unit (a3) can be a monocyclic compound such as β-propiolactone, γ-butyrolactone, 5-valerolactone, or a condensed ring of monocyclic lactone ring with another ring. Examples of the lactone ring preferably include γ-butyrolactone or bridged ring with γ-butyrolactone.

Examples of the structural unit (a3) include structural units represented by any of formula (a3-1), formula (a3-2), formula (a3-3) and formula (a3-4). These structural units may be used as one kind of the structural unit or as a combination of two or more kind of the structural units.

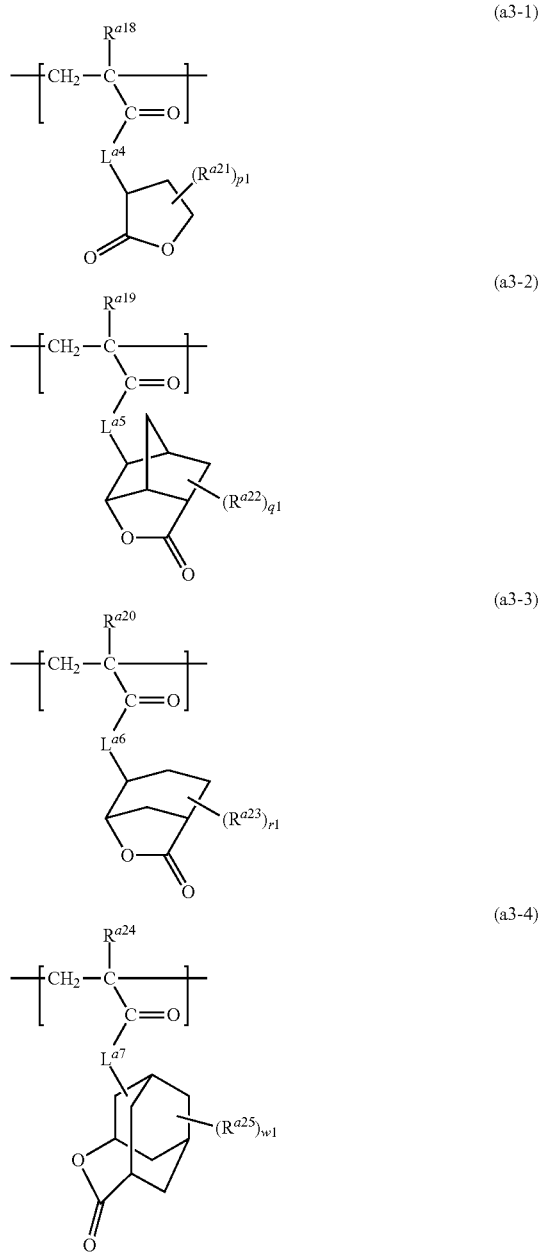

In the formula, $L^{a4}$, $L^{a5}$ and $L^{a6}$ each independently represent *—O— or *—O—$(CH_2)_{k3}$—CO—O—, k3 represents an integer of 1 to 7, * represents a binding position to a carbonyl group, $L^{a7}$ represents —O—, *—O-$L^{a8}$-O—, *—O-$L^{a8}$-CO—O—, *—O-$L^{a8}$-CO—O-$L^{a9}$-CO—O— or *—O-$L^{a8}$-O—CO-$L^{a9}$-O— where * represents a binding position to a carbonyl group, $L^{a8}$ and $L^{a9}$ each independently represent a C1 to C6 alkanediyl group, and $R^{a18}$, $R^{a19}$ and $R^{a20}$ each independently represent a hydrogen atom or a methyl group, $R^{a24}$ represents a hydrogen atom, a halogen atom or a C1 to C6 alkyl group which can have a halogen atom, $R^{a21}$ in each occurrence represents a C1 to C4 aliphatic hydrocarbon group, $R^{a22}$, $R^{a23}$ and $R^{a25}$ in each occurrence represent a carboxy group, a cyano group or a C1 to C4 aliphatic hydrocarbon group, p1 represents an integer of 0 to 5, q1 represents an integer of 0 to 3, r1 represents an integer of 0 to 3, and w1 represents an integer of 0 to 8.

Examples of the aliphatic hydrocarbon group for $R^{a21}$, $R^{a2}$ and $R^{a23}$ include an alkyl group such as methyl, ethyl, n-propyl, isopropyl, n-butyl, sec-butyl, tert-butyl, n-pentyl and n-hexyl groups.

Examples of a halogen atom for $R^{a24}$ include fluorine, chlorine, bromine and iodine atoms.

Examples of an alkyl group for $R^{a24}$ include methyl, ethyl, n-propyl, isopropyl, n-butyl, sec-butyl, tert-butyl, n-pentyl and n-hexyl groups, preferably methyl and ethyl groups.

Examples of the alkyl group having a halogen atom for $R^{a24}$ include trifluoromethyl, perfluoroethyl, perfluoropropyl, perfluoro-isopropyl, perfluorobutyl, perfluoro-sec-butyl, perfluoro-tert-butyl, perfluoropentyl, perfluorohexyl, trichloromethyl, tribromomethyl and triiodomethyl groups.

Examples of an alkanediyl group for $L^{a8}$ and $L^{a9}$ include methylene, ethylene, propane-1,3-diyl, propane-1,2-diyl, butane-1,4-diyl, pentane-1,5-diyl, hexane-1,6-diyl, butane-1,3-diyl, 2-methylpropane-1,3-diyl, 2-methylpropane-1,2-diyl, pentane-1,4-diyl and 2-methylbutane-1,4-diyl groups.

In formulae (a3-1) to (a3-3), $L^{a4}$ to $L^{a6}$ is independently preferably —O—, *—O—$(CH_2)_{k3}$—CO—O—, here k3' represents an integer of 1 to 4, more preferably —O— or *—O—$CH_2$—CO—O—, and still more preferably —O—.

$R^{a18}$ to $R^{a21}$ are preferably a methyl group.

In formula (a3-4), $R^{a24}$ is preferably a hydrogen atom or a C1 to C4 alkyl group, more preferably a hydrogen atom, a methyl group or an ethyl group, and still preferably a hydrogen atom or a methyl group. $L^{a7}$ is preferably —O—, or *—O-$L^{a8}$-CO—O—, more preferably —O—, *—O—$CH_2$—CO—O—, or *—O—$(CH_2)_2$—CO—O—.

In formulae (a3-1), (a3-2) and (a3-4), $R^{a22}$, $R^{a23}$ and $R^{a25}$ are independently preferably a carboxy group, a cyano group or a methyl group.

In formulae (a3-1) to (a3-4), p1, q1, r1 and w1 are independently preferably an integer of 0 to 2, and more preferably 0 or 1.

The structural unit represented by formula (a3-4) is preferably one represented by formula (a3-4)'.

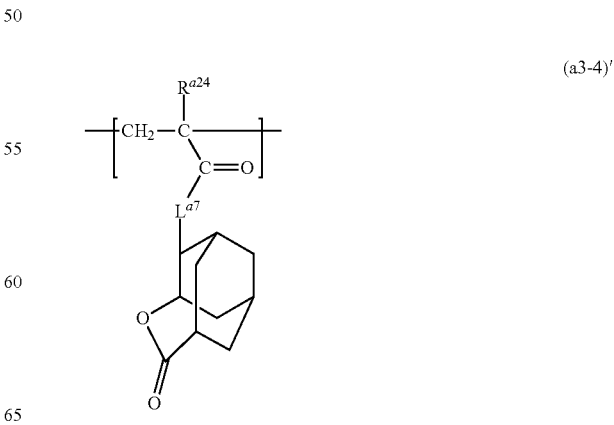

In the formula, $R^{a24}$ and $L^{a7}$ are as defined above.

Examples of the monomer from which the structural unit (a3) is derived include monomers described in JP 2010-204646A, monomers described in JP2000-122294A and monomers described in JP2012-41274A. The structural units are preferably structural units represented by the following formulae, more preferably a structural unit represented by formula (a3-1-1), (a3-2-3), (a3-4-1) to (a3-4-12), and still more preferably a structural unit represented by any one of formulae (a3-4-1) to (a3-4-6).

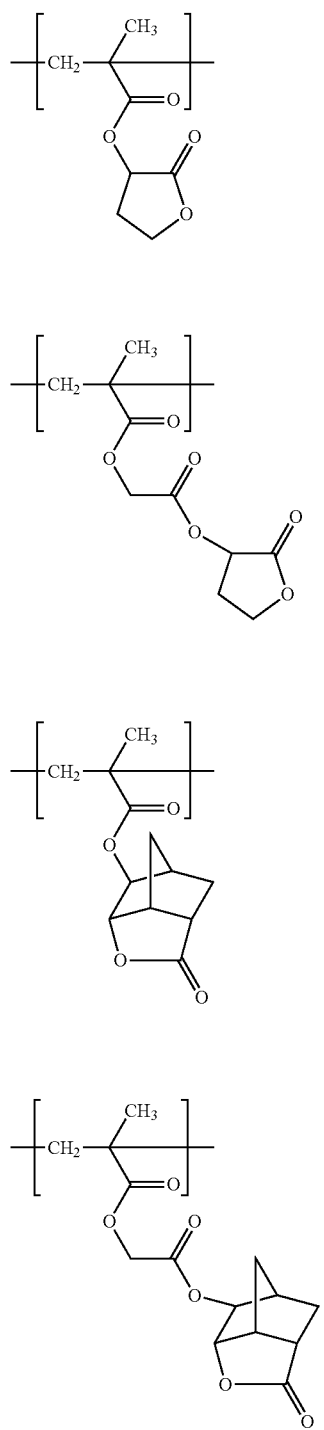

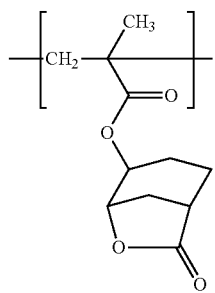

(a3-2-3)

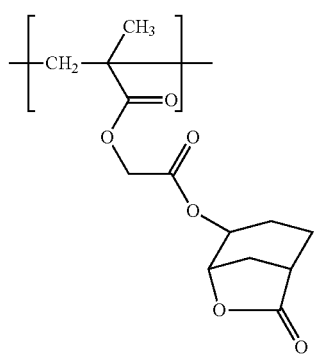

(a3-2-4)

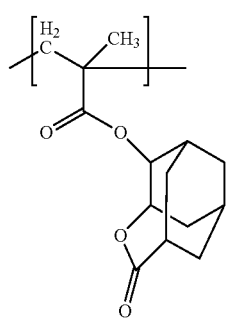

(a3-4-1)

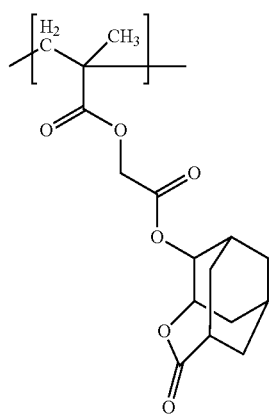

(a3-4-2)

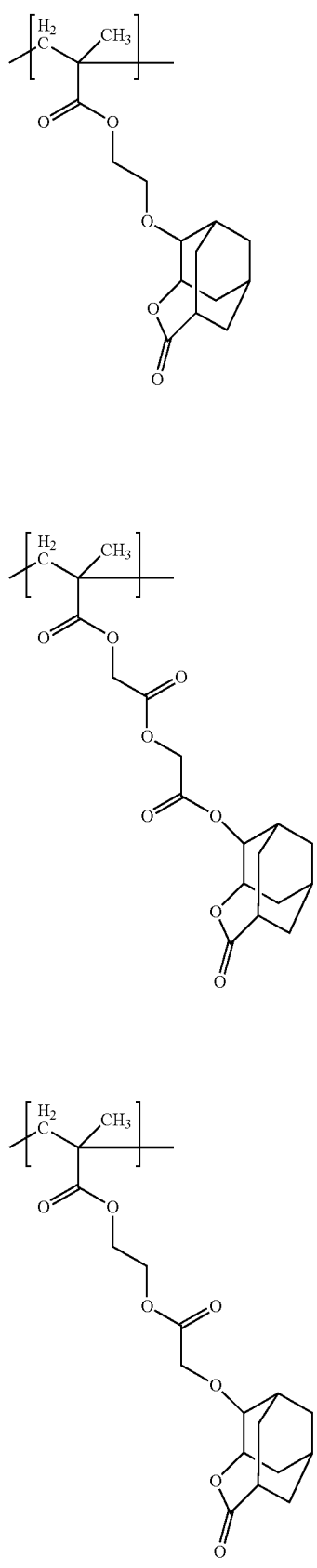
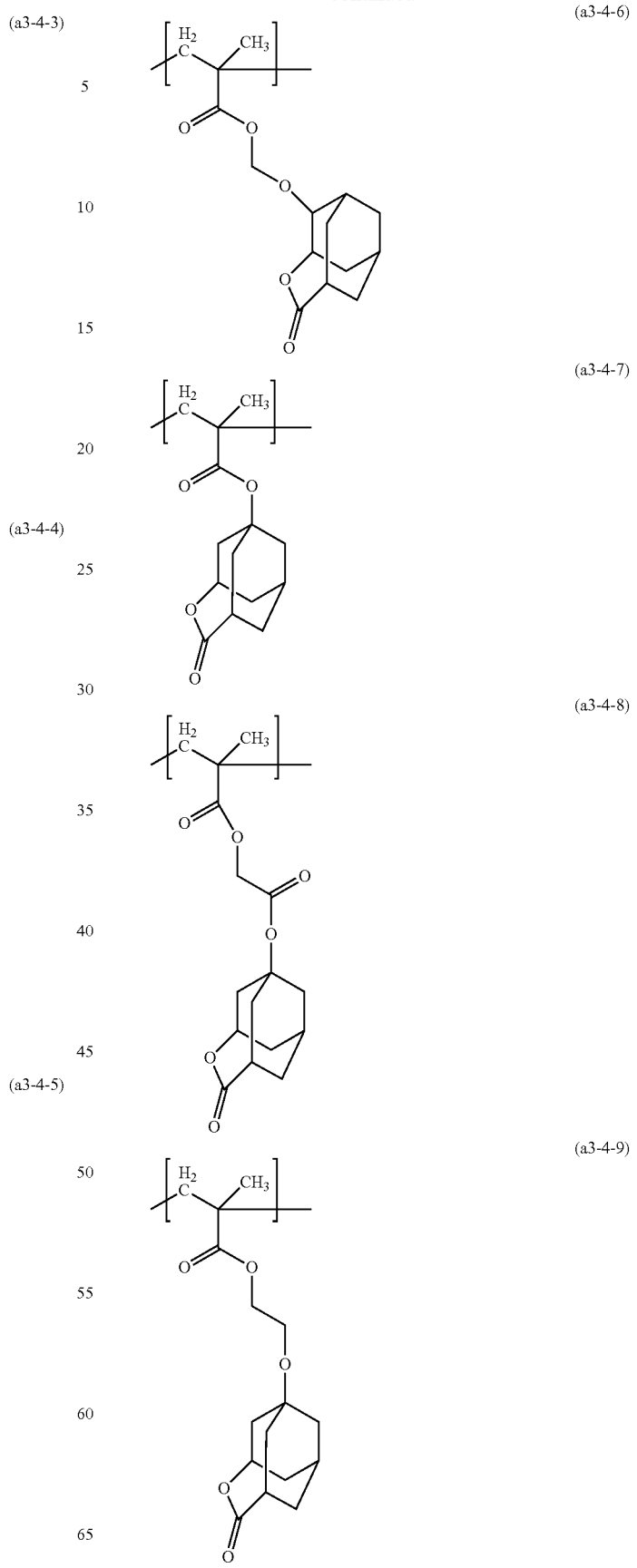

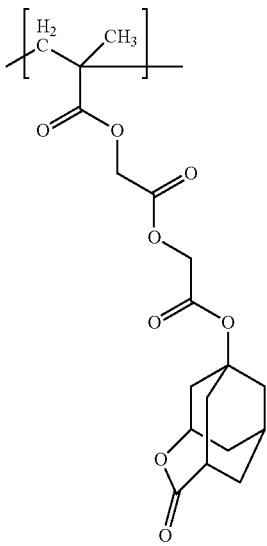

(a3-4-10)

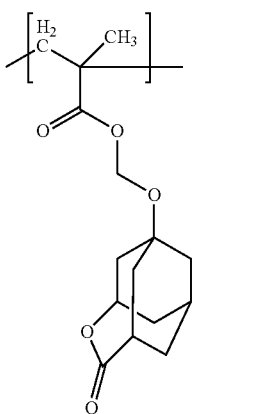

(a3-4-11)

(a3-4-12)

Examples of the structural unit (a3) also include those represented by formulae (a3-1-1), (a3-1-2), (a3-2-1) to (a3-1-4) and (a3-4-1) to (a3-4-12) in which a methyl group has been replaced by a hydrogen atom.

When Resin (A) has the structural unit (a3), the total proportion thereof is preferably 5% by mole to 70% by mole, more preferably 10% by mole to 65% by mole, still more preferably 10% by mole to 60% by mole, with respect to the total structural units (100% by mole) constituting Resin (A).

The proportion of each structural unit represented by formula (a3-1), formula (a3-2), formula (a3-3) and formula (a3-4) is preferably 5% by mole to 70% by mole, more preferably 5% by mole to 60% by mole, still more preferably 10% by mole, 20% by mole or 30% by mole to 60% by mole, further still more preferably 40% by mole to 55% by mole, with respect to the total structural units (100% by mole) constituting Resin (A).

When Resin (A) has the structural unit represented by formula (a3-1-4), the amount of the structural unit is preferably 35% by mole to less than 60% by mole, more preferably 40% by mole to 55% by mole or 50% by mole, with respect to the total structural units (100% by mole) constituting Resin (A). When Resin (A) of a photoresist composition has the structural unit represented by formula (a3-1-4) within the above-mentioned range, a photoresist film can easily be prepared with better film retention ratio.

<Structural Unit (t)>

Examples of the structural unit further include a structural unit which may have a halogen atom (which is sometimes referred to as "structural unit (a4)"), and a structural unit having a non-leaving hydrocarbon group (which is sometimes referred to as "structural unit (a5)"). Hereinafter, the structural units (a4) and (a5) are collectively referred to as "structural unit (t)".

<Structural Unit (a4)>

Examples of the structural unit (a4) include the structural units represented by formula (a4-0).

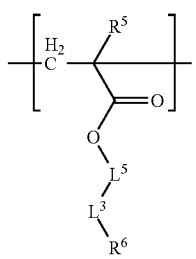

(a4-0)

In the formula, $R^5$ represents a hydrogen atom or a methyl group, $L^5$ represent a single bond or a C1 to C4 saturated aliphatic hydrocarbon group, $L^3$ represents a C1 to C8 perfluoroalkanediyl group or a C3 to C12 perfluorocycloalkanediyl group, and $R^6$ represents a hydrogen atom or a fluorine atom.

Examples of the saturated aliphatic hydrocarbon group for $L^5$ include a liner alkanediyl group such as methylene, ethylene, propane-1,3-diyl, butane-1,4-diyl, and a branched alkanediyl group such as ethane-1,1-diyl, propane-1,2-diyl, butane-1,3-diyl, 2-methylpropane-1,3-diyl and 2-methylpropane-1,2-diyl groups.

Examples of the perfluoroalkanediyl group for $L^3$ include difluoromethylene, perfluoroethylene, perfluoroethylmethylene, perfluoropropane-1,3-diyl, perfluoropropane-1,2-diyl, perfluoropropane-2,2-diyl, perfluorobutane-1,4-diyl, perfluorobutane-2,2-diyl, perfluorobutane-1,2-diyl, perfluoropentane-1,5-diyl, perfluoropentane-2,2-diyl, perfluoropentane-3,3-diyl, perfluorohexane-1,6-diyl, perfluorohexane-2,2-diyl, perfluorohexane-3,3-diyl, perfluoroheptane-1,7-diyl, perfluoroheptane-2,2-diyl, perfluoroheptane-3,4-diyl, perfluoroheptane-4,4-diyl, perfluorooctan-1,8-diyl, perfluorooctan-2,2-diyl, perfluorooctan-3,3-diyl and perfluorooctan-4,4-diyl groups.

Examples of the perfluorocycloalkanediyl group for $L^3$ include perfluorocyclohexanediyl, perfluorocyclopentanediyl, perfluorocycloheptanediyl and perfluoroadamantanediyl groups.

$L^5$ is preferably a single bond, a methylene or an ethylene group, and more preferably a single bond or a methylene group.

$L^3$ is preferably a C1 to C6 perfluoroalkanediyl group, more preferably a C1 to C3 perfluoroalkanediyl group.

Examples of the structural unit (a4-0) include structural units represented by formula (a4-0-1) to formula (a4-0-16).

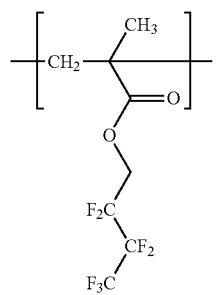
(a4-0-1)

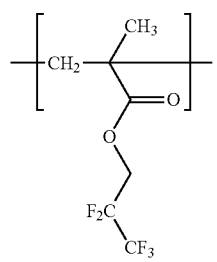
(a4-0-2)

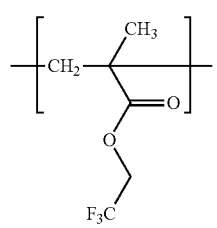
(a4-0-3)

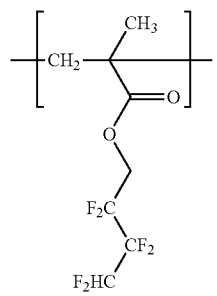
(a4-0-4)

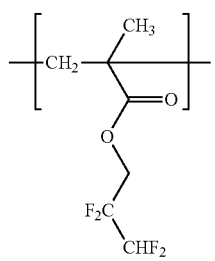
(a4-0-5)

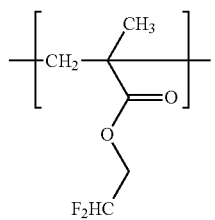
(a4-0-6)

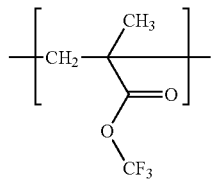
(a4-0-7)

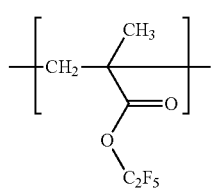
(a4-0-8)

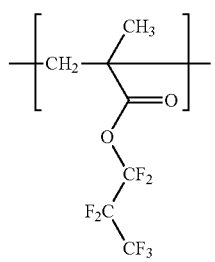
(a4-0-9)

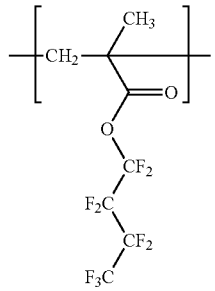
(a4-0-10)

(a4-0-11)
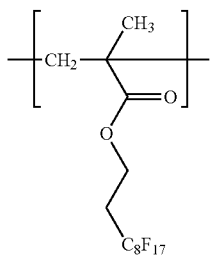

(a4-0-12)
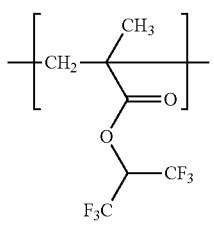

(a4-0-13)
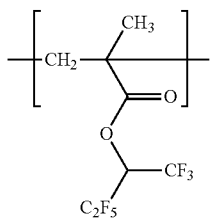

(a4-0-14)
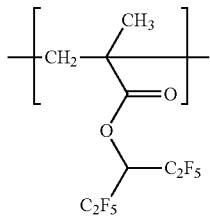

(a4-0-15)
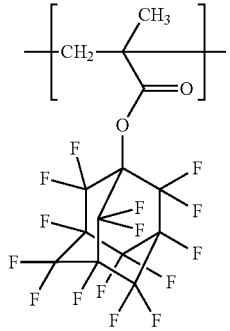

(a4-0-16)
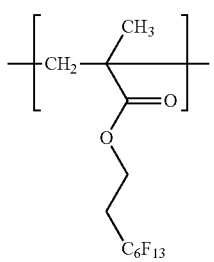

Examples of the structural unit (a4) also include those represented by formulae (a4-0-1) to (a4-0-16) in which a methyl group has been replaced by a hydrogen atom.

Examples of the structural unit (a4) include the structural units represented by formula (a4-1).

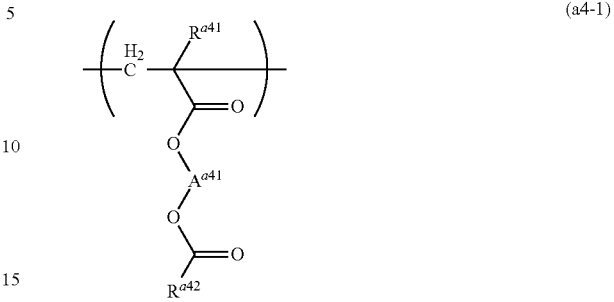

In the formula, $R^{a41}$ represents a hydrogen atom or a methyl group, $R^{a42}$ represents an optionally substituted C1 to C20 hydrocarbon group where a methylene group can be replaced by an oxygen atom or a carbonyl group, and $A^{a41}$ represents an optionally substituted C1 to C6 alkanediyl group or a group represented by formula (a-g1):

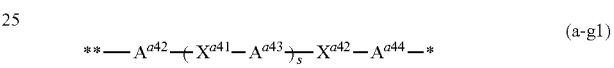

wherein s represents 0 or 1, $R^{a42}$ and $A^{a44}$ independently represent an optionally substituted C1 to C5 divalent aliphatic hydrocarbon group, $A^{a43}$ in occurrence represents a single bond or an optionally substituted C1 to C5 divalent aliphatic hydrocarbon group, and $X^{a41}$ and $X^{a42}$ independently represent —O—, —CO—, —CO—O— or —O—CO—, provided that the total number of the carbon atoms contained in the group of $A^{a42}$, $A^{a43}$, $A^{a44}$, $X^{a41}$ and $X^{a42}$ is 7 or less, and at least one of $A^{a41}$ and $R^{a42}$ has a halogen atom as a substituent, and * and ** represent a binding position, and represents a binding position to —O—CO—$R^{a42}$.

The hydrocarbon group for $R^{a42}$ includes a chain aliphatic hydrocarbon group, a cyclic aliphatic hydrocarbon group, an aromatic hydrocarbon group and a combination thereof.

The hydrocarbon group may have a carbon-carbon unsaturated bond, is preferably a chain aliphatic hydrocarbon group, a cyclic saturated aliphatic hydrocarbon group and a combination thereof.

The saturated aliphatic hydrocarbon group is preferably a liner or a branched alkyl group, a monocyclic or a polycyclic alicyclic hydrocarbon group, and an aliphatic hydrocarbon group combining an alkyl group with an alicyclic hydrocarbon group.

Examples of the chain aliphatic hydrocarbon group include an alkyl group such as methyl, ethyl, n-propyl, n-butyl, n-pentyl, n-hexyl, n-heptyl, n-octyl, n-decyl, n-dodecyl, n-pentadecyl, n-hexadecyl, n-heptadecyl and n-octadecyl groups. Examples of the cyclic aliphatic hydrocarbon group include a monocyclic hydrocarbon group, i.e., cycloalkyl group such as cyclopentyl, cyclohexyl, cycloheptyl, cyclooctyl groups; and polycyclic hydrocarbon groups such as decahydronaphtyl, adamantyl and norbornyl groups as well as groups below. * represents a binding position.

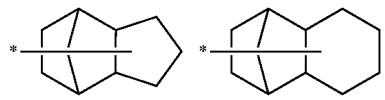

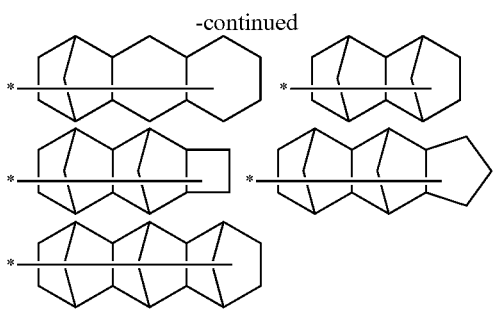
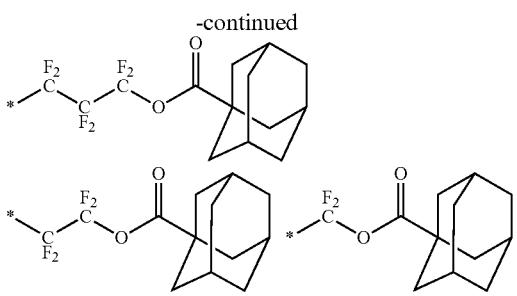

Examples of the aromatic hydrocarbon group include an aryl group such as phenyl, naphthyl, anthryl, biphenyl, phenanthryl and fluorenyl groups. Examples of the substituent of $R^{a42}$ include a halogen atom or a group represented by formula (a-g3).

$$*-X^{a43}-A^{a45} \quad \text{(a-g3)}$$

In the formula, $X^{a43}$ represent an oxygen atom, a carbonyl group, a carbonyloxy group or an oxycarbonyl group, $A^{a45}$ represents a C1 to C17 aliphatic hydrocarbon group that has a halogen atom, and * represents a binding position.

Examples of the halogen atom include fluorine, chlorine, bromine and iodine atom, and a fluorine atom is preferred.

Examples of the aliphatic hydrocarbon group for $A^{a45}$ are the same examples as the group of $R^{a42}$.

$R^{a42}$ is preferably an aliphatic hydrocarbon group which can have a halogen atom, and more preferably an alkyl group having a halogen atom and/or an aliphatic hydrocarbon group having the group represented by formula (a-g3). When $R^{a42}$ is an aliphatic hydrocarbon group having a halogen atom, an aliphatic hydrocarbon group having a fluorine atom is preferred, a perfluoroalkyl group or a perfulorocycloalkyl group are more preferred, a C1 to C6 perfluoroalkyl group is still more preferred, a C1 to C3 perfluoroalkyl group is particularly preferred.

Examples of the perfluoroalkyl group include perfluoromethyl, perfluoroethyl, perfluoropropyl, perfluorobutyl, perfluoropentyl, perfluorohexyl, perfluoroheptyl and perfluorooctyl groups. Examples of the perfluorocycloalkyl group include perfluorocyclohexyl group.

When $R^{a42}$ is an aliphatic hydrocarbon group having the group represented by formula (a-g3), the total number of the carbon atoms contained in the aliphatic hydrocarbon group including the group represented by formula (a-g3) is preferably 15 or less, more preferably 12 or less. The number of the group represented by formula (a-g3) is preferably one when the group represented by formula (a-g3) is the substituent.

Examples of preferred structure represented by formula (a-g3) include the following ones.

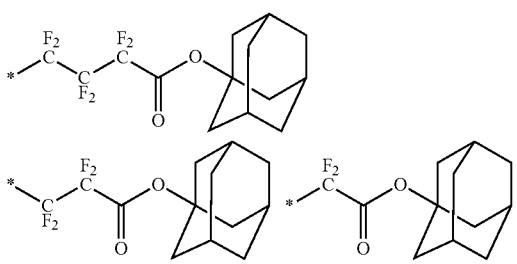

Examples of the alkanediyl group for $A^{a41}$ include a liner alkanediyl group such as methylene, ethylene, propane-1,3-diyl, butane-1,4-diyl, pentane-1,5-diyl and hexane-1,6-diyl groups;

a branched alkanediyl group such as propane-1,2-diyl, butan-1,3-diyl, 2-methylpropane-1,2-diyl, 1-methylpropane-1,4-diyl, 2-methylbutane-1,4-diyl groups.

Examples of the substituent of the alkanediyl group of $A^{a41}$ include a hydroxy group and a C1 to C6 alkoxy group.

Examples of the substituent of the alkanediyl of $A^{a41}$ include a hydroxy group and a C1 to C6 alkoxy group.

$A^{a41}$ is preferably a C1 to C4 alkanediyl group, more preferably a C2 to C4 alkanediyl group, and still more preferably an ethylene group.

In the group represented by formula (a-g1) (which is sometimes referred to as "group (a-g1)"), the aliphatic hydrocarbon group for $A^{a42}$, $A^{a43}$ and $A^{a44}$ may have a carbon-carbon unsaturated bond, is preferably a saturated aliphatic hydrocarbon group.

The saturated aliphatic hydrocarbon group is preferably a liner or a branched alkyl group, a monocyclic or a polycyclic alicyclic hydrocarbon group, and an aliphatic hydrocarbon group combining an alkyl group with an alicyclic hydrocarbon group.

Examples of the aliphatic hydrocarbon group for $A^{a42}$, $A^{a43}$ and $A^{a44}$ include methylene, ethylene, propane-1,3-diyl, propane-1,2-diyl, butane-1,4-diyl, 1-methylpropane-1,3-diyl, 2-methylpropane-1,3-diyl and 2-methylpropane-1,2-diyl groups.

Examples of the substituent of the aliphatic hydrocarbon group of $A^{a42}$, $A^{a43}$ and $A^{a44}$ include a hydroxy group and a C1 to C6 alkoxy group.

s is preferably 0.

Examples of the group (a-g1) in which $X^{a42}$ represents an oxygen atom, a carbonyl group, a carbonyloxy group or an oxycarbonyl group include the following ones. In the formula, * and  each represent a binding position, and  represents a binding position to —O—CO—$R^{a42}$.

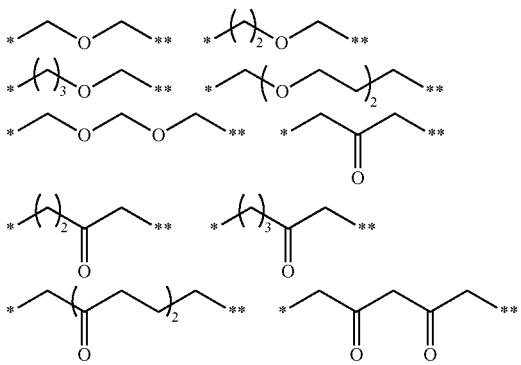

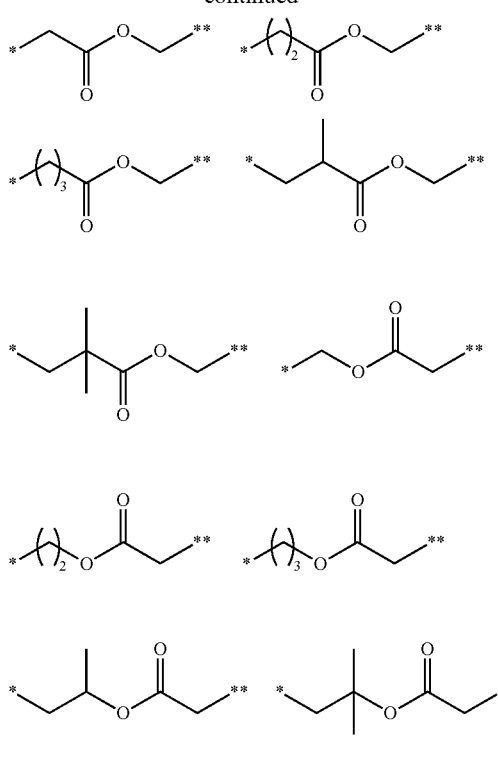
Examples of the structural unit represented by formula (a4-1) include structural units represented by the formulae and those represented by the formulae in which a methyl group corresponding to $R^{a41}$ has been replaced by a hydrogen atom.
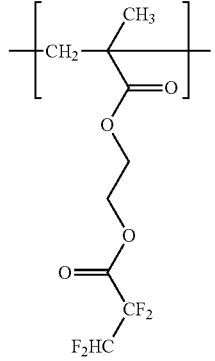
(a4-1-1)
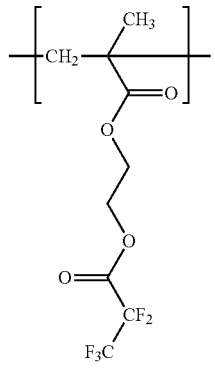
(a4-1-2)
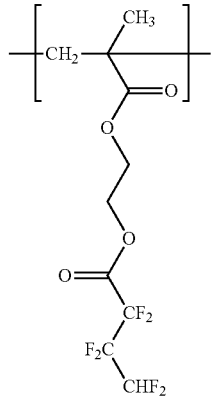
(a4-1-3)
(a4-1-4)
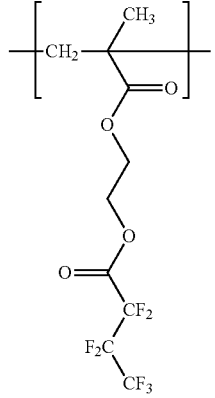
(a4-1-5)
(a4-1-6)

(a4-1-7)
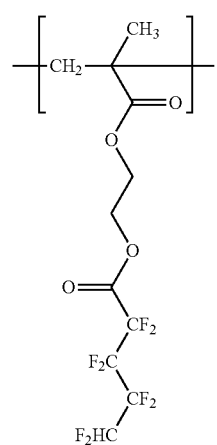
(a4-1-8)
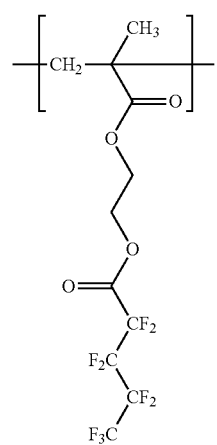
(a4-1-9)
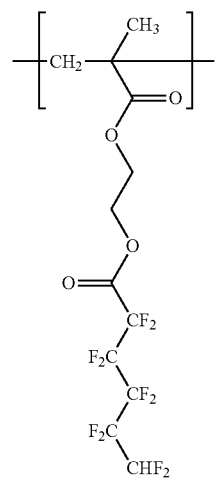
(a4-1-10)
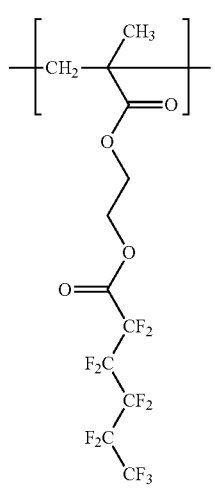
(a4-1-11)
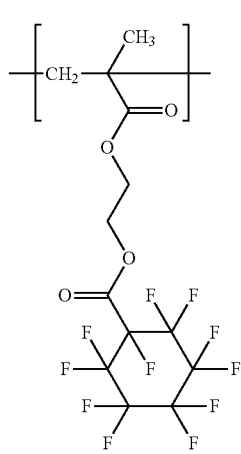
(a4-1'-1)
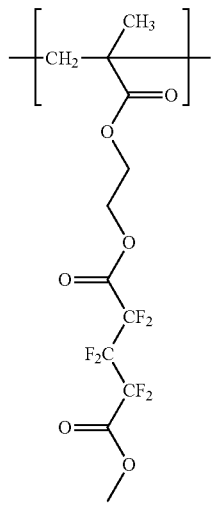

(a4-1'-2)
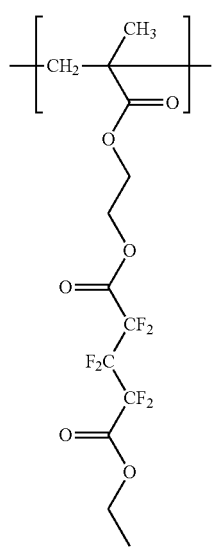
(a4-1'-3)
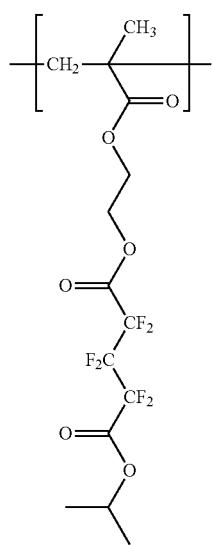
(a4-1'-4)
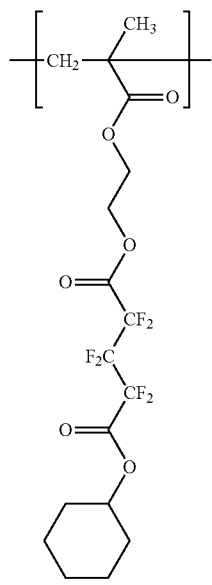
(a4-1'-5)
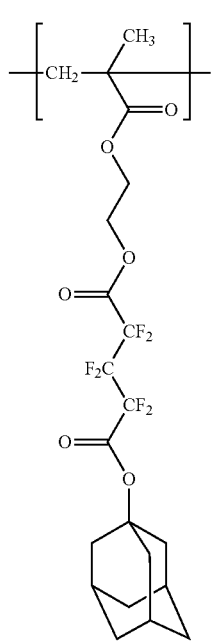
(a4-1'-6)
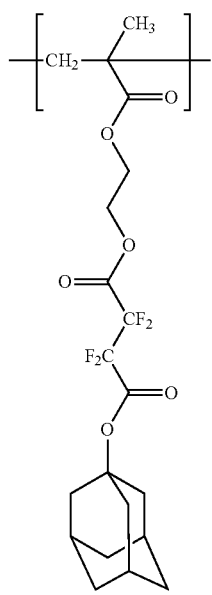

(a4-1'-7)
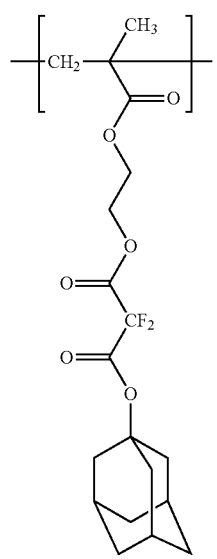
(a4-1'-8)
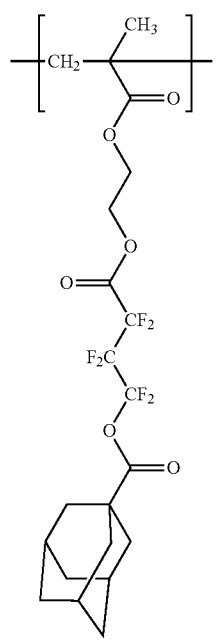
(a4-1'-9)
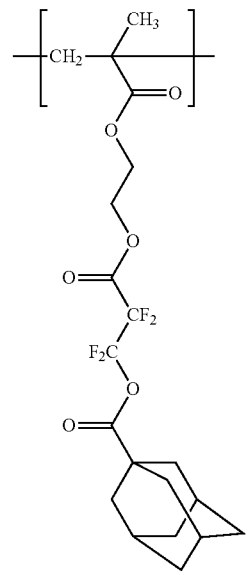
(a4-1'-10)
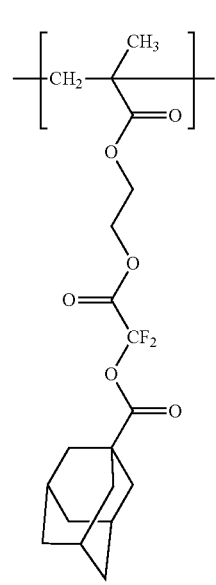
(a4-1'-11)
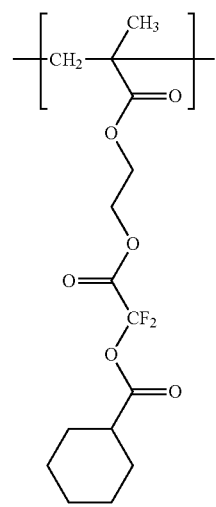

Examples of the structural unit (a4) further include a structural unit presented by formula (a4-4):

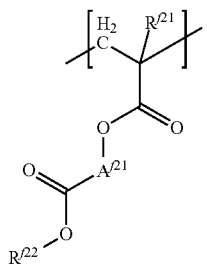 (a4-4)

wherein $R'^{21}$ represents a hydrogen atom or a methyl group, $A'^{21}$ represents $-(CH_2)_{j1}-$, $-(CH_2)_{j2}-O-(CH_2)_{j3}-$ or $-(CH_2)_{j4}-CO-O-(CH_2)_{j5}-$, j1 to j5 independently represents an integer of 1 to 6, and $R'^{22}$ represents a C1 to C10 hydrocarbon group having a fluorine atom.

Examples of the hydrocarbon group having a fluorine atom for $R'^{22}$ include a C1 to C10 alkyl group having a fluorine atom and a C3 to C10 alicyclic hydrocarbon group having a fluorine atom.

Specific examples of $R'^{22}$ include a difluoromethyl group, a trifluoromethyl group, 1,1-difluoroethyl group, 2,2-difluoroethyl group, a 2,2,2-trifluoroethyl group, a perfluoroethyl group, a 1,1,2,2-tetrafluoropropyl group, a 1,1,2,2,3,3-hexafluoropropyl group, a perfluoroethylmethyl group 1-(trifluoromethyl)-1,2,2,2-tetrafluoroethyl group, 1-(trifluoromethyl)-2,2,2-trifluoroethyl group, a perfluoroethyl group, 1,1,2,2-tetrafluorobutyl, 1,1,2,2,3,3-hexafluorobutyl, 1,1,2,2,3,3,4,4-octafluorobutyl, a perfluorobuthyl group, 1,1-bis(trifluoro) methyl-2,2,2-trifluoro ethyl group, 2-(perfluoropropyl) ethyl group, 1,1,2,2,3,3,4,4-octafluoropentyl group, a perfluoropentyl group, 1,1,2,2,3,3,4,4,5,5-fluorodecapentyl group, 1,1-(trifluoromethyl)-2,2,3,3,3-pentafluoropropyl group, 2-(perfluorobuthyl) ethyl group, 1,1,2,2,3,3,4,4,5,5-decafluorohexyl group, a 1,1,2,2,3,3,4,4,5,5,6,6-dodecafluorohexyl group, diperfluoropentylmethyl group, a perfluorohexyl group, a perfluorocyclohexyl group and a perfluoroadamantyl group.

$R'^{22}$ is preferably a C1 to C10 alkyl group having a fluorine atom or a C3 to C10 alicyclic hydrocarbon group having a fluorine atom, more preferably a C1 to C10 alkyl group having a fluorine atom, and still more preferably a C1 to C6 alkyl group having a fluorine atom.

In the formula (a4-4), $A'^{21}$ is preferably $-(CH_2)_{j1}-$, more preferably a methylene group or an ethylene group, and still more preferably a methylene group.

Examples of the structural unit represented by formula (a4-4) include the following ones and those represented by the following formulae in which a methyl group corresponding to $R'^{21}$ has been replaced by a hydrogen atom.

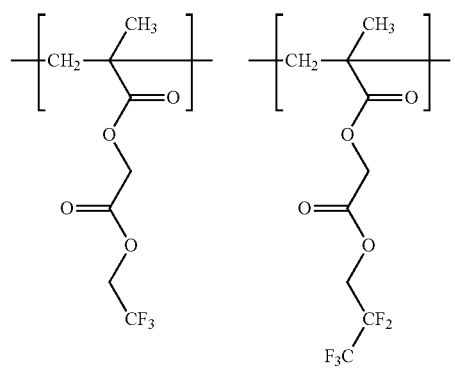

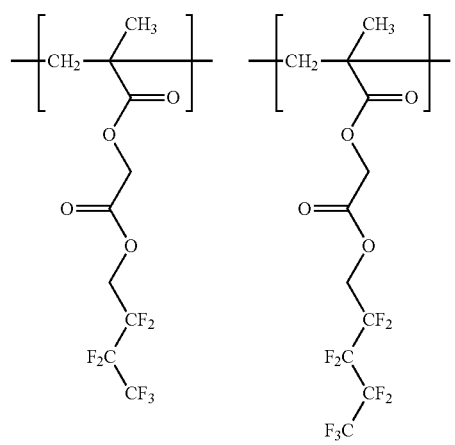

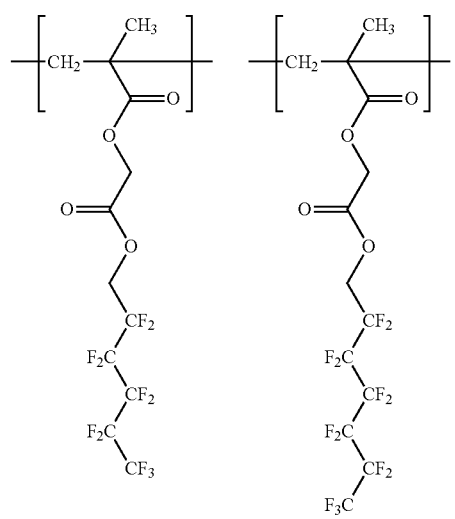

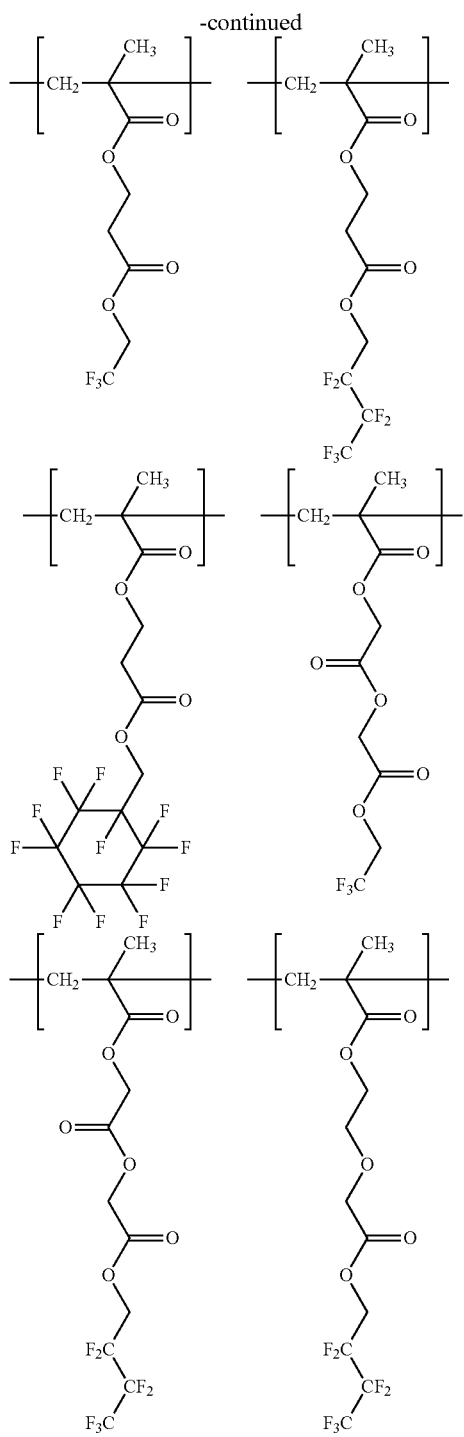

When Resin (A) has the structural unit (a4), the proportion thereof is preferably 1 to 20% by mole, more preferably 2 to 15% by mole, still more preferably 3 to 10% by mole, with respect to the total structural units (100% by mole) of Resin (A).

<Structural Unit (a5)>

Examples of the non-leaving hydrocarbon group in the structural unit (a5) include a chain, branched or cyclic hydrocarbon group. Among them, the structural unit (a5) is preferably a structural unit containing an alicyclic hydrocarbon group.

The structural unit (a5) is, for example, a structural unit represented by formula (a5-1):

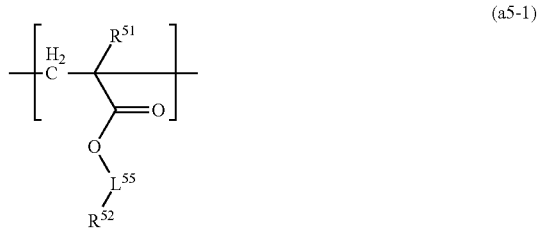

wherein $R^{51}$ represents a hydrogen atom or a methyl group, $R^{52}$ represents a C3 to C18 alicyclic hydrocarbon group where a hydrogen atom can be replaced by a C1 to C8 aliphatic hydrocarbon group or a hydroxy group, provided that a hydrogen atom contained in the carbon atom bonded to $L^{55}$ is not replaced by the C1 to C8 aliphatic hydrocarbon group, and $L^{55}$ represents a single bond or a C1 to C18 divalent saturated hydrocarbon group where a methylene group can be replaced by an oxygen atom or a carbonyl group.

Examples of the alicyclic hydrocarbon group of $R^{52}$ include a monocyclic group or polycyclic group. Examples of the monocyclic alicyclic hydrocarbon group include cyclopropyl, cyclobutyl, cyclopentyl and cyclohexyl groups. Examples of the polycyclic hydrocarbon group include adamantyl and norbornyl groups.

Examples of the C1 to C8 aliphatic hydrocarbon group include an alkyl group such as methyl, ethyl, n-propyl, isopropyl, n-butyl, sec-butyl, tert-butyl, n-pentyl, n-hexyl, n-heptyl, 2-ethylhexyl and n-octyl groups.

Examples of the alicyclic hydrocarbon group having a substituent include 3-hydroxyadamantyl and 3-methyladamantyl.

$R^{52}$ is preferably an unsubstituted C3 to C18 alicyclic hydrocarbon group, and more preferably adamantyl, norbornyl and cyclohexyl groups.

Examples of the divalent saturated hydrocarbon group of $L^{55}$ include a divalent aliphatic saturated hydrocarbon group and a divalent alicyclic saturated hydrocarbon group, and a divalent aliphatic saturated hydrocarbon group is preferred.

Examples of the divalent aliphatic saturated hydrocarbon group include an alkanediyl group such as methylene, ethylene, propanediyl, butanediyl and pentanediyl groups.

Examples of the divalent alicyclic saturated hydrocarbon group include a monocyclic group and a polycyclic group. Examples of the monocyclic alicyclic saturated hydrocarbon groups include cycloalkanediyl such as cyclopentanediyl and cyclohexanediyl groups. Examples of the polycyclic saturated hydrocarbon groups include adamantanediyl and norbornanediyl groups.

Examples of the saturated hydrocarbon group in which a methylene group has been replaced by an oxygen atom or a carbonyl group include groups represented by formula (L1-1) to formula (L1-4). In the formula (L1-1) to formula (L1-4), * represents a binding position to an oxygen atom.

-continued

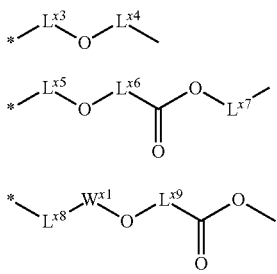

In the formula, $X^{X1}$ represents an oxycarbonyl group or a carbonyloxy group, $L^{X1}$ represents a C1 to C16 divalent saturated aliphatic hydrocarbon group, $L^{X2}$ represents a single bond or a $C_1$ to $C_{15}$ divalent saturated hydrocarbon group, provided that the total number of the carbon atoms contained in the group of $L^{X1}$ and $L^{X2}$ is 16 or less;

$L^{X3}$ represents a single bond or a C1 to C17 divalent saturated aliphatic hydrocarbon group, $L^{X4}$ represents a single bond or a C1 to C16 divalent saturated hydrocarbon group, provided that the total number of the carbon atoms contained in the group of $L^{X3}$ and $L^{X4}$ is 17 or less;

$L^{X5}$ represents a $C_1$ to $C_{15}$ divalent saturated aliphatic hydrocarbon group, $L^{X6}$ and $L^{X7}$ independently represent a single bond or a $C_1$ to $C_{14}$ divalent saturated hydrocarbon group, provided that the total number of the carbon atoms contained in the group of $L^{X5}$, $L^{X6}$ and $L^{X7}$ is 15 or less, $L^{X8}$ and $L^{X9}$ independently represent a single bond or a C1 to C12 divalent saturated hydrocarbon group, $W^{X1}$ represents a $C_3$ to $C_{15}$ divalent saturated alicyclic hydrocarbon group, provided that the total number of the carbon atoms contained in the group of $L^{X8}$, $L^{X9}$ and $W^{X1}$ is 15 or less.

$L^{X1}$ is preferably a C1 to C8 divalent saturated aliphatic hydrocarbon group, and more preferably a methylene group or an ethylene group.

$L^{X2}$ is preferably a single bond or a C1 to C8 divalent saturated aliphatic hydrocarbon group, and more preferably a single bond.

$L^{X3}$ is preferably a C1 to C8 divalent saturated aliphatic hydrocarbon group.

$L^{X4}$ is preferably a single bond or a C1 to C8 divalent saturated aliphatic hydrocarbon group.

$L^{X5}$ is preferably a C1 to C8 divalent saturated aliphatic hydrocarbon group, and more preferably a methylene group or an ethylene group.

$L^{X6}$ is preferably a single bond or a C1 to C8 divalent saturated aliphatic hydrocarbon group, and more preferably a methylene group or an ethylene group. $L^{X7}$ is preferably a single bond or a C1 to C8 divalent saturated aliphatic hydrocarbon group. $L^{X8}$ is preferably a single bond or a C1 to C8 divalent saturated aliphatic hydrocarbon group, and more preferably a single bond or a methylene group. $L^{X9}$ is preferably a single bond or a C1 to C8 divalent saturated aliphatic hydrocarbon group, and more preferably a single bond or a methylene group. $W^{X1}$ is preferably a C3 to C10 divalent saturated alicyclic hydrocarbon group, and more preferably a cyclohexanediyl group or an adamantanediyl group.

Examples of the group represented by $L^{55}$ include the following ones.

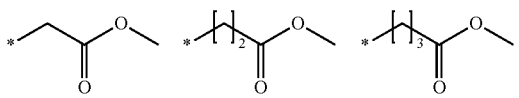

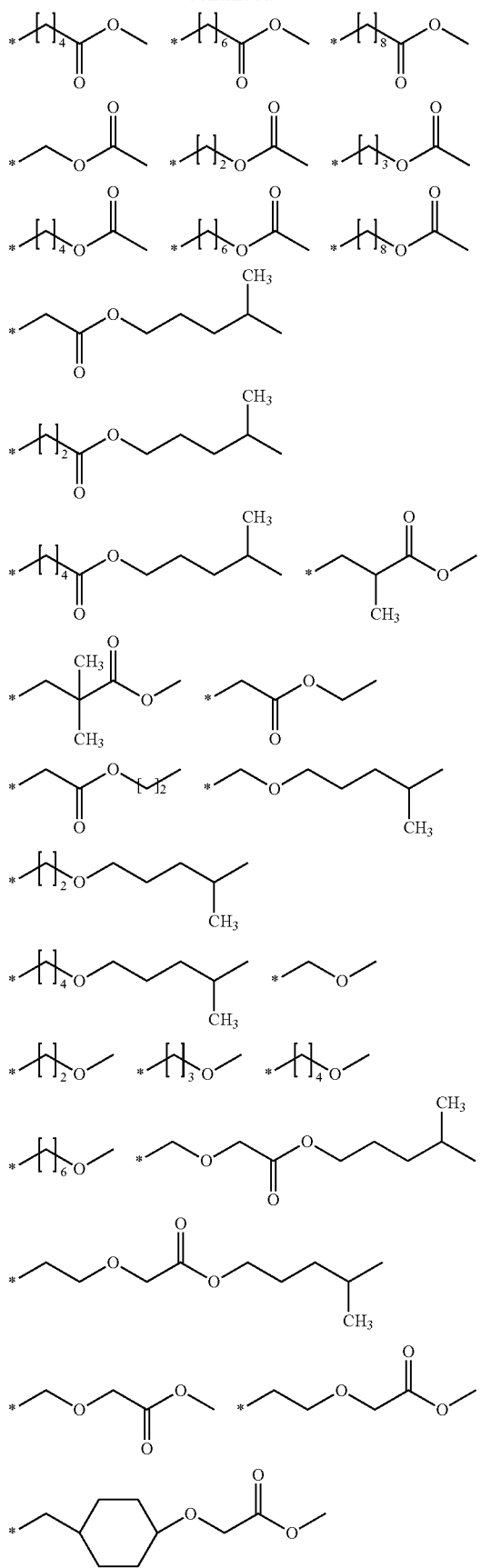

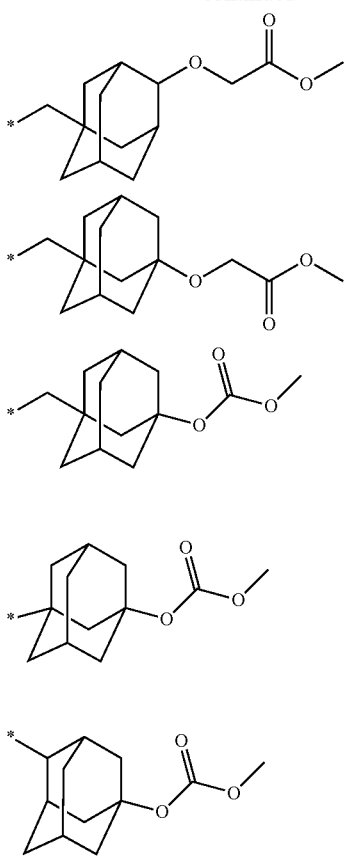
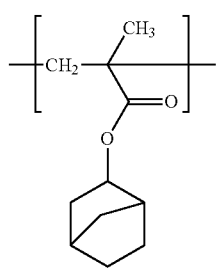
(a5-1-3)
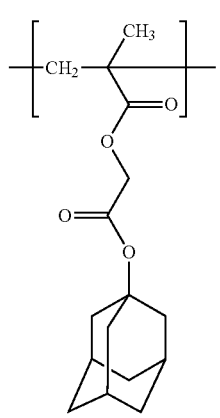
(a5-1-4)
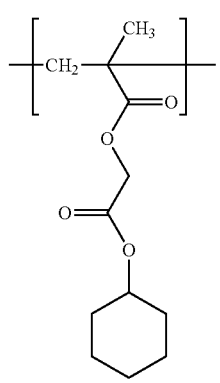
(a5-1-5)
$L^{55}$ is preferably a single bond, methylene group, ethylene group or the groups represented by formula (L1-1), and more preferably a single bond or the groups represented by formula (L1-1).
Examples of the structural unit (a5-1) include the following ones.
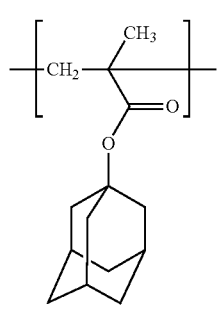
(a5-1-1)
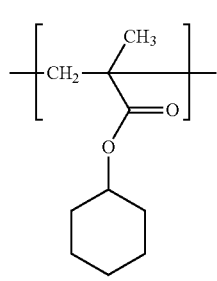
(a5-1-2)
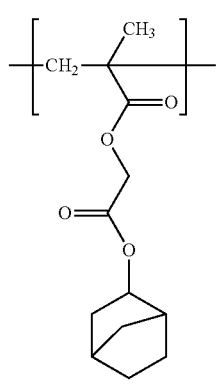
(a5-1-6)

(a5-1-7) 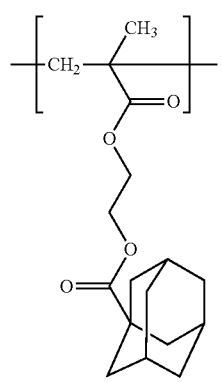
(a5-1-8) 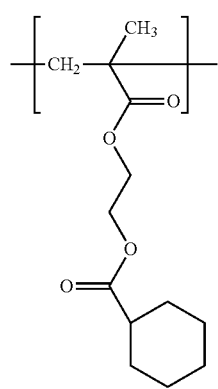
(a5-1-9) 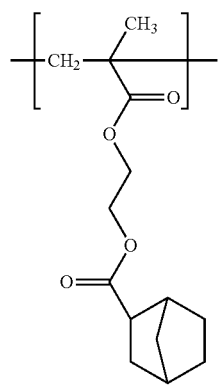
(a5-1-10) 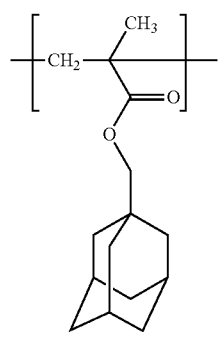
(a5-1-11) 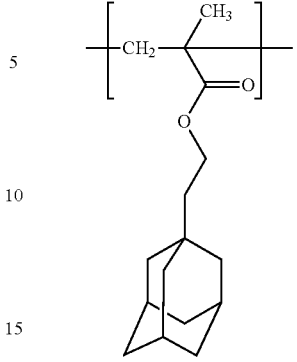
(a5-1-12) 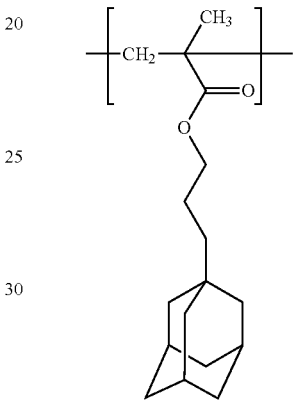
(a5-1-13) 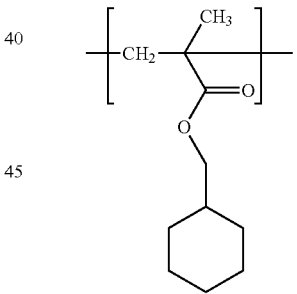
(a5-1-14) 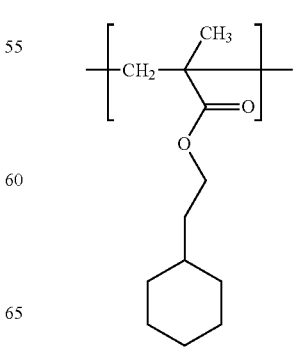

(a5-1-15)

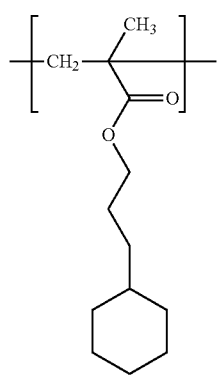

(a5-1-16)

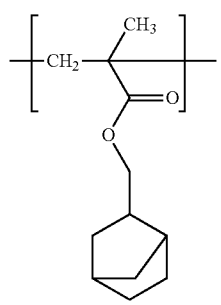

(a5-1-17)

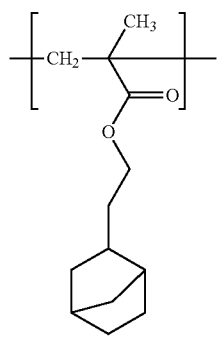

(a5-1-18)

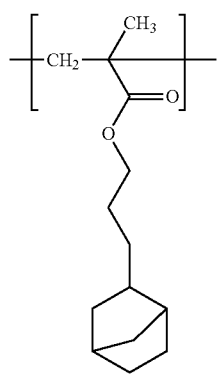

Examples of the structural unit (a5) include the structural units of the formulae (a5-1-1) to (a5-1-18) in which a methyl group corresponding to $R^{51}$ has been replaced by a hydrogen atom.

When Resin (A) has the structural unit (a5), the proportion thereof is preferably 1 to 30% by mole, more preferably 2 to 20% by mole, and still more preferably 3 to 15% by mole, with respect to the total structural units (100% by mole) of Resin (A).

Resin (A) is preferably a resin which has the structural unit (a1) and the structural unit (s) such as the structural unit (a2), the structural unit (a3) and the structural unit (t), more preferably a resin which has the structural unit (a1) and at least one of the structural unit (a2) and the structural unit (a3).

In Resin (A), the structural unit (a1) is preferably at least one of the structural unit (a1-1) and the structural unit (a1-2) (preferably the structural unit having a cyclohexyl group or a cyclopentyl group), and more preferably is the structural unit (a1-1). Resin (A) preferably has both of the structural unit (a1-1) and the structural unit (a1-2). Resin (A) is preferably at least one of the structural unit (a2) and the structural unit (a3). The structural unit (a2) is preferably the structural unit represented by formula (a2-1). The structural unit (a3) is preferably at least one of the structural units (a3-1), (a3-2) and (a3-4).

The structural unit (t) is preferably the structural unit (a4) such as a structural unit which has a fluorine atom.

Resin (A) can be produced by a known polymerization method, for example, radical polymerization method, using one or more kinds of monomers as described above. The proportions of the structural units in Resin (A) can be adjusted by changing the amount of a monomer used in polymerization. The weight average molecular weight of Resin (A) is preferably 2,000 or more (more preferably 2,500 or more, and still more preferably 3,000 or more), and 50,000 or less (more preferably 30,000 or less, and still more preferably 15,000 or less).

The weight average molecular weight is a value determined by gel permeation chromatography using polystyrene as the standard product. The detailed condition of this analysis is described in Examples.

<Resin (X)>

Examples of Resin (X) include one having the structural unit (t), preferably a resin which has the structural unit (a4) and no structural unit (a1), and preferably a resin which has the structural unit (a4) having a fluorine atom.

When the Resin (X) has the structural unit (a4), the proportion thereof is preferably 40% by mole or more, more preferably 45% by mole or more, and still more preferably 50% by mole or more, with respect to the total structural units (100% by mole) of the Resin (X).

Resin (X) can further have the structural unit (a2), the structural unit (a3), the structural unit (a5) and/or the well-known structural unit in the art. Resin (X) preferably consists of the structural units (t), more preferably comprises the structural units (a4) and the structural units (a5) as the structural units (t), still more preferably comprises the structural units (a4) having a fluorine atom as the structural units (t). Resin (X) can be produced by a known polymerization method, for example, radical polymerization method, using one or more kinds of monomers as described above. The proportions of the structural units in the Resin (X) can be adjusted by changing the amount of a monomer used in polymerization. The weight average molecular weight of Resin (X) is preferably 5,000 or more (more preferably 6,000 or more), and 80,000 or less (more preferably 60,000 or less).

When the photoresist composition further contains Resin (X), the proportion thereof is preferably 1 to 60 parts by mass, more preferably 1 to 50 parts by mass, and still more preferably 1 to 40 parts by mass, further more preferably 2 to 30 parts by mass, still further more preferably 2 to 8 parts by mass, with respect to 100 parts by mass of Resin (A).

The photoresist composition preferably further contains Resin (X) which has a structural unit having a fluorine atom and no acid-labile group. The total proportion of Resin (A) and the Resin (X) is preferably 80% by mass to 99% by mass, more preferably 90% by mass to 99% by mass, with respect to the total amount of solid components of the photoresist composition.

The proportion of the solid components in the photoresist composition and that of the resins in the solid components can be measured with a known analytical method such as liquid chromatography and gas chromatography.

<Acid Generator (B)>

The acid generator is a compound which can be decomposed by radiation including light to generate an acid. The acid acts catalytically to Resin (A), resulting in removing a leaving group from the resin.

The acid generator (B) can be an ionic acid generator or a non-ionic acid generator. The acid generator (B) may be used any an ionic acid generator and a non-ionic acid generator. Examples of the nonionic compounds for the acid generator include organic halogenated compounds; sulfonate esters, e.g. 2-nitrobenzylester, aromatic sulfonates, oximesulfonate, N-sulfonyloxyimide, sulfonyloxyketone, and diazonaphtoquione 4-sulfonate; sulfones, e.g., disulfone, ketosulfone, and sulfonium diazomethane. The ionic compounds for the acid generator include onium salts having an onium cation, e.g., diazonium salts, phosphonium salts, sulfonium salts and iodonium salts. Examples of the anions of onium salt include a sulfonic acid anion, a sulfonylimide anion, sulfonylmethide anion.

As the acid generator, the compounds giving an acid by radiation can be used, which are mentioned in JP63-26653A1, JP55-164824A1, JP62-69263A1, JP63-146038A1, JP63-163452A1, JP62-153853A1, JP63-146029A1, U.S. Pat. No. 3,779,778B1, U.S. Pat. No. 3,849,137B1, DE3914407 and EP126,712A1. The acid generator for the photoresist composition can be produced by the method described in the above-mentioned documents.

The acid generator is preferably a fluorine-containing compound, more preferably a salt represented by formula (B1) (which is sometimes referred to as "acid generator (B1)"):

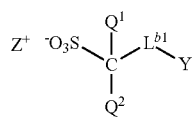

(B1)

wherein $Q^1$ and $Q^2$ each respectively represent a fluorine atom or a C1 to C6 perfluoroalkyl group, $L^{b1}$ represents a C1 to C24 divalent saturated hydrocarbon group where a methylene group can be replaced by an oxygen atom or a carbonyl group and a hydrogen atom can be replaced by a hydroxyl group or fluorine atom, and Y represents an optionally substituted methyl group or an optionally substituted C3 to C18 alicyclic hydrocarbon group where a methylene group can be replaced by an oxygen atom, a carbonyl group or a sulfonyl group, and $Z^+$ represents an organic cation.

Examples of the perfluoroalkyl group of $Q^1$ and $Q^2$ include trifluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

$Q^1$ and $Q^2$ independently are preferably trifluoromethyl or fluorine atom, and both of $Q^1$ and $Q^2$ are more preferably a fluorine atom. Examples of the divalent saturated hydrocarbon group of $L^{b1}$ include any of a chain or a branched alkanediyl group, a divalent mono- or a poly-alicyclic saturated hydrocarbon group, and a combination thereof. Specific examples of the chain alkanediyl group include methylene, ethylene, propane-1,3-diyl, propane-1,2-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl groups.

Specific examples of the branched chain alkanediyl group include ethane-1,1-diyl, propane-1,1-diyl, propane-1,2-diyl, propane-2,2-diyl, pentane-1,4-diyl, pentane-2,4-diyl, 2-methylpropane-1,3-diyl, 2-methylpropane-1,2-diyl and 2-methylbutane-1,4-diyl groups.

Specific examples of the mono-alicyclic saturated hydrocarbon group include a cycloalkanediyl group such as cyclobutan-1,3-diyl, cyclopentan-1,3-diyl, cyclohexane-1,4-diyl and cyclooctan-1,5-diyl groups.

Specific examples of the poly-alicyclic saturated hydrocarbon group include norbornane-1,4-diyl, norbornane-2,5-diyl, adamantane-1,5-diyl and adamantane-2,6-diyl groups.

Examples of the saturated hydrocarbon group of $L^{b1}$ in which a methylene group has been replaced by oxygen atom or a carbonyl group include the following groups represented by formula (b1-1) to formula (b1-3):

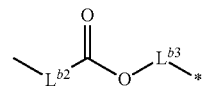

(b1-1)

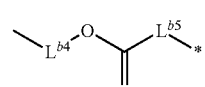

(b1-2)

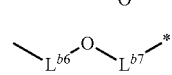

(b1-3)

wherein $L^{b2}$ represents a single bond or a C1 to C22 divalent saturated hydrocarbon group where a hydrogen atom can be replaced by a fluorine atom; $L^{b3}$ represents a single bond or a C1 to C22 divalent saturated hydrocarbon group where a hydrogen atom can be replaced by a fluorine atom or a hydroxy group, and a methylene group can be replaced by an oxygen atom or a carbonyl group; provided that the total number of the carbon atoms contained in the group of $L^{b2}$ and $L^{b3}$ is 22 or less;

$L^{b4}$ represents a single bond or a C1 to C22 divalent saturated hydrocarbon group where a hydrogen atom can be replaced by a fluorine atom;

$L^{b5}$ represents a single bond or a C1 to C22 divalent saturated hydrocarbon group where a hydrogen atom can be replaced by a fluorine atom or a hydroxy group, and a methylene group can be replaced by an oxygen atom or a carbonyl group; provided that the total number of the carbon atoms contained in the group of $L^{b4}$ and $L^{b5}$ is 22 or less;

$L^{b6}$ represents a single bond or a C1 to C23 divalent saturated hydrocarbon group where a hydrogen atom can be replaced by a fluorine atom or a hydroxy group; $L^{b7}$ represents a single bond or a C1 to C23 divalent saturated hydrocarbon group where a hydrogen atom can be replaced by a fluorine atom or a hydroxy group, and a methylene group can be replaced by an oxygen atom or a carbonyl group; provided that the total number of the carbon atoms contained in the group of $L^{b6}$ and $L^{b7}$ is 23 or less, and

* represents a binding position to —Y.

In formula (b1-1) to formula (b1-3), when a methylene group has been replaced by an oxygen atom or a carbonyl group, the carbon number of the saturated hydrocarbon group corresponds to the number of the carbon atom before replacement.

Examples of the divalent saturated hydrocarbon group are the same examples as the divalent saturated hydrocarbon group of $L^{b1}$.

$L^{b2}$ is preferably a single bond.

$L^{b3}$ is preferably a C1 to C4 divalent saturated hydrocarbon group.

$L^{b4}$ is preferably a C1 to C8 divalent saturated hydrocarbon group where a hydrogen atom can be replaced by a fluorine atom.

$L^{b5}$ is preferably a single bond or a C1 to C8 divalent saturated hydrocarbon group.

$L^{b6}$ is preferably a single bond or a C1 to C4 divalent saturated hydrocarbon group where a hydrogen atom can be replaced by a fluorine atom.

$L^{b7}$ is preferably a single bond or a C1 to C18 divalent saturated hydrocarbon group where a hydrogen atom can be replaced by a fluorine atom or a hydroxy group, and where a methylene group can be replaced by an oxygen atom or a carbonyl group.

Among these, the group represented by the formula (b1-1) or the formula (b1-3) is preferred.

Examples of the divalent group represented by the formula (b1-1) include the following groups represented by formula (b1-4) to formula (b1-8):

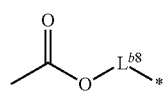
(b1-4)

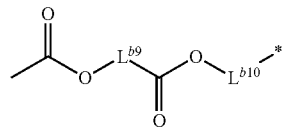
(b1-5)

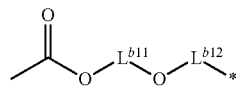
(b1-6)

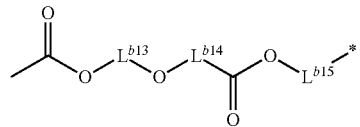
(b1-7)

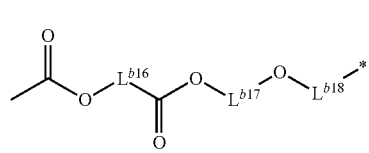
(b1-8)

wherein $L^{b8}$ represents a single bond or a C1 to C22 divalent saturated hydrocarbon group where a hydrogen atom can be replaced by a fluorine atom or a hydroxy group;

$L^{b9}$ represents a C1 to C20 divalent saturated hydrocarbon group;

$L^{b10}$ represents a single bond or a C1 to C19 divalent saturated hydrocarbon group where a hydrogen atom can be replaced by a fluorine atom or a hydroxy group; provided that the total number of the carbon atoms contained in the group of $L^{b9}$ and $L^{b10}$ is 20 or less;

$L^{b11}$ represents a $C_1$ to $C_{21}$ divalent saturated hydrocarbon group;

$L^{b12}$ represents a single bond or a C1 to C20 divalent saturated hydrocarbon group where a hydrogen atom can be replaced by a fluorine atom or a hydroxy group; provided that the total number of the carbon atoms contained in the group of $L^{b11}$ and $L^{b12}$ is 21 or less;

$L^{b13}$ represents a C1 to C19 divalent saturated hydrocarbon group;

$L^{b14}$ represents a single bond or a C1 to C18 divalent saturated hydrocarbon group; $L^{b18}$ represents a single bond or a C1 to C18 divalent saturated hydrocarbon group where a hydrogen atom can be replaced by a fluorine atom or a hydroxy group; provided that the total number of the carbon atoms contained in the group of $L^{b13}$, $L^{b14}$ and $L^{b15}$ is 19 or less;

$L^{b16}$ represents a C1 to C18 divalent saturated hydrocarbon group; $L^{b17}$ represents a C1 to C18 divalent saturated hydrocarbon group; $L^{b18}$ represents a single bond or a C1 to C17 divalent saturated hydrocarbon group where a hydrogen atom can be replaced by a fluorine atom or a hydroxy group; provided that the total number of the carbon atoms contained in the group of $L^{b16}$, $L^{b17}$ and $L^{b18}$ is 19 or less, and

* represents a binding position to —Y.

$L^{b8}$ is preferably a C1 to C4 divalent saturated hydrocarbon group.

$L^{b9}$ is preferably a C1 to C8 divalent saturated hydrocarbon group.

$L^{b10}$ is preferably a single bond or a C1 to C19 divalent saturated hydrocarbon group, and more preferably a single bond or a C1 to C8 divalent saturated hydrocarbon group.

$L^{b11}$ is preferably a C1 to C8 divalent saturated hydrocarbon group.

$L^{b12}$ is preferably a single bond or a C1 to C8 divalent saturated hydrocarbon group.

$L^{b13}$ is preferably a C1 to C12 divalent saturated hydrocarbon group.

$L^{b14}$ is preferably a single bond or a C1 to C6 divalent saturated hydrocarbon group.

$L^{b15}$ is preferably a C1 to C18 divalent saturated hydrocarbon group, and more preferably a single bond or a C1 to C8 divalent saturated hydrocarbon group.

$L^{b16}$ is preferably a C1 to C12 divalent saturated hydrocarbon group.

$L^{b17}$ is preferably a C1 to C6 divalent saturated hydrocarbon group.

$L^{b18}$ is preferably a single bond or a C1 to C17 divalent saturated hydrocarbon group, and more preferably a single bond or a C1 to C4 divalent saturated hydrocarbon group.

Examples of the divalent group represented by the formula (b1-3) include the following groups represented by formula (b1-9) to formula (b1-11):

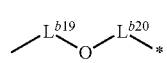
(b1-9)

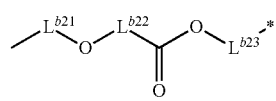
(b1-10)

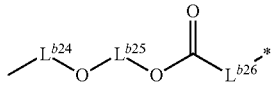
(b1-11)

wherein $L^{b19}$ represents a single bond or a C1 to C23 divalent saturated hydrocarbon group where a hydrogen atom can be replaced by a fluorine atom;

$L^{b20}$ represent a single bond or a C1 to C23 divalent saturated hydrocarbon group where a hydrogen atom can be replaced by a fluorine atom, a hydroxy group or an acyloxy group, and a methylene group contained in an acyloxy group can be replaced by an oxygen atom or a carbonyl group, and a hydrogen atom contained in an acyloxy group can be replaced by a hydroxy group, provided that the total number of the carbon atoms contained in the group of $L^{b19}$ and $L^{b20}$ is 23 or less;

$L^{b21}$ represents a single bond or a $C_1$ to $C_{21}$ divalent saturated hydrocarbon group where a hydrogen atom can be replaced by a fluorine atom;

$L^{b22}$ represents a single bond or a $C_1$ to $C_{21}$ divalent saturated hydrocarbon group;

$L^{b23}$ represents a single bond or a $C_1$ to $C_{21}$ divalent saturated hydrocarbon group where a hydrogen atom can be replaced by a fluorine atom, a hydroxy group or an acyloxy group, and a methylene group contained in an acyloxy group can be replaced by an oxygen atom or a carbonyl group, and a hydrogen atom contained in an acyloxy group can be replaced by a hydroxy group, provided that the total number of the carbon atoms contained in the group of $L^{b21}$, $L^{b22}$ and $L^{b23}$ is 21 or less;

$L^{b24}$ represents a single bond or a C1 to C20 divalent saturated hydrocarbon group where a hydrogen atom can be replaced by a fluorine atom;

$L^{b25}$ represents a single bond or a $C_1$ to $C_{21}$ divalent saturated hydrocarbon group;

$L^{b26}$ represents a single bond or a C1 to C20 divalent saturated hydrocarbon group where a hydrogen atom can be replaced by a fluorine atom, a hydroxy group or an acyloxy group, and a methylene group contained in an acyloxy group can be replaced by an oxygen atom or a carbonyl group, and a hydrogen atom contained in an acyloxy group can be replaced by a hydroxy group, provided that the total number of the carbon atoms contained in the group of $L^{b24}$, $L^{b25}$ and $L^{b26}$ is 21 or less; and * represents a binding position to —Y.

In formula (b1-9) to formula (b1-11), when a hydrogen atom has been replaced by an acyloxy group, the carbon number of the saturated hydrocarbon group corresponds to the number of the carbon atom, CO and O in addition to the carbon number of the saturated hydrocarbon group.

For formula (b1-9) to formula (b1-11), examples of the divalent saturated hydrocarbon group include an alkanediyl and a monocyclic or polycyclic divalent saturated hydrocarbon group, and a combination of two or more such groups.

Examples of the acyloxy group include acetyloxy, propionyloxy, butyryloxy, cyclohexylcarbonyloxy and adamantylcarbonyloxy groups.

Examples of the acyloxy group having a substituent include oxoadamantylcarbonyloxy, hydroxyadamantylcarbonyloxy, oxocyclohexylcarbonyloxy and hydroxycyclohexylcarbonyloxy groups. Examples of the group represented by the formula (b1-4) include the following ones.

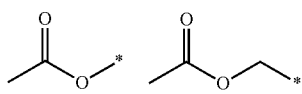

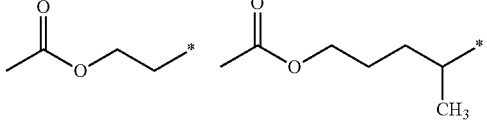

Examples of the group represented by the formula (b1-5) include the following ones.

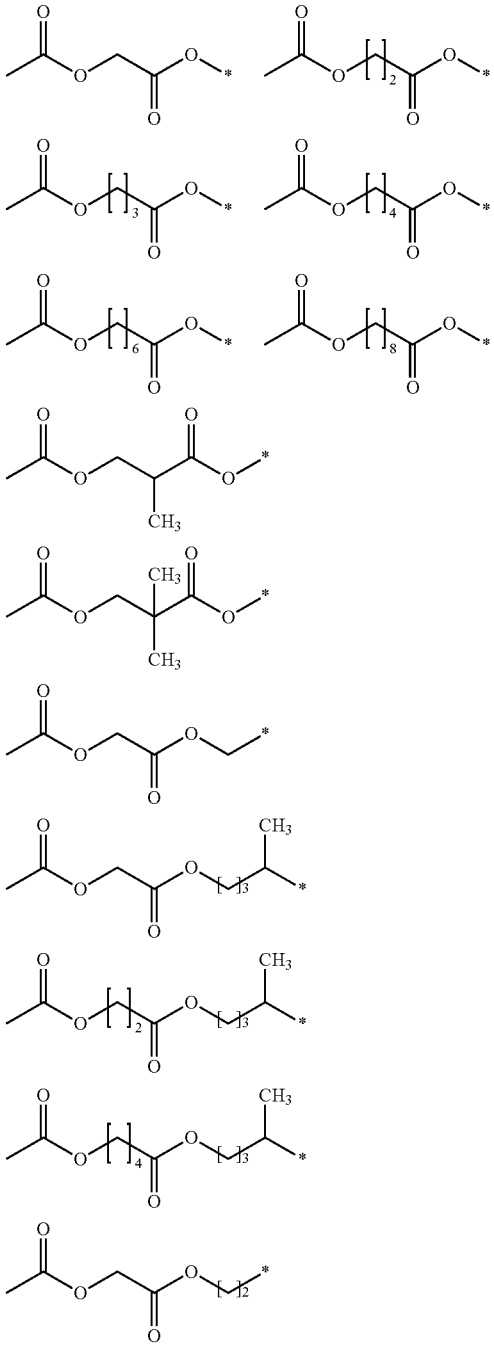

Examples of the group represented by the formula (b1-6) include the following ones.

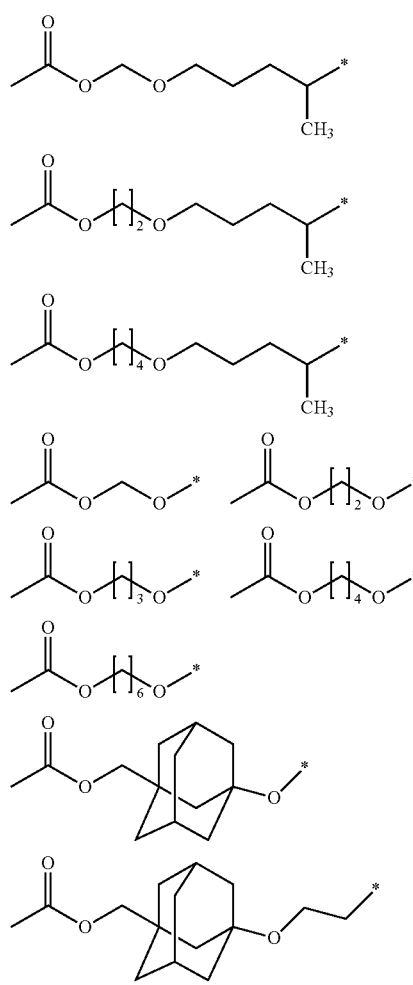
Examples of the group represented by the formula (b1-7) include the following ones.
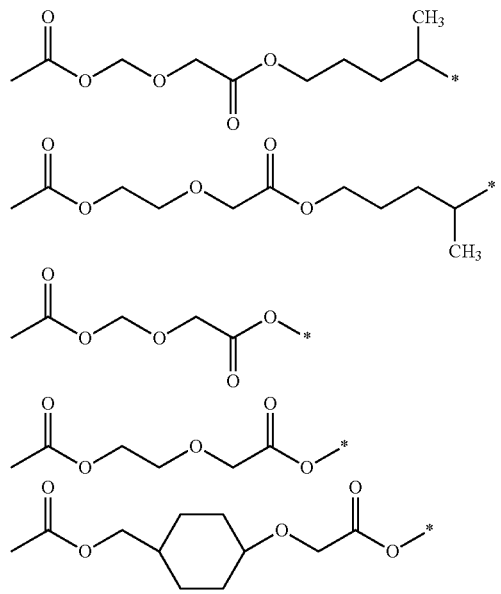
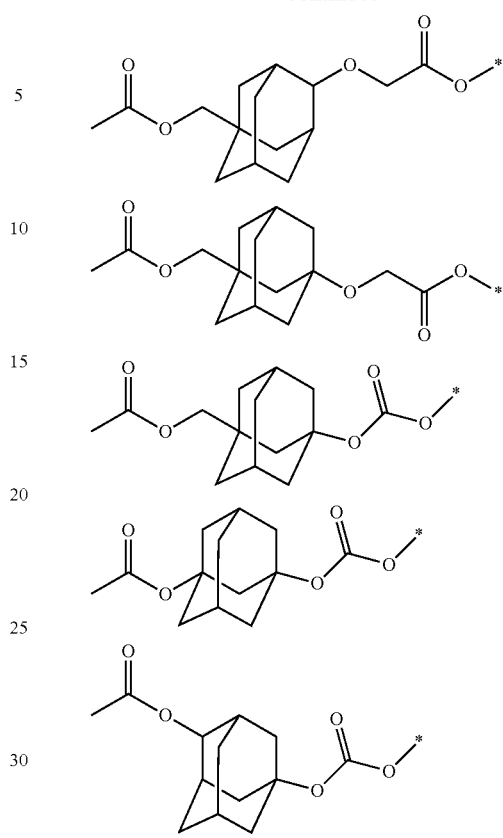
Examples of the group represented by the formula (b1-8) include the following ones.
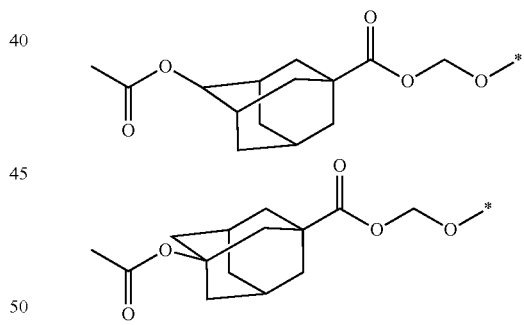
Examples of the group represented by the formula (b1-2) include the following ones.
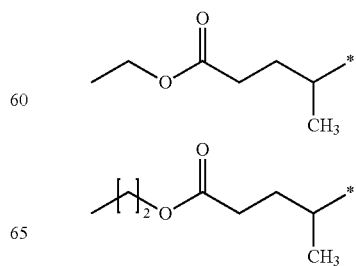

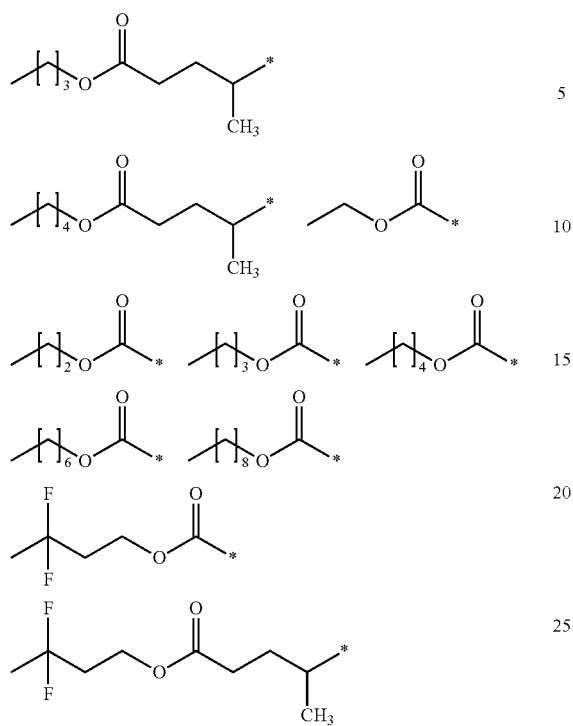
Examples of the group represented by the formula (b1-9) include the following ones.
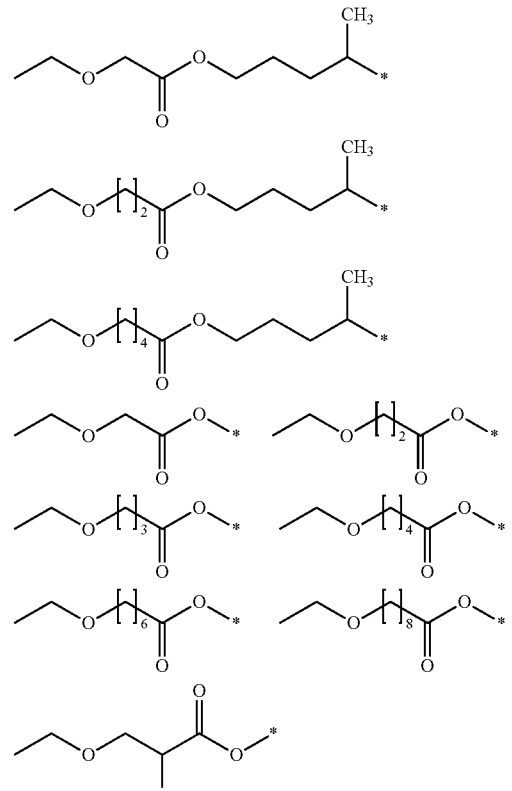
Examples of the group represented by the formula (b1-10) include the following ones.
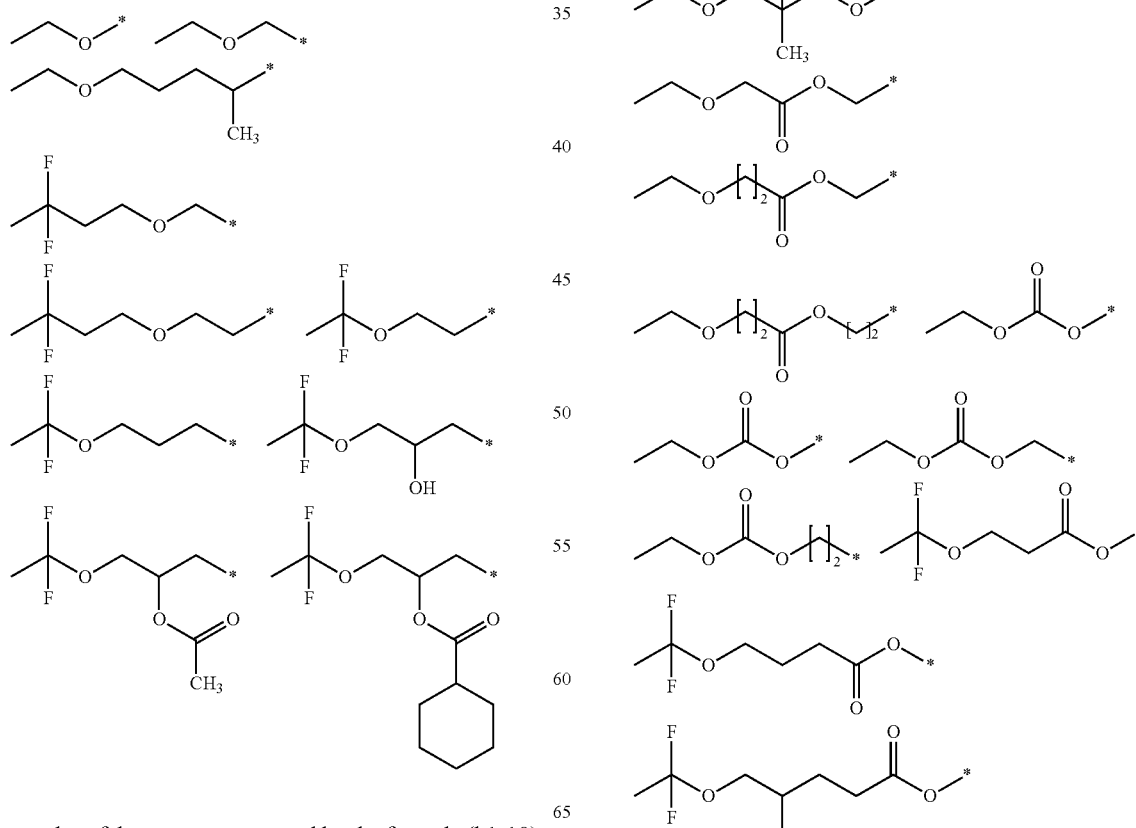

-continued
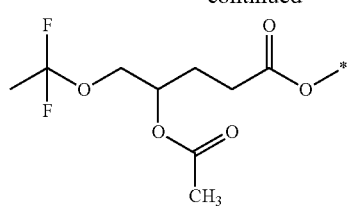
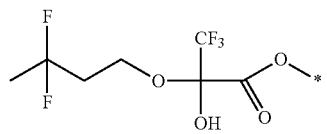
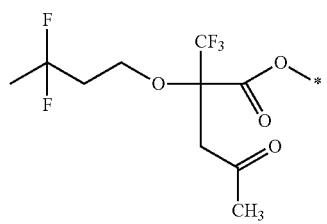
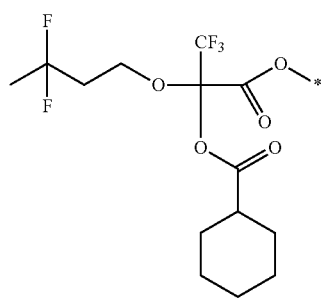
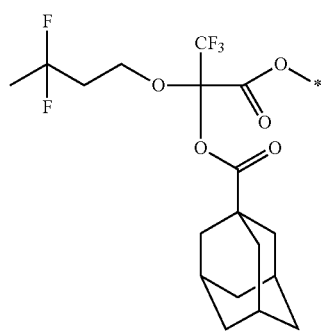
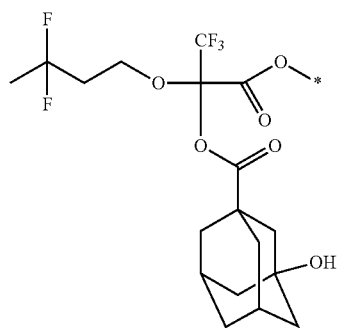
-continued
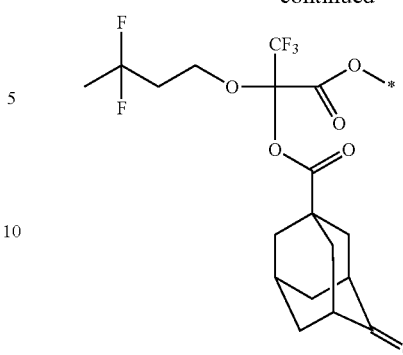
Examples of the group represented by the formula (b1-11) include the following ones.
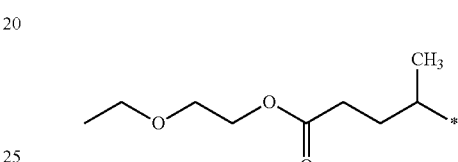
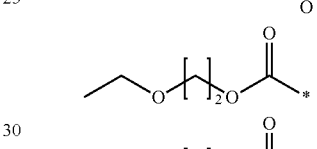
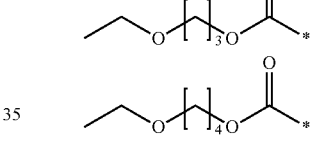
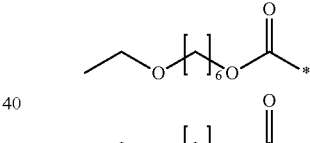
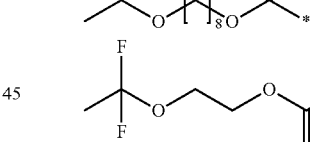
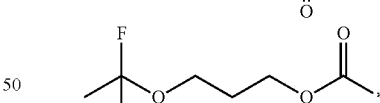
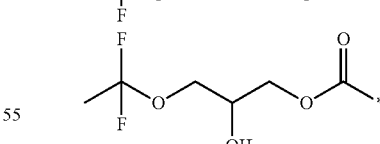
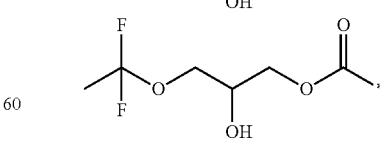
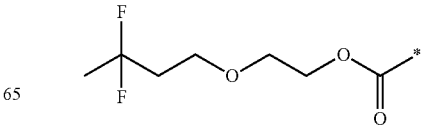

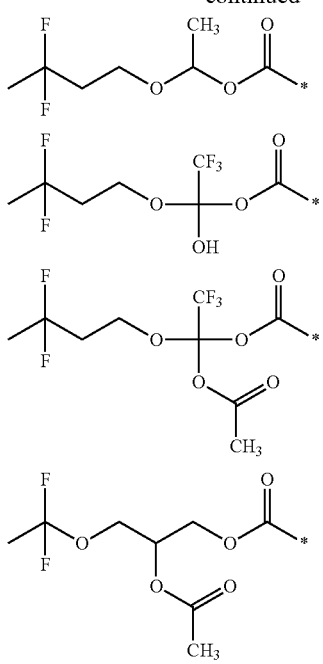

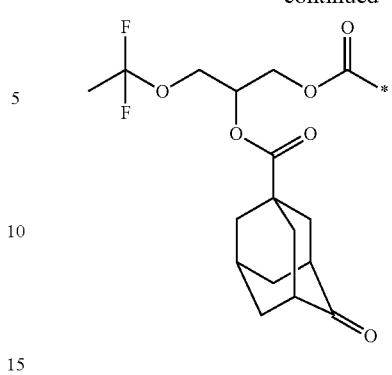

Examples of the monovalent alicyclic hydrocarbon group of Y include groups represented by formula (Y1) to formula (Y11) and formula (Y36) to formula (Y38). Examples of the monovalent alicyclic hydrocarbon group of Yin which a methylene group has been replaced by an oxygen atom, a carbonyl group or a sulfonyl group include groups represented by formula (Y12) to formula (Y38).

 (Y1)

 (Y2)

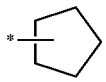 (Y3)

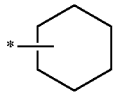 (Y4)

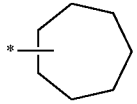 (Y5)

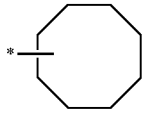 (Y6)

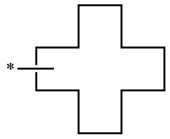 (Y7)

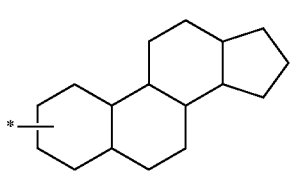 (Y8)

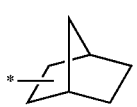 (Y9)

-continued
 (Y10)
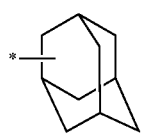 (Y11)
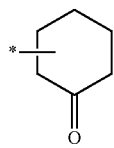 (Y12)
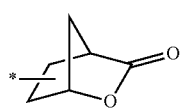 (Y13)
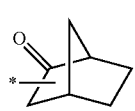 (Y14)
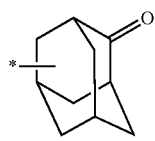 (Y15)
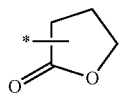 (Y16)
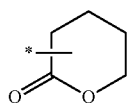 (Y17)
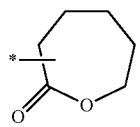 (Y18)
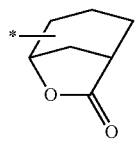 (Y19)
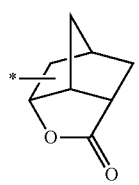 (Y20)]
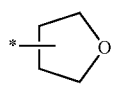 (Y21)
-continued
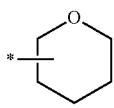 (Y22)
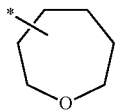 (Y23)
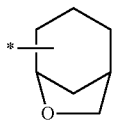 (Y24)
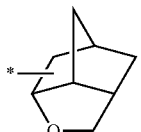 (Y25)
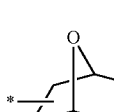 (Y26)
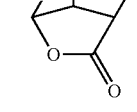 (Y27)
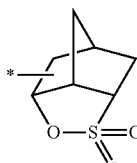 (Y28)
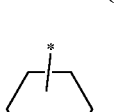 (Y29)
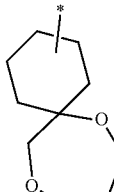 (Y30)

-continued

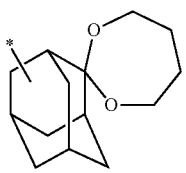 (Y30)

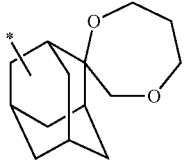 (Y31)

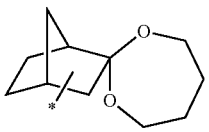 (Y32)

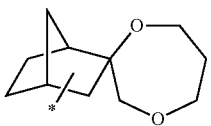 (Y33)

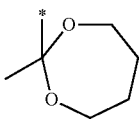 (Y34)

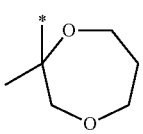 (Y35)

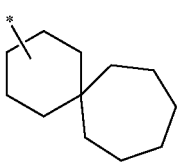 (Y36)

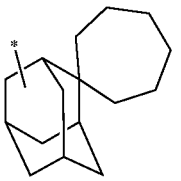 (Y37)

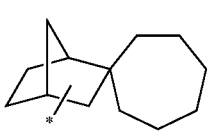 (Y38)

The ketal ring may have two oxygen atoms each bonded to a carbon atom different to one another. In the ketal ring, a methylene group bonded to the oxygen atom preferably has no fluorine atom.

Among these, the alicyclic hydrocarbon group is preferably any one of groups represented by the formula (Y1) to the formula (Y20), the formula (Y30), and the formula (Y31), more preferably any one of groups represented by the formula (Y11), (Y15), (Y16), (Y20), (Y30) and (Y31), and still more preferably group represented by the formula (Y11), (Y15) or (Y30).

Examples of the substituent for the methyl group of Y include a halogen atom, a hydroxyl group, a C3 to C16 alicyclic hydrocarbon group, a C6 to C18 aromatic hydrocarbon group, a glycidyloxy group and —$(CH_2)_{j2}$—O—CO—$R^{b1}$— in which $R^{b1}$ represents an C1 to C16 alkyl group, a C3 to C16 alicyclic hydrocarbon group, or a C6 to C18 aromatic hydrocarbon group, and j2 represents an integer of 0 to 4.

Examples of the substituent for the alicyclic group of Y include a halogen atom, a hydroxyl group, a C1 to C12 alkyl group, a hydroxy group-containing C1 to C12 alkyl group, a C3 to C16 alicyclic hydrocarbon group, a C1 to C12 alkoxy group, a C6 to C18 aromatic hydrocarbon group, a C7 to C21 aralkyl group, a C2 to C4 acyl group, a glycidyloxy group and —$(CH_2)_{j2}$—O—CO—$R^{b1}$— in which $R^{b1}$ represents an C1 to C16 alkyl group, a C3 to C16 alicyclic hydrocarbon group, or a C6 to C18 aromatic hydrocarbon group, and j2 represents an integer of 0 to 4.

Examples of the halogen atom include fluorine, chlorine, bromine and iodine atoms.

Examples of the alicyclic hydrocarbon group include a cyclopentyl group, a cyclohexyl group, a methylcyclohexyl group, a dimethylcyclohexyl group, a cycloheptyl group, a cyclooctyl group, an adamantyl group and norbornyl group.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the alkyl group include methyl, ethyl, n-propyl, isopropyl, n-butyl, sec-butyl, tert-butyl, n-pentyl, n-hexyl, heptyl, octyl, nonyl, decyl, undecyl and dodecyl groups.

Examples of the hydroxy group-containing alkyl group include hydroxymethyl and hydroxyethyl groups.

Examples of the alkoxyl group include methoxy, ethoxy, propoxy, butoxy, pentyloxy, hexyloxy, heptyloxy, octyloxy, decyloxy and dodecyloxy groups. Examples of the aralkyl group include benzyl, phenethyl, phenylpropyl, naphthylmethyl and naphthylethyl groups.

Examples of the acyl group include acetyl, propionyl and butyryl groups. Examples of Y include the groups below. represents a binding position to $L^{b1}$.

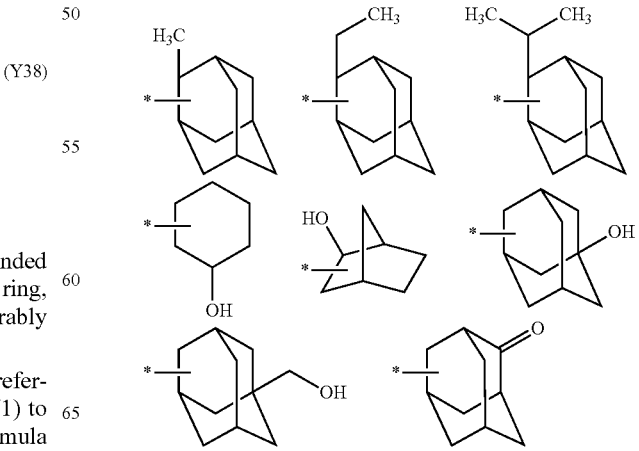

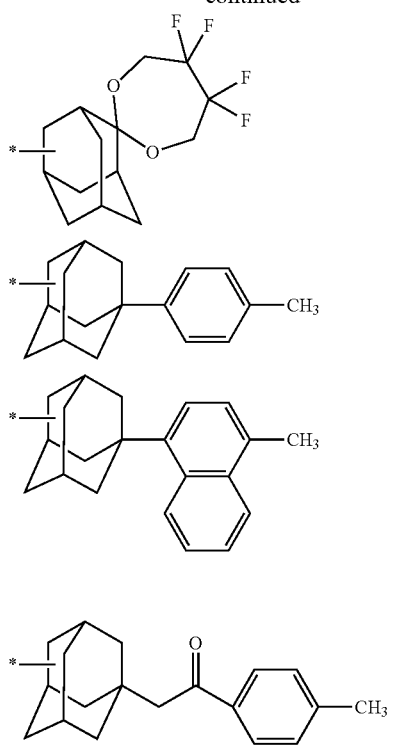
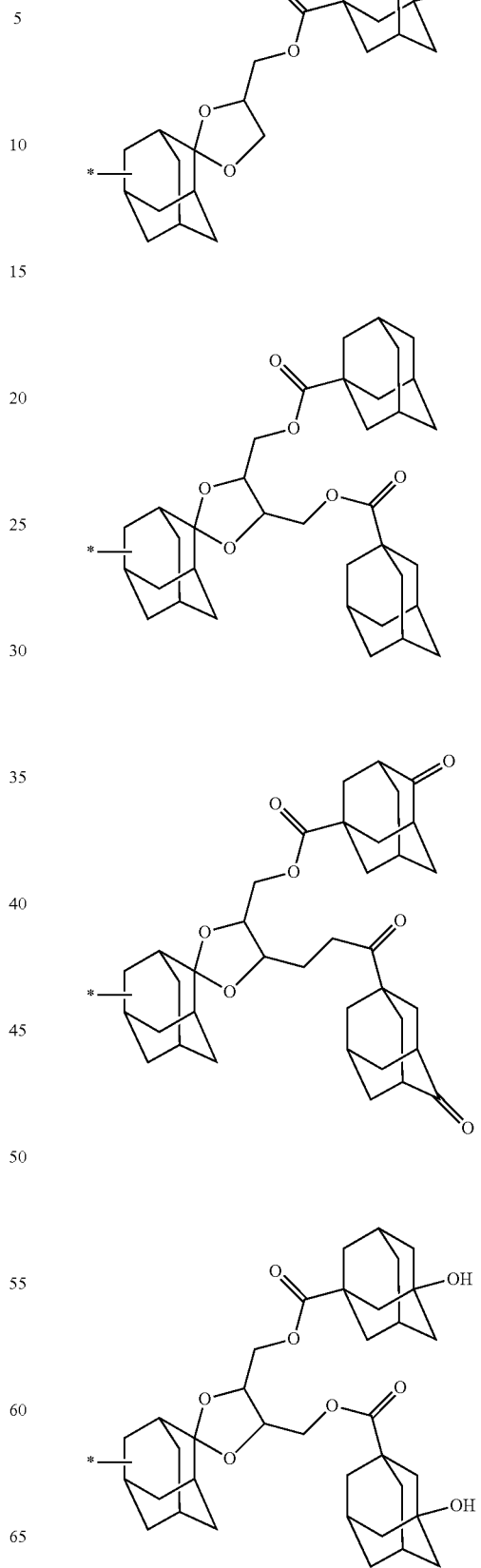

77
-continued
78
-continued
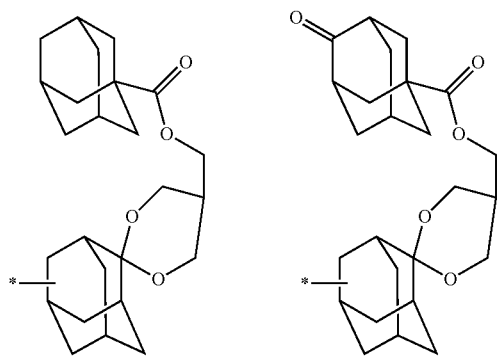
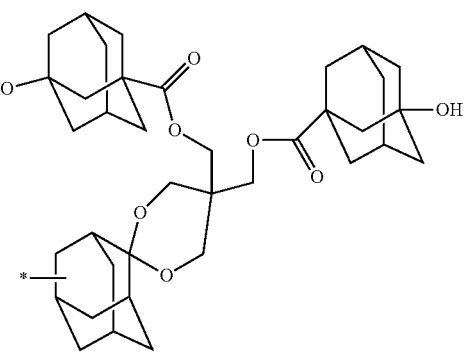
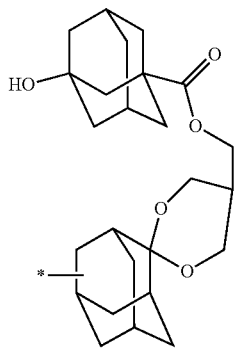
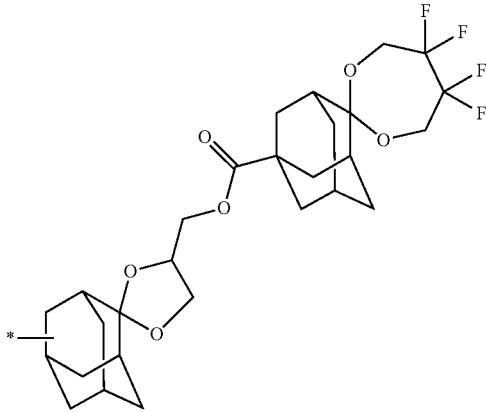
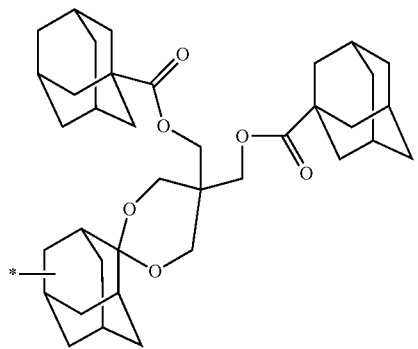
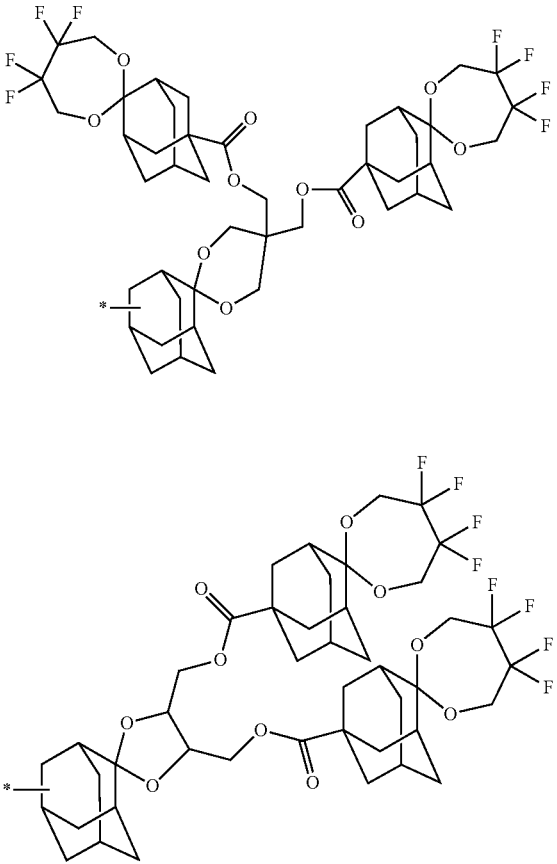

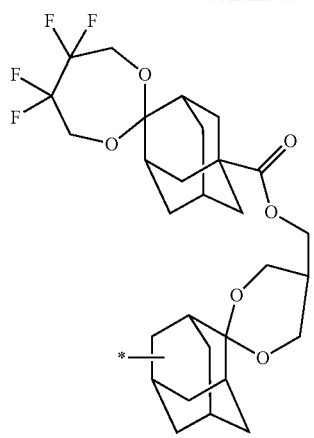

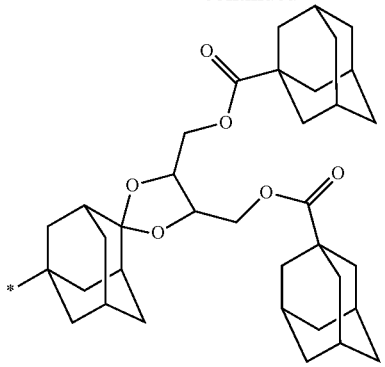

When Y is a methyl group and $L^{b1}$ is a C1 to C17 divalent chain or branched saturated hydrocarbon group, a —CH$_2$— which is bonded to Y is preferably replaced by an oxygen atom or a carbonyl group.

Y is preferably a C3 to C18 alicyclic hydrocarbon group which can have a substituent, more preferably an adamantyl group which may have a substituent and in which a methylene group can be replaced by an oxygen atom, a carbonyl group or a sufonyl group, and still more preferably an adamantyl group, a hydroxyadamantyl group, an oxoadamantyl group or a group below.

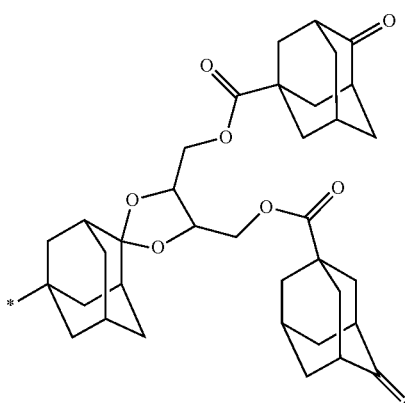

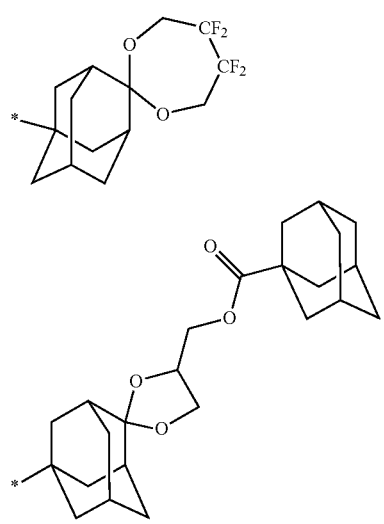

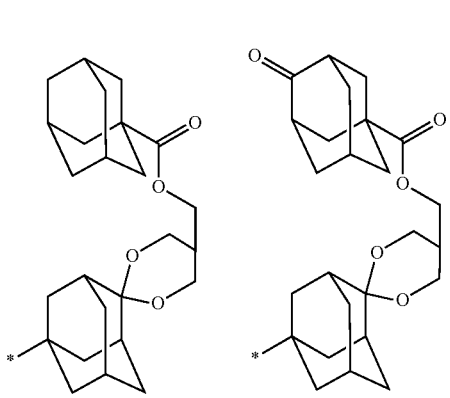

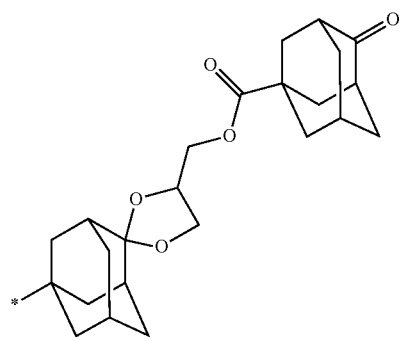

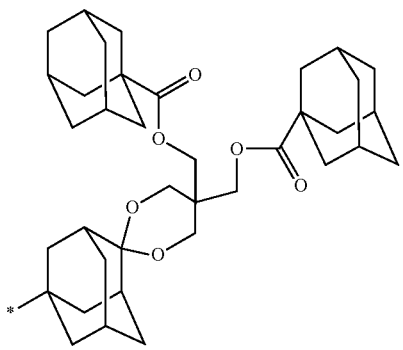

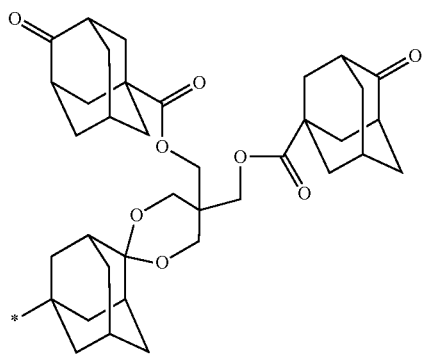
(B1-A-7) 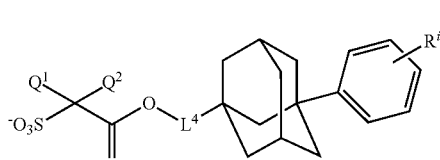
(B1-A-8) 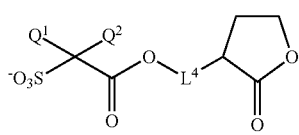
The sulfonic acid anion for the salt represented by formula (B1) is preferably anions represented by formula (B1-A-1) to formula (B1-A-54), and more preferably anions represented by formula (B1-A-1) to formula (B1-A-4), formula (B1-A-9), formula (B1-A-10), formulae (B1-A-24) to (B1-A-33), formulae (B1-A-36) to (B1-A-40), and formulae (B1-A-47) to (B1-A-54).
(B1-A-9) 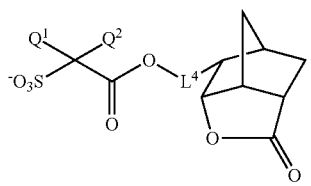
(B1-A-1) 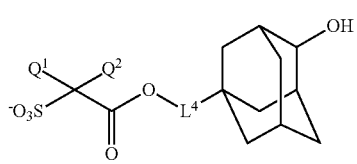
(B1-A-10) 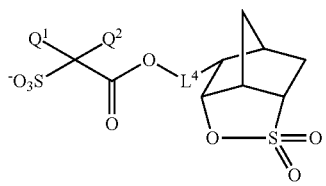
(B1-A-2) 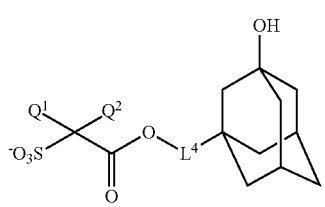
(B1-A-11) 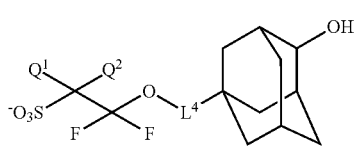
(B1-A-3) 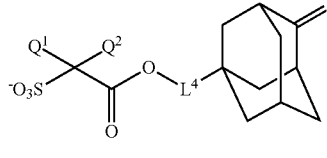
(B1-A-12) 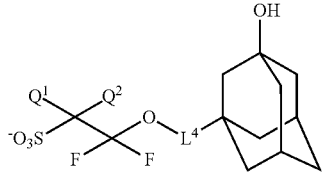
(B1-A-4) 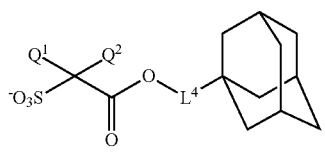
(B1-A-13) 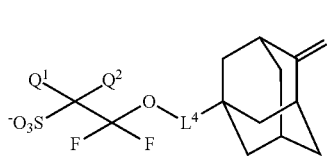
(B1-A-5) 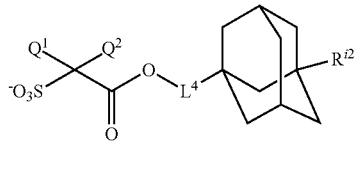
(B1-A-14) 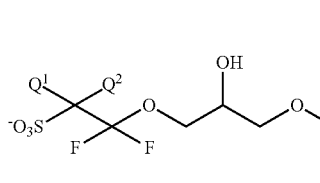
(B1-A-6) 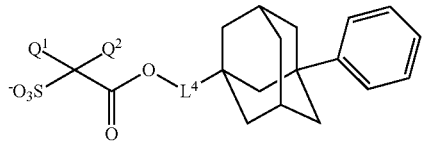

(B1-A-15)
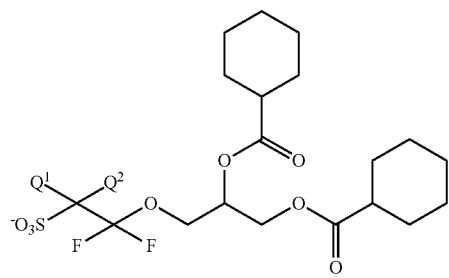
(B1-A-16)
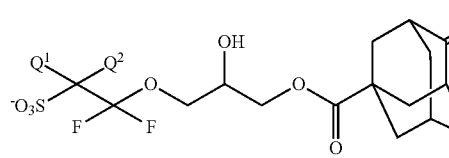
(B1-A-17)
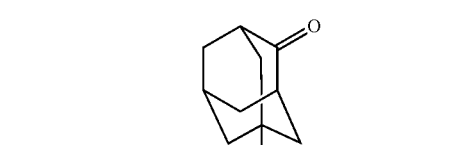
(B1-A-18)
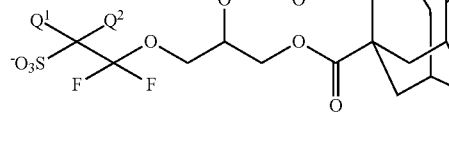
(B1-A-19)
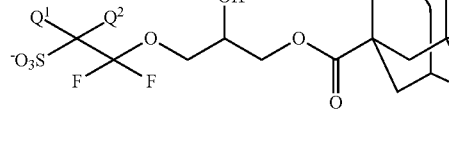
(B1-A-20)
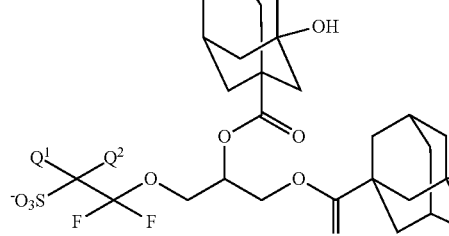
(B1-A-21)
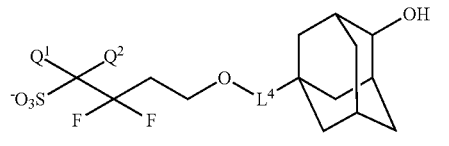
(B1-A-22)
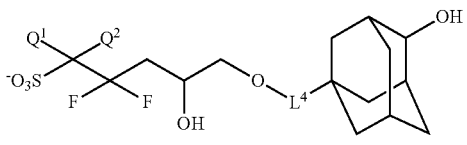
(B1-A-23)
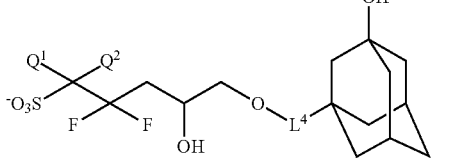
(B1-A-24)
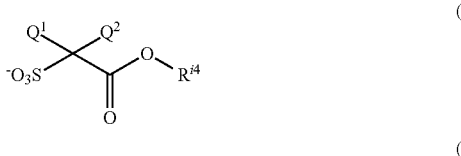
(B1-A-25)
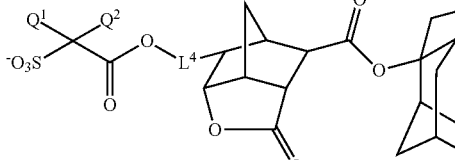
(B1-A-26)
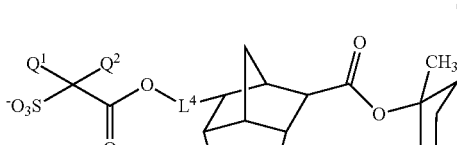
(B1-A-27)
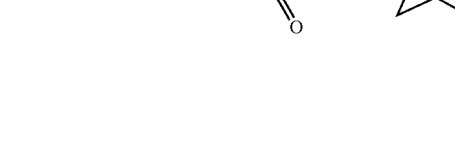
(B1-A-28)
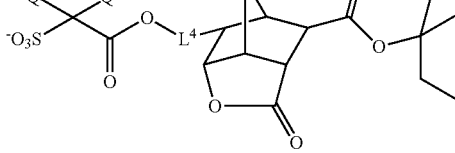

(B1-A-29)
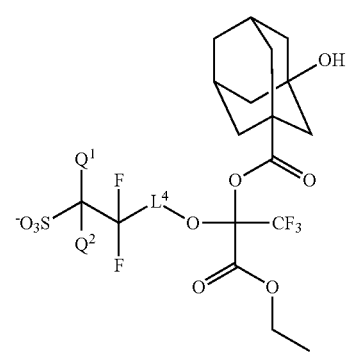
(B1-A-30)
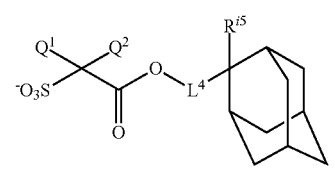
(B1-A-31)
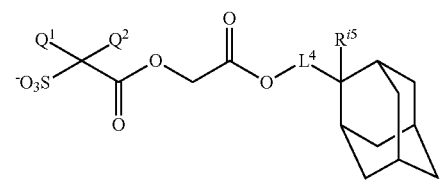
(B1-A-32)
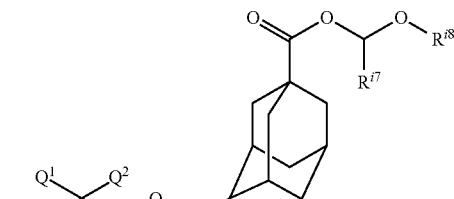
(B1-A-33)
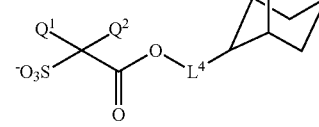
(B1-A-34)
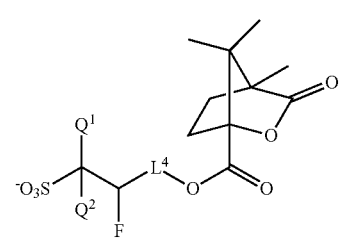
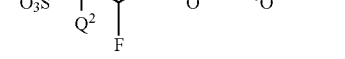
(B1-A-35)
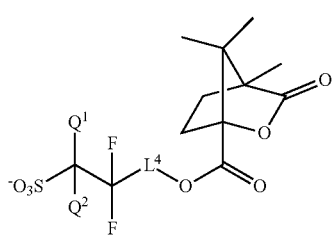
(B1-A-36)
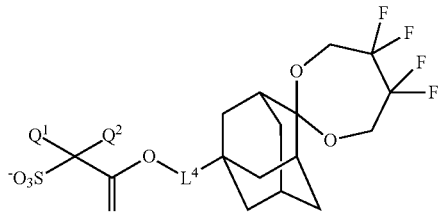
(B1-A-37)
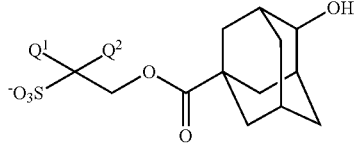
(B1-A-38)
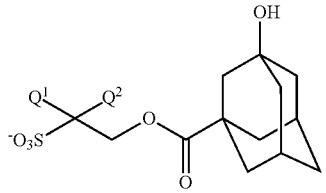
(B1-A-39)
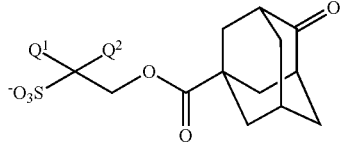
(B1-A-40)
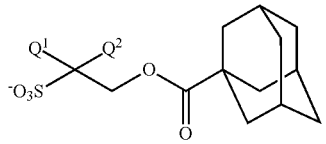
(B1-A-41)
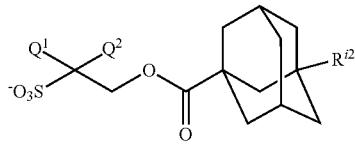
(B1-A-42)
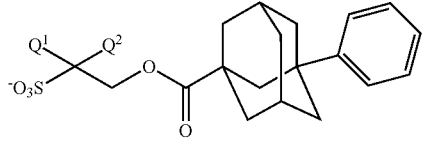

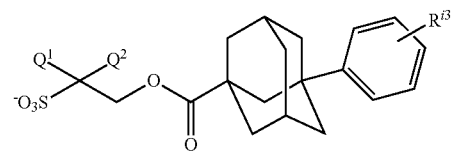 (B1-A-43)
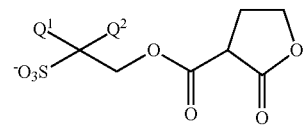 (B1-A-44)
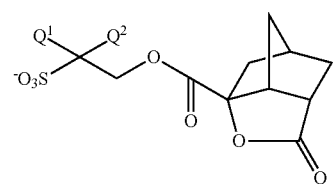 (B1-A-45)
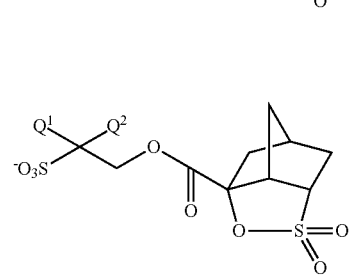 (B1-A-46)
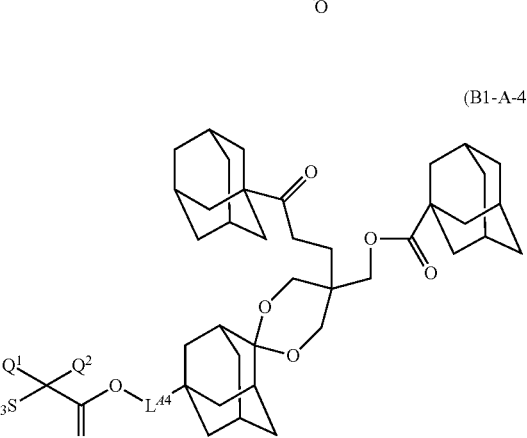 (B1-A-47)
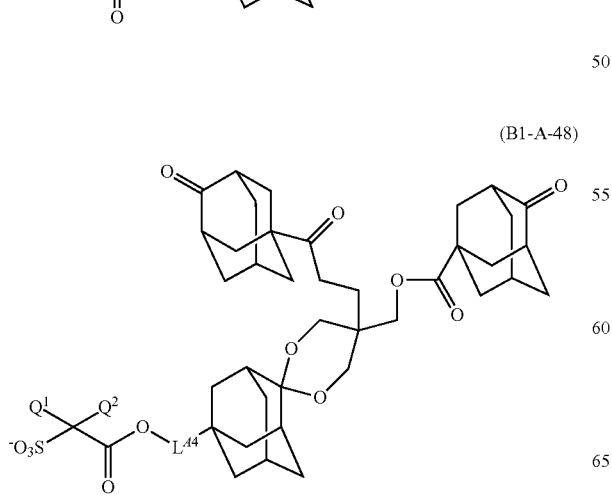 (B1-A-48)
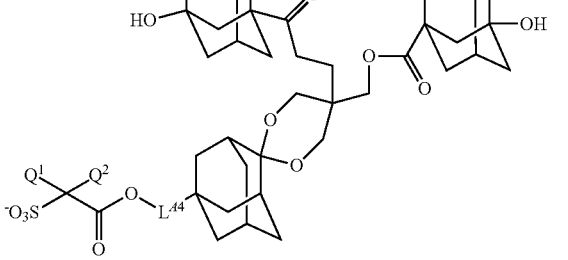 (B1-A-49)
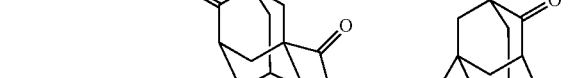 (B1-A-50)
 (B1-A-51)
 (B1-A-52)

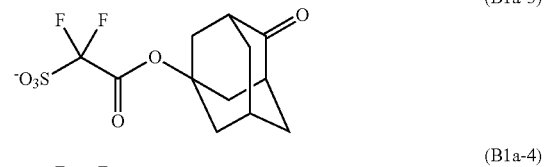
(B1a-3)

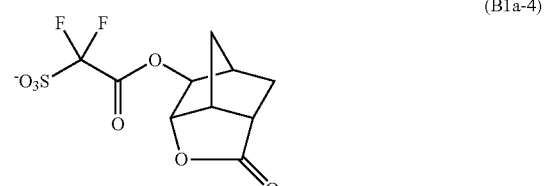
(B1a-4)

(B1-A-53)

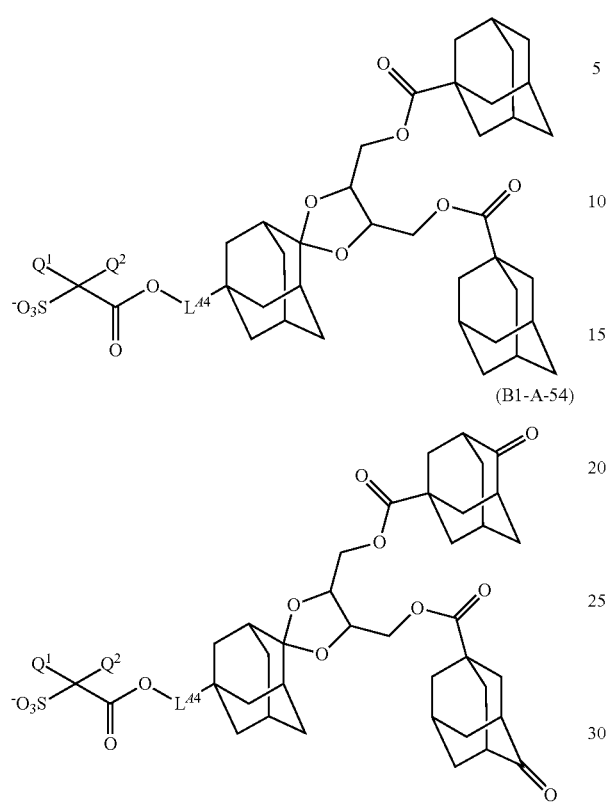

(B1-A-54)

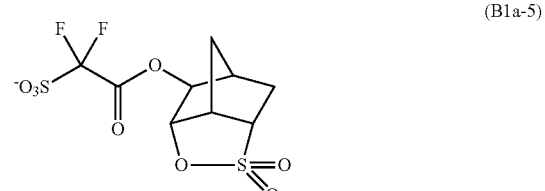
(B1a-5)

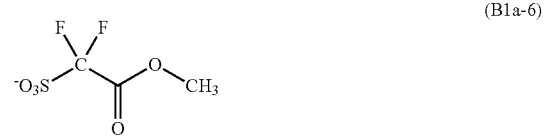
(B1a-6)

In formula (B1-A-1) to formula (B1-A-54), $R^{12}$ to $R^{17}$ independently represent a C1 to C4 alkyl group, and preferably a methyl group or an ethyl group.

$R^{18}$ represent a C1 to C12 aliphatic hydrocarbon group, preferably a C1 to C4 alkyl group, a C5 to C12 monovalent alicyclic hydrocarbon group or a group formed by a combination thereof, more preferably a methyl group, an ethyl group, a cyclohexyl group or an adamantyl group. $L^4$ represents a single bond or a C1 to C4 alkanediyl group. $Q^1$ and $Q^2$ represent the same meaning as defined above.

Specific examples of the sulfonic acid anion in the salt represented by formula (B1) include anions mentioned in JP2010-204646A1.

Among them, preferred examples of the sulfonic acid anion for the salt represented by formula (B1) include anions represented by formulae (B1a-1) to (B1a-30).

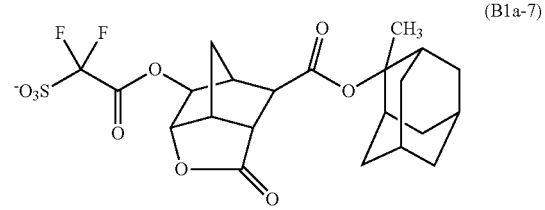
(B1a-7)

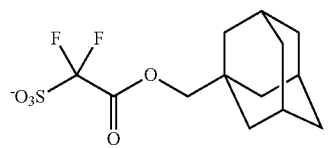
(B1a-1)

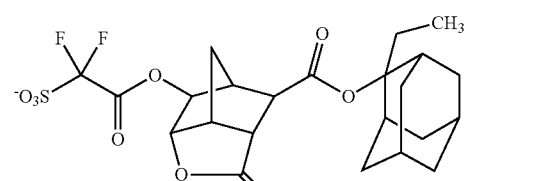
(B1a-8)

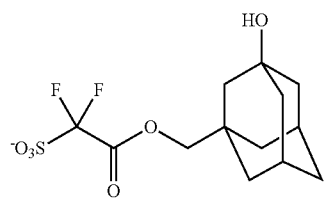
(B1a-2)

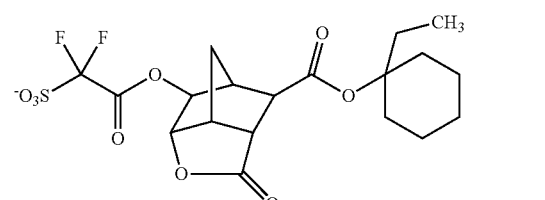
(B1a-9)

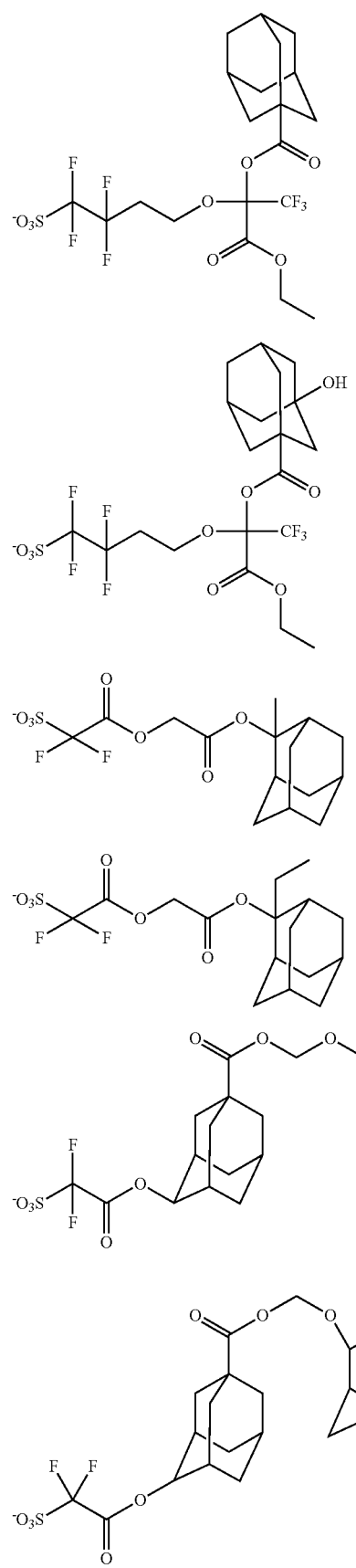
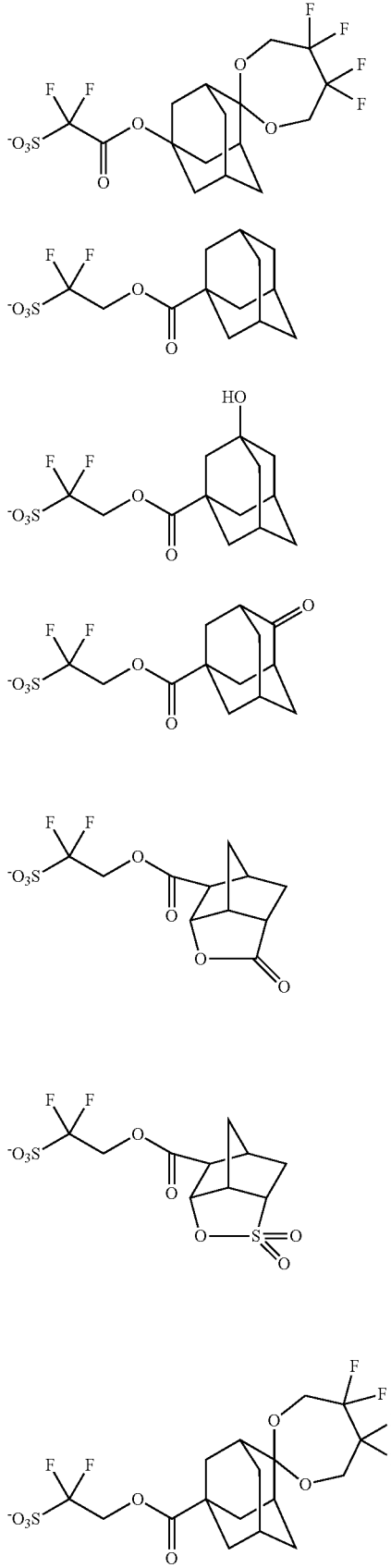

(B1a-23)
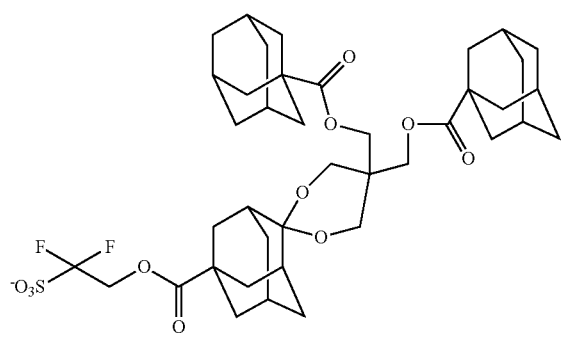

(B1a-24)
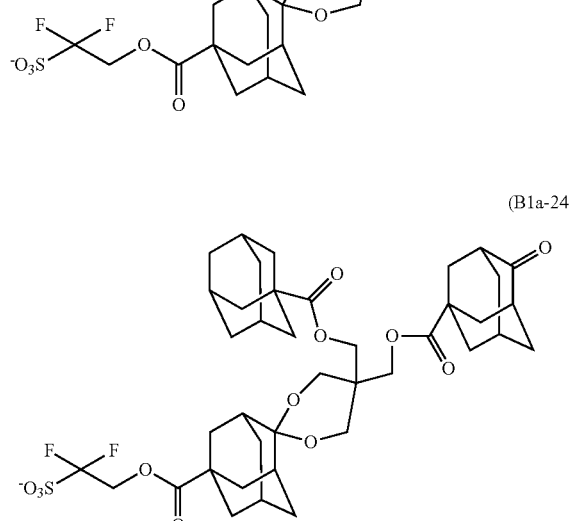

(B1a-25)
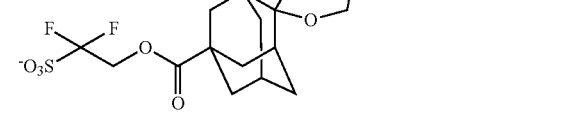

(B1a-26)
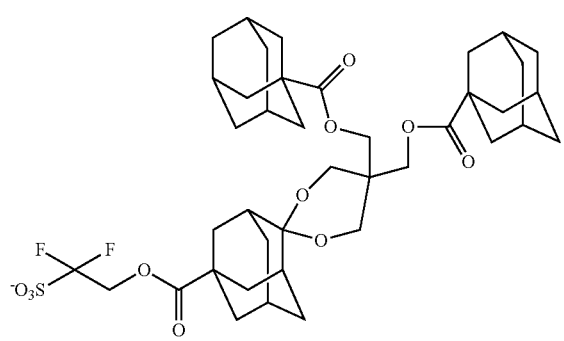

(B1a-27)
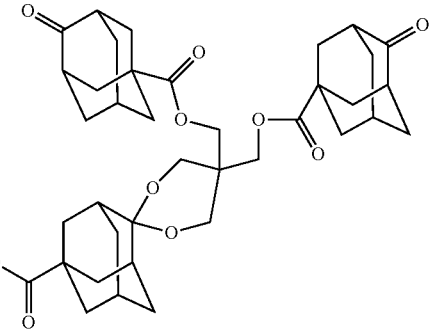

(B1a-28)
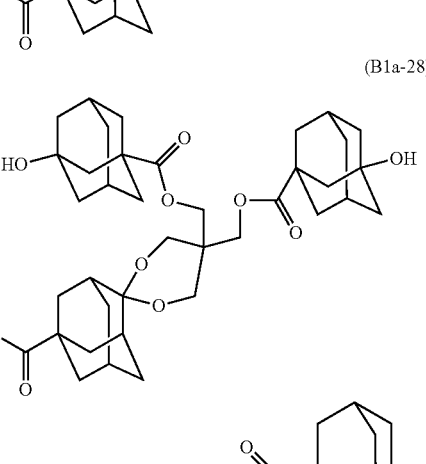

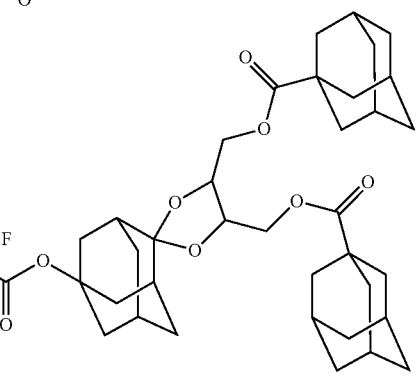

(B1a-30)
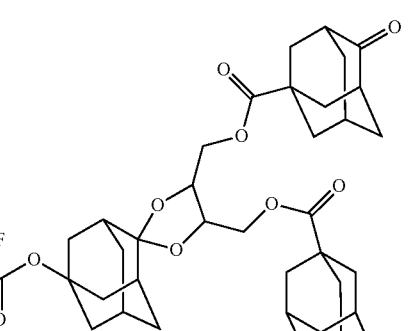

Among them, preferred examples of the sulfonic acid anion include anions represented by formulae (B1a-1) to (B1a-3), (B1a-7) to (B1a-16), (B1a-18), (B1a-19) and (B1a-22) to (B1a-30).

Examples of the organic cation represented by $Z^+$ include an organic onium cation such as an organic sulfonium cation, an organic iodonium cation, an organic ammonium cation, a benzothiazolium cation and an organic phosphonium cation, and an organic sulfonium cation and an organic iodonium cation are preferred, and an arylsulfonium cation is more preferred.

$Z^+$ of the formula (B1) is preferably represented by any of the formula (b2-1) to the formula (b2-4):

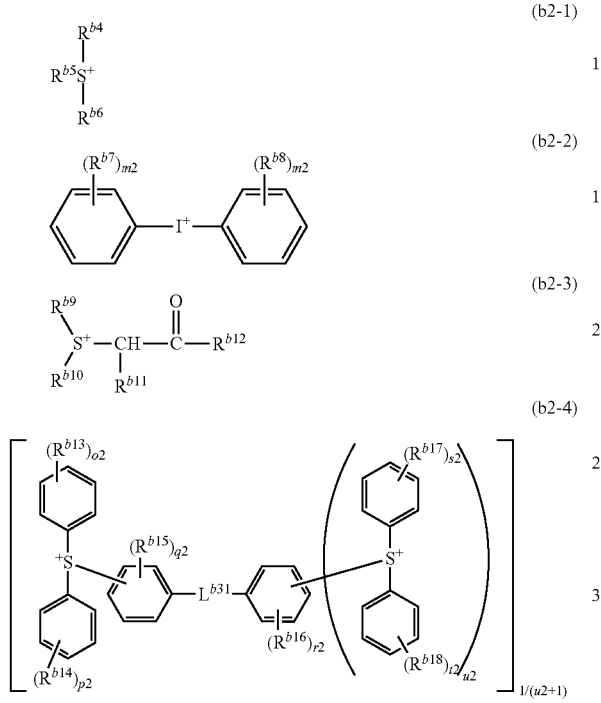

wherein $R^{b4}$, $R^{b5}$ and $R^{b6}$ independently represent a C1 to C30 aliphatic hydrocarbon group, a C3 to C36 alicyclic hydrocarbon group or a C6 to C36 aromatic hydrocarbon group, a hydrogen atom contained in an aliphatic hydrocarbon group can be replaced by a hydroxy group, a C1 to C12 alkoxy group, a C3 to C12 alicyclic hydrocarbon group or a C6 to C18 aromatic hydrocarbon group, a hydrogen atom contained in an alicyclic hydrocarbon group can be replaced by a halogen atom, a C1 to C18 aliphatic hydrocarbon group, a C2 to C4 acyl group or a glycidyloxy group, a hydrogen atom contained in an aromatic hydrocarbon group can be replaced by a halogen atom, a hydroxy group or a C1 to C12 alkoxy group, or $R^{b4}$ and $R^{b5}$ can be bonded together with a sulfur atom bonded thereto to form a sulfur-containing ring, a methylene group contained in the ring can be replaced by an oxygen atom, a —SO— or a carbonyl group;

$R^{b7}$ and $R^{b8}$ in each occurrence independently represent a hydroxy group, a C1 to C12 aliphatic hydrocarbon group or a C1 to C12 alkoxy group, m2 and n2 independently represent an integer of 0 to 5;

$R^{b9}$ and $R^{b10}$ each independently represent a C1 to C36 aliphatic hydrocarbon group or a C3 to C36 alicyclic hydrocarbon group, or $R^{b9}$ and $R^{b10}$ can be bonded together with a sulfur atom bonded thereto to form a sulfur-containing ring, and a methylene group contained in the ring can be replaced by an oxygen atom, a —SO— or a carbonyl group;

$T^{b11}$ represents a hydrogen atom, a C1 to C36 aliphatic hydrocarbon group, a C3 to C36 alicyclic hydrocarbon group or a C6 to C18 aromatic hydrocarbon group;

$R^{b12}$ represents a C1 to C12 aliphatic hydrocarbon group, a C3 to C18 alicyclic hydrocarbon group and a C6 to C18 aromatic hydrocarbon group, a hydrogen atom contained in an aliphatic hydrocarbon group can be replaced by a C6 to C18 aromatic hydrocarbon group, and a hydrogen atom contained in an aromatic hydrocarbon group can be replaced by a C1 to C12 alkoxy group or a C1 to C12 alkyl carbonyloxy group;

$R^{b11}$ and $R^{b12}$ can be bonded together with —CH—CO— bonded thereto to form a ring, and a methylene group contained in the ring can be replaced by an oxygen atom, a —SO— or a carbonyl group;

$R^{b13}$, $R^{b14}$, $R^{b15}$, $R^{b16}$, $R^{b17}$ and $R^{b18}$ in each occurrence independently represent a hydroxy group, a C1 to C12 aliphatic hydrocarbon group or a C1 to C12 alkoxy group;

$L^{b31}$ represents —S— or —O—;

o2, p2, s2 and t2 independently represent an integer of 0 to 5;

q2 or r2 independently represent an integer of 0 to 4; and u2 represents an integer of 0 or 1.

Examples of the aliphatic group preferably include methyl, ethyl, n-propyl, isopropyl, n-butyl, sec-butyl, tert-butyl, n-pentyl, n-hexyl, n-octyl and 2-ethylhexyl groups. Among these, the aliphatic hydrocarbon group of $R^{b9}$ to $R^{b12}$ is preferably a C1 to C12 aliphatic hydrocarbon group. Examples of the alicyclic hydrocarbon group preferably include monocyclic groups such as a cycloalkyl group, i.e., cyclopropyl, cyclobutyl, cyclopentyl, cyclohexyl, cycloheptyl, cyclooctyl, cyclodecyl groups; and polycyclic groups such as decahydronaphtyl, adamantyl and norbornyl groups as well as the following groups. * represents a binding position.

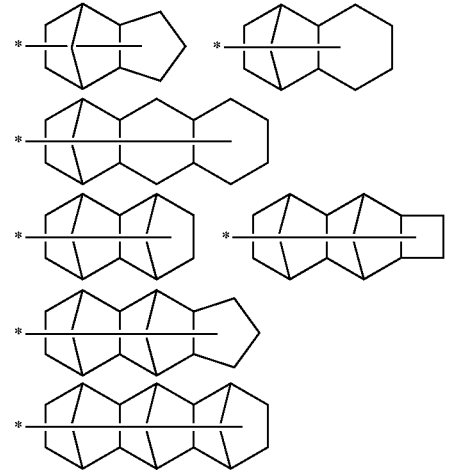

Among these, the alicyclic hydrocarbon group of $R^{b9}$ to $R^{b12}$ is preferably a C3 to C18 alicyclic hydrocarbon group, and more preferably a C4 to C12 alicyclic hydrocarbon group.

Examples of the alicyclic hydrocarbon group where a hydrogen atom can be replaced by an aliphatic hydrocarbon group include methylcyclohexyl, dimethylcyclohexyl, 2-alkyladamantane-2-yl, methylnorbornyl and isobornyl groups. In the alicyclic hydrocarbon group where a hydrogen atom can be replaced by an aliphatic hydrocarbon group, the total number of the carbon atoms of the alicyclic hydrocarbon group and the aliphatic hydrocarbon group is preferably 20 or less.

Examples of the aromatic hydrocarbon group preferably include an aryl group such as phenyl, tolyl, xylyl, cumenyl, mesityl, p-ethylphenyl, p-tert-butylphenyl, p-cyclohexylphenyl, p-adamantylphenyl, biphenyl, naphthyl, phenanthryl, 2,6-diethylphenyl and 2-methyl-6-ethylphenyl groups.

When the aromatic hydrocarbon includes an aliphatic hydrocarbon group or an alicyclic hydrocarbon group, a C1 to C18 aliphatic hydrocarbon group or a C3 to C18 alicyclic hydrocarbon group is preferred.

Examples of the aromatic hydrocarbon group where a hydrogen atom can be replaced by an alkoxy group include a p-methoxyphenyl group.

Examples of the aliphatic hydrocarbon group where a hydrogen atom can be replaced by an aromatic hydrocarbon group include an aralkyl group such as benzyl, phenethyl phenylpropyl, trityl, naphthylmethyl and naphthylethyl groups.

Examples of the alkoxy group include methoxy, ethoxy, propoxy, butoxy, pentyloxy, hexyloxy, heptyloxy, octyloxy, and dodecyloxy groups. Examples of the acyl group include acetyl, propionyl and butyryl groups. Examples of the halogen atom include fluorine, chlorine, bromine and iodine atoms.

Examples of the alkylcarbonyloxy group include methylcarbonyloxy, ethylcarbonyloxy, n-propylcarbonyloxy, isopropylcarbonyloxy, n-butylcarbonyloxy, sec-butylcarbonyloxy, tert-butyl carbonyloxy, pentylcarbonyloxy, hexylcarbonyloxy, octylcarbonyloxy and 2-ethylhexylcarobonyloxy groups.

The sulfur atom-containing ring which is formed by $R^{b4}$ and $R^{b5}$ can be a monocyclic or polycyclic group, which may be an aromatic or non-aromatic group, and which may be a saturated or unsaturated group. The ring is preferably a ring having 3 to 18 carbon atoms, and more preferably a ring having 4 to 13 carbon atoms. Examples of the sulfur atom-containing ring include a 3- to 12-membered ring, preferably a 3- to 7-membered ring, examples thereof include the following rings.

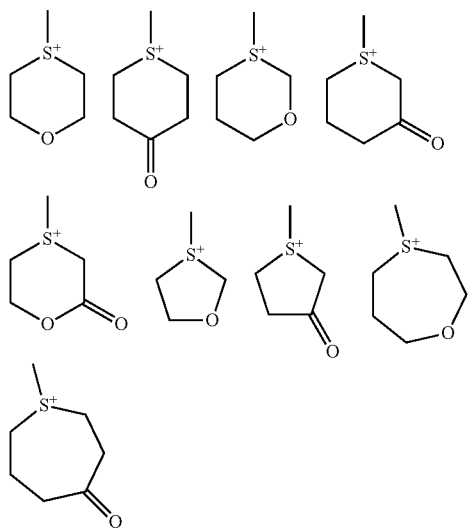

Examples of the ring formed by $R^{b9}$ and $R^{b10}$ include any of monocyclic, polycyclic, aromatic, non-aromatic, saturated and unsaturated rings. The ring may be a 3- to 12-membered ring, preferably a 3- to 7-membered ring. Examples of the ring include thiolane-1-ium ring (tetrahydrothiophenium ring), thian-1-ium ring and 1,4-oxathian-4-ium ring.

Examples of the ring formed by $R^{b11}$ and $R^{b12}$ may be any of monocyclic, polycyclic, aromatic, non-aromatic, saturated and unsaturated rings. The ring may be a 3- to 12-membered ring, preferably a 3- to 7-membered ring. Examples of the ring include oxocycloheptane ring, oxocyclohexane ring, oxonorbornane ring and oxoadamantane ring.

Among the cations represented by formula (b2-1) to formula (b2-4), the cation represented by formula (b2-1) is preferred.

Examples of the cation represented by formula (b2-1) include the following ones.

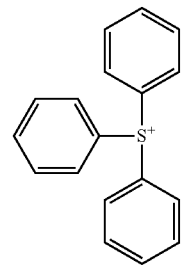

(b2-c-1)

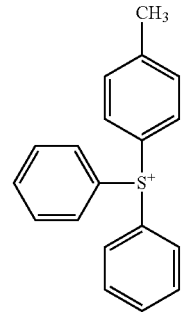

(b2-c-2)

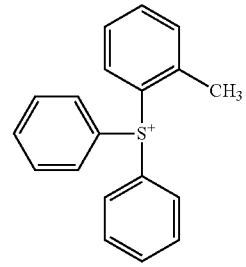

(b2-c-3)

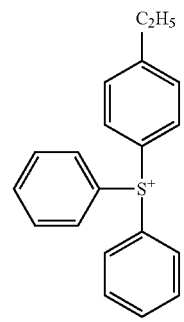

(b2-c-4)

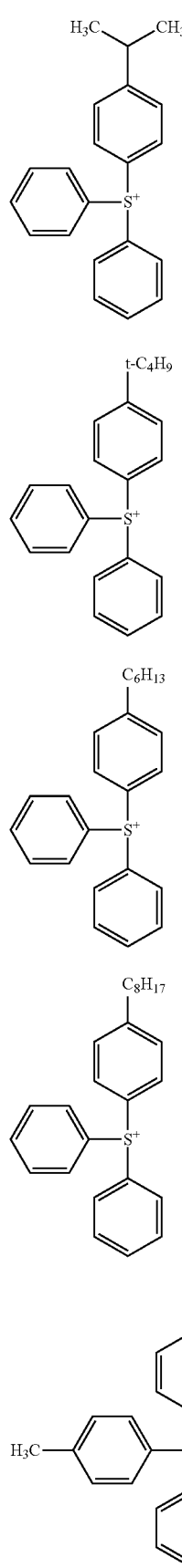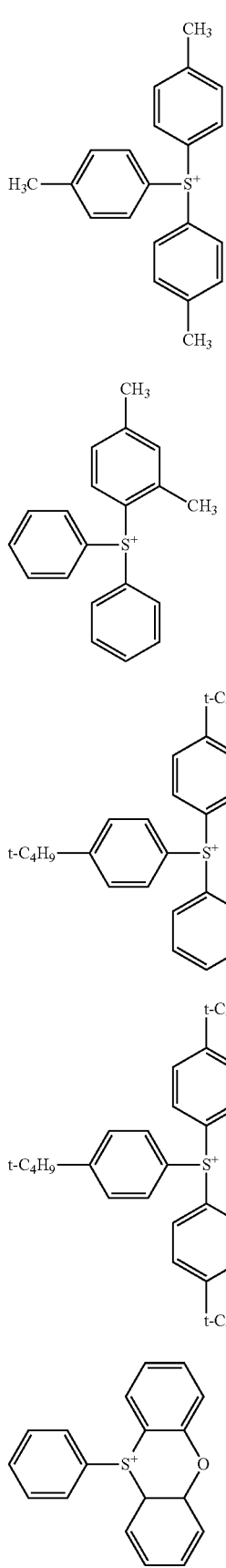

(b2-c-15)
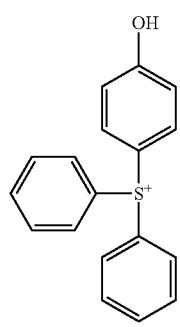
(b2-c-16)
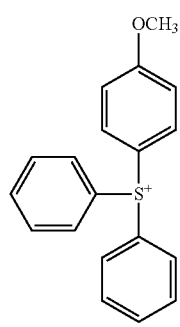
(b2-c-17)
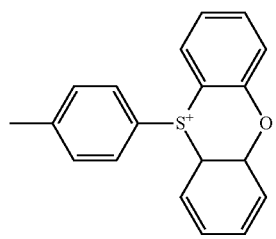
(b2-c-18)
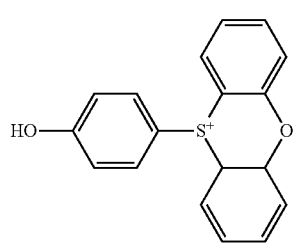
(b2-c-19)
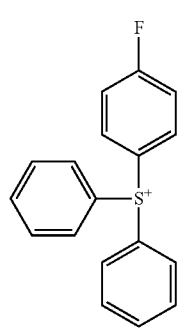
(b2-c-20)
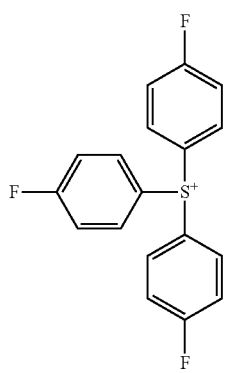
(b2-c-21)
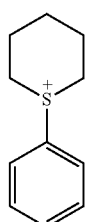
(b2-c-22)
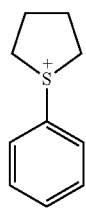
(b2-c-23)
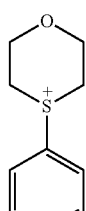
(b2-c-24)
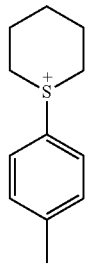
(b2-c-25)
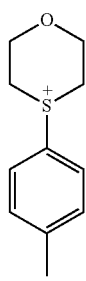

(b2-c-26)
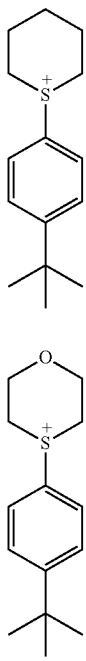
(b2-c-27)
(b2-c-33)
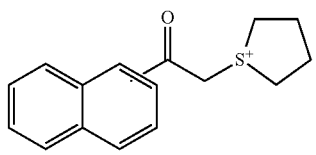
(b2-c-34)
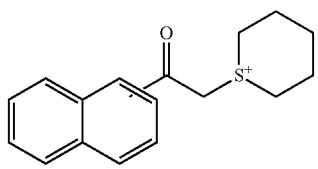
Examples of the cation represented by formula (b2-4) include the following ones.
Examples of the cation represented by formula (b2-2) include the following ones.
(b2-c-28)
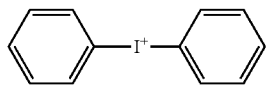
(b2-c-29)
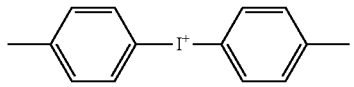
(b2-c-30)
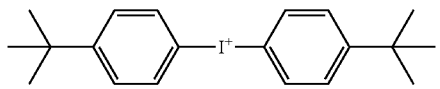
Examples of the cation represented by formula (b2-3) include the following ones.
(b2-c-31)
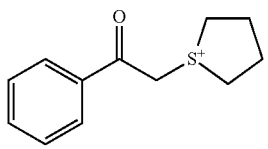
(b2-c-32)
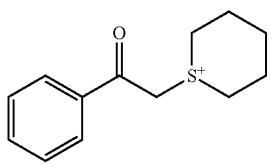
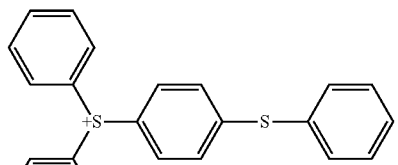
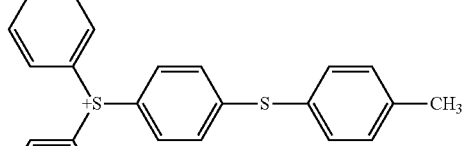
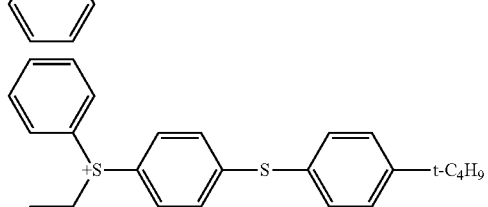
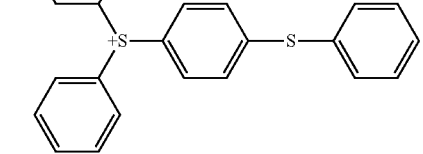

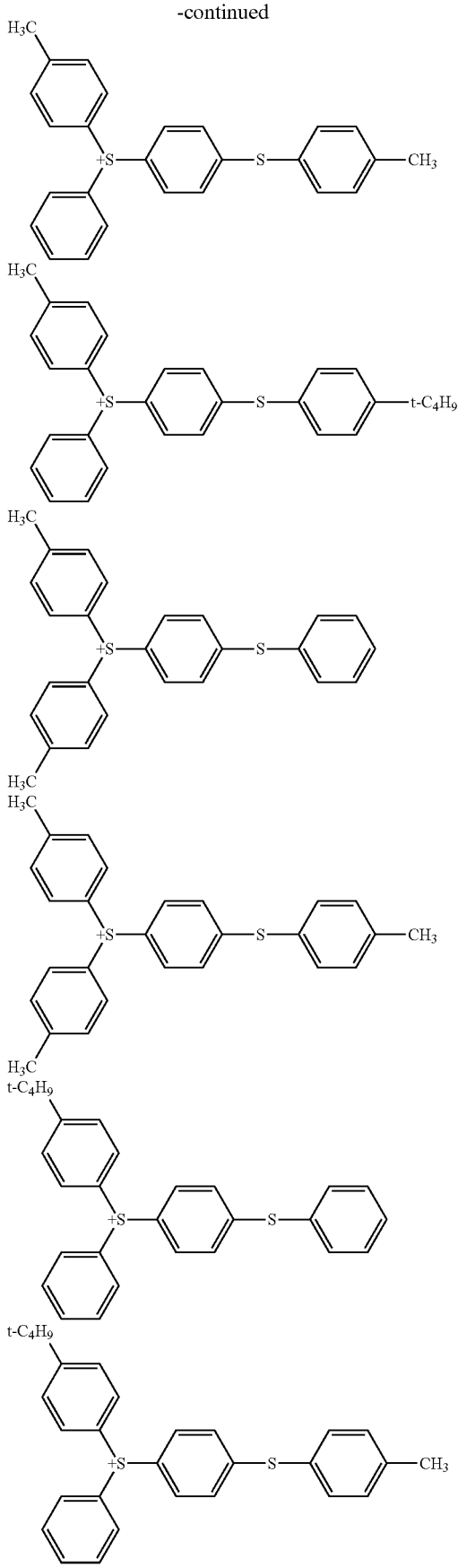
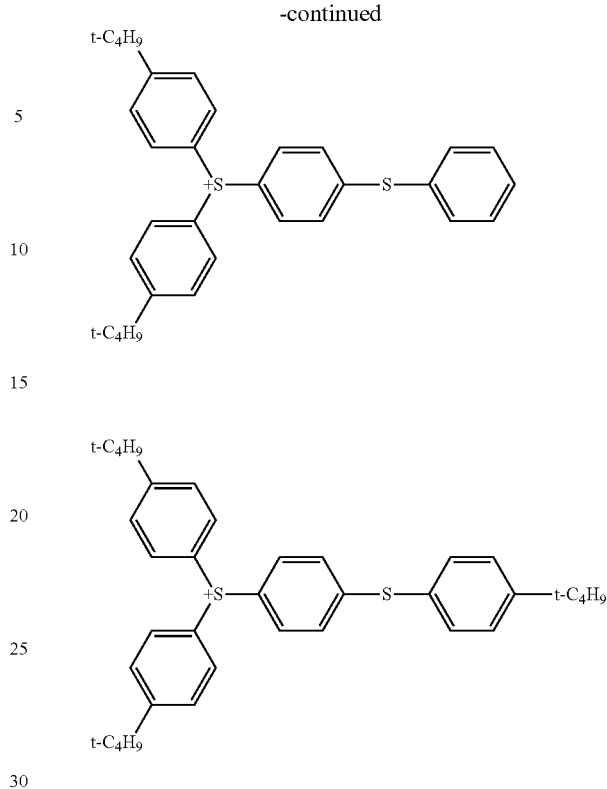

The acid generator (B) is generally a compound which consists of the above sulfonate anion with an organic cation. The above sulfonic acid anion and the organic cation may optionally be combined. Preferred combination is a combination of any of the anion represented by the formula (B1a-1) to the formula (B1a-3), the formula (B1a-7) to the formula (B1a-16), the formula (B1a-18), the formula (B1a-19) and the formula (B1a-22) to the formula (B1a-30) with the cation represented by the formula (b2-1) or the formula (b2-3).

Examples of preferred acid generators (B1) include those represented by formulae (B1-1) to (B1-48). Among them, the acid generators (B1) represented by formulae (B1-1), (B1-3), (B1-5), (B1-7), (B1-11), (B1-14), (B1-20), (B1-21), (B1-22), (B1-23), (B1-26), (B1-29), (B1-31) and (B1-40) to (B1-48), which contain an arylsulfonium cation, are preferred.

(B1-1)

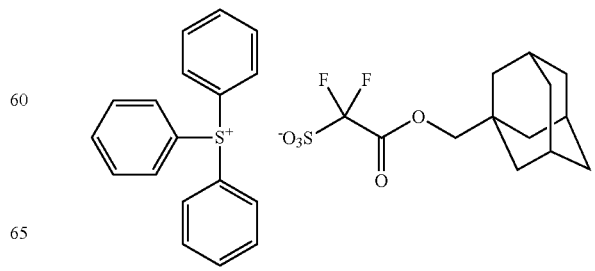

(B1-2)
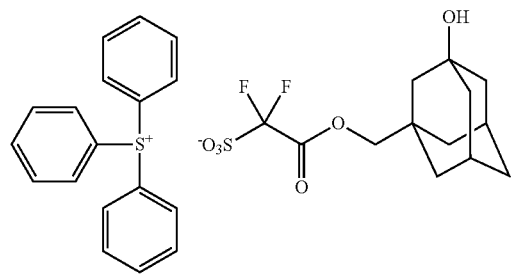
(B1-3)
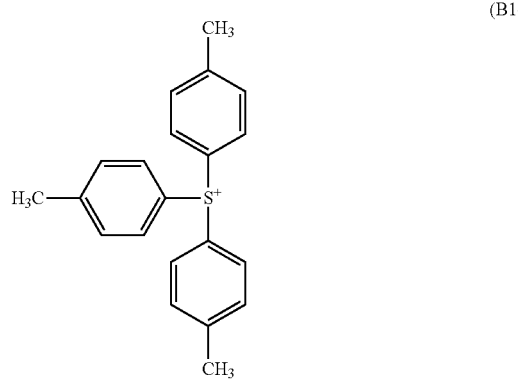
(B1-4)
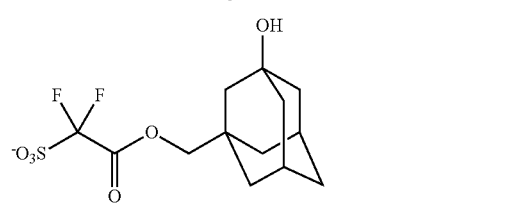
(B1-6)
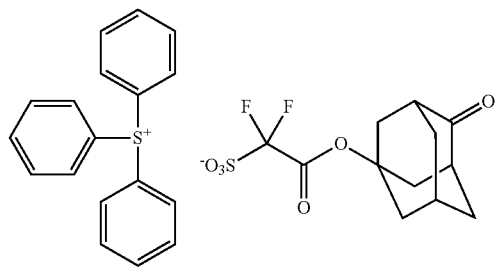
(B1-7)
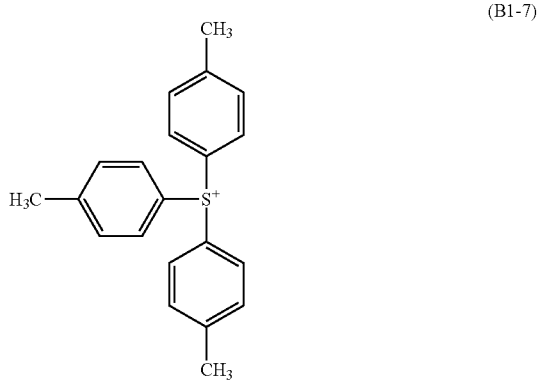
(B1-8)
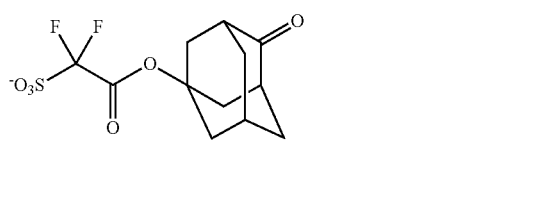
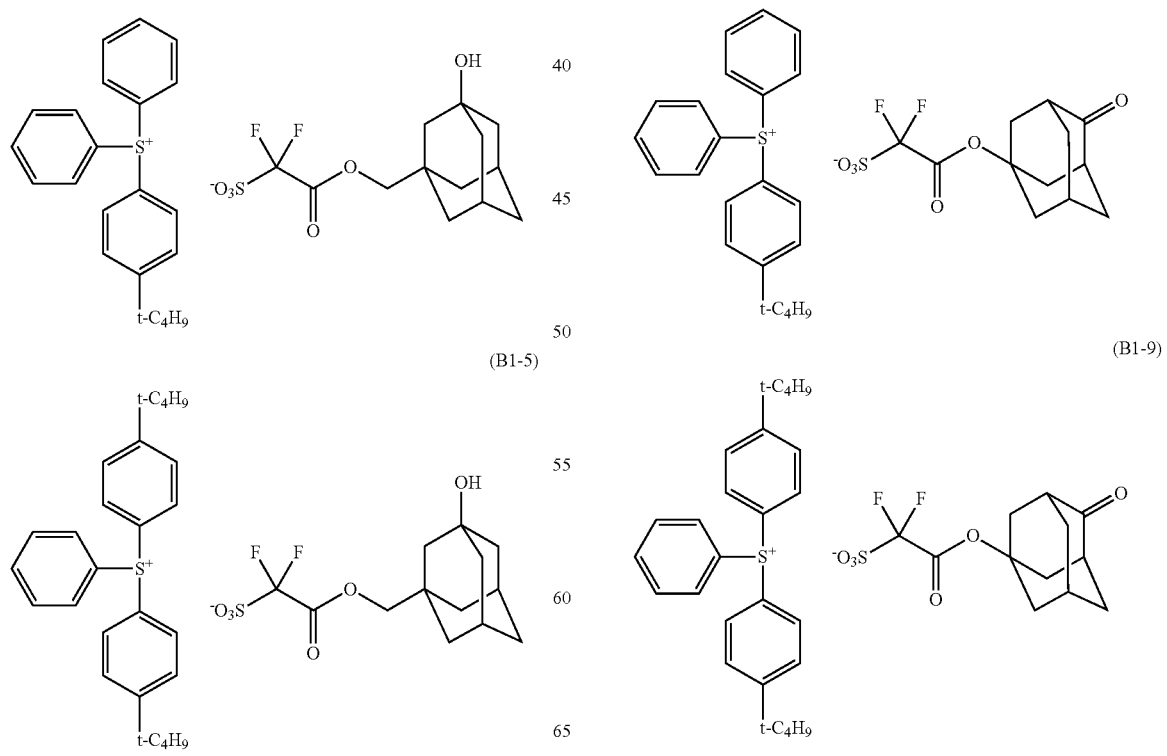

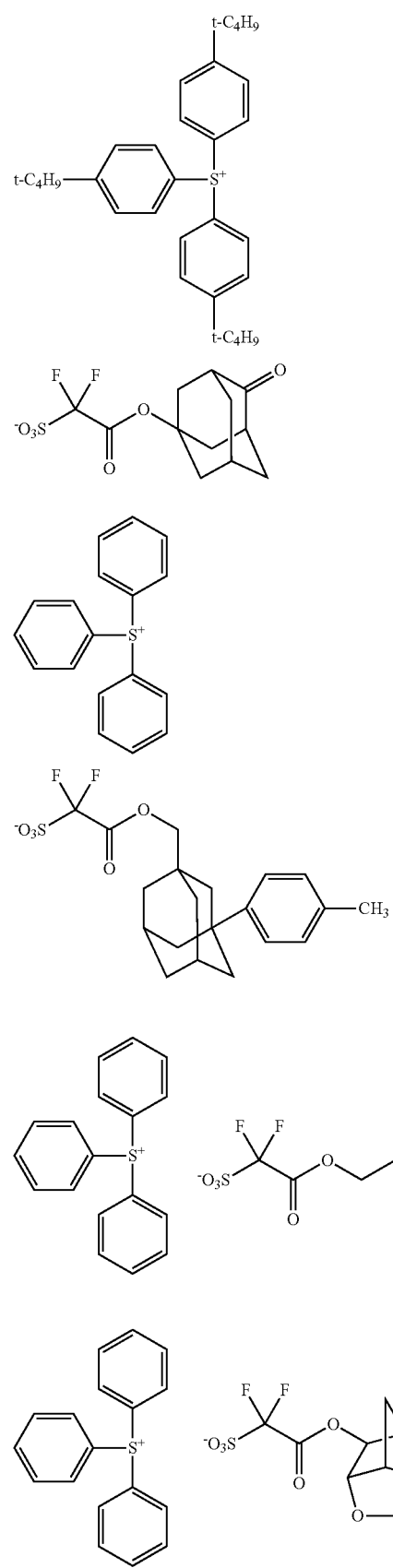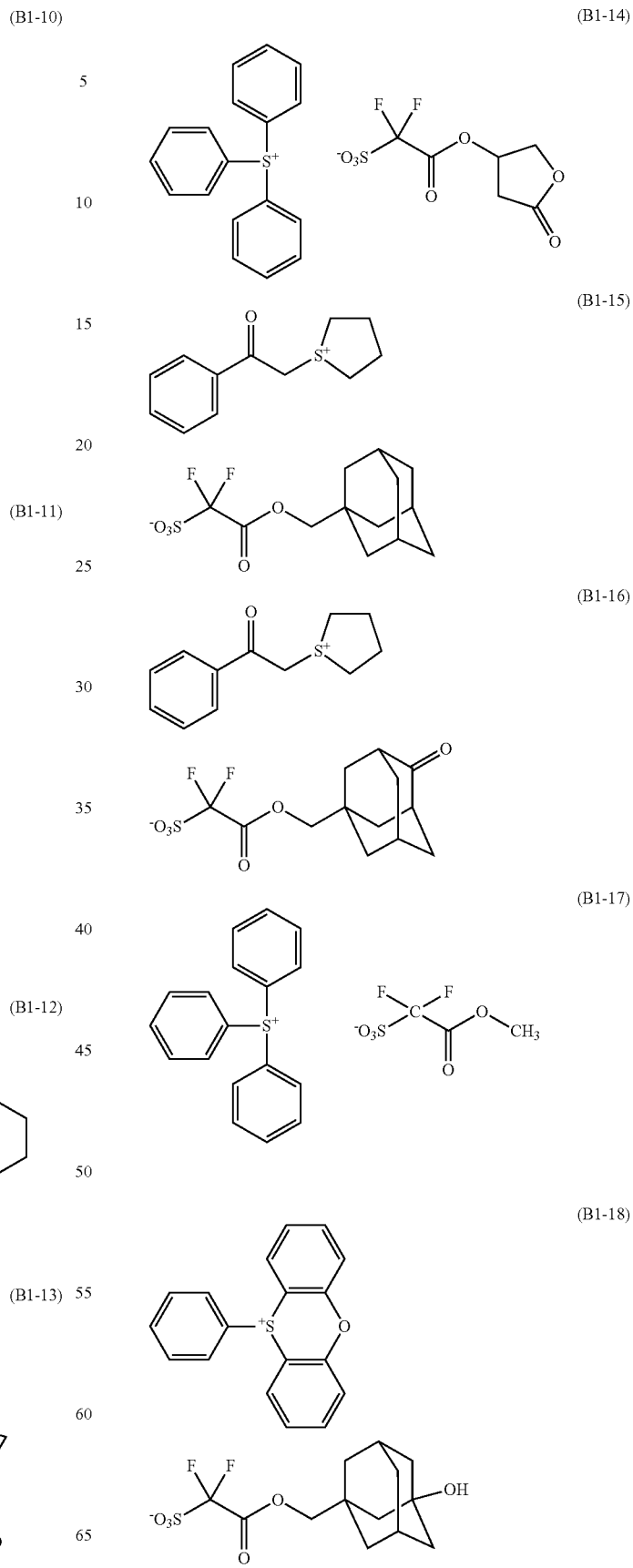

(B1-19)
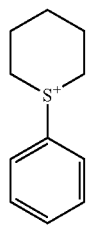 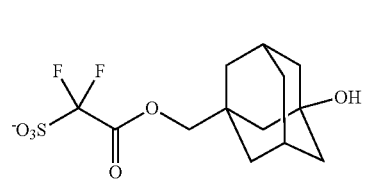
(B1-20)
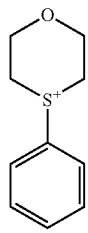 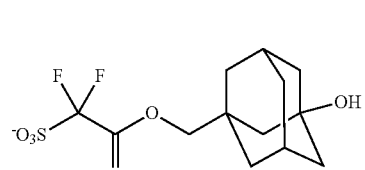
(B1-21)
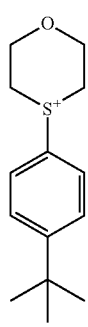 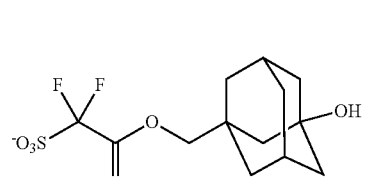
(B1-22)
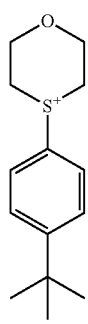 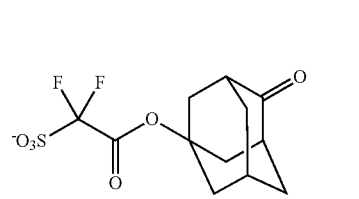
(B1-23)
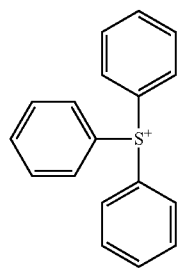
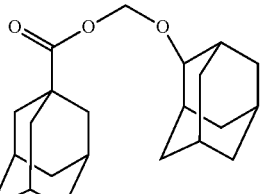
(B1-24)
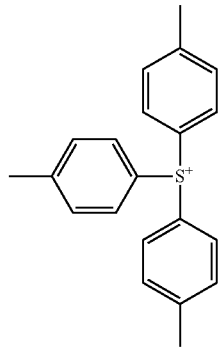
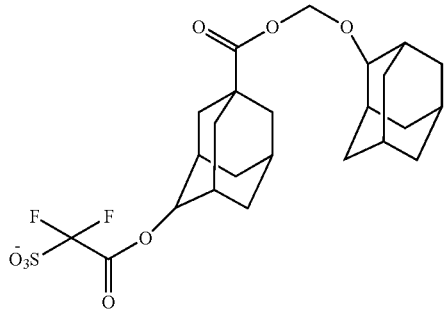
(B1-25)
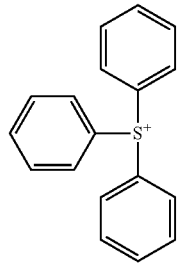
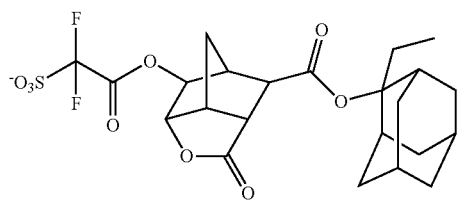

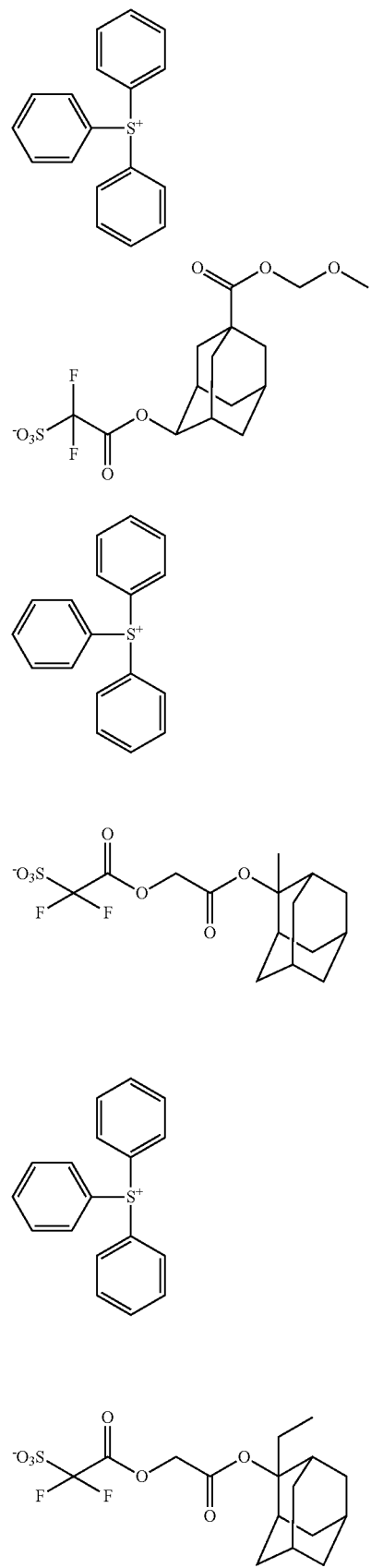

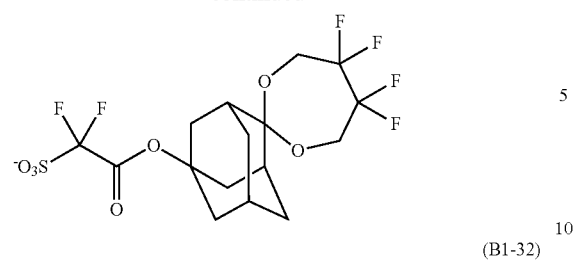
(B1-32)
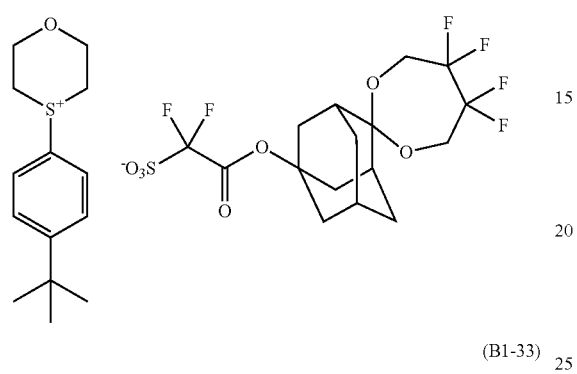
(B1-33)
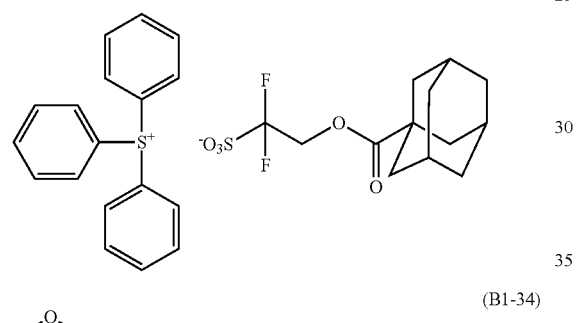
(B1-34)
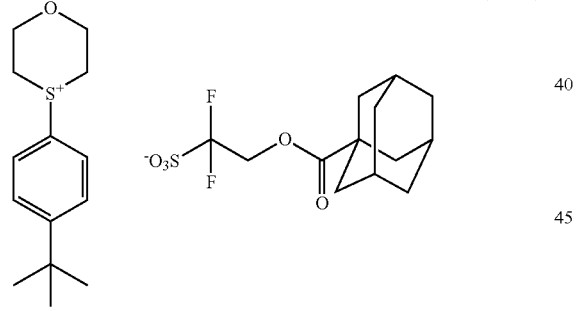
(B1-35)
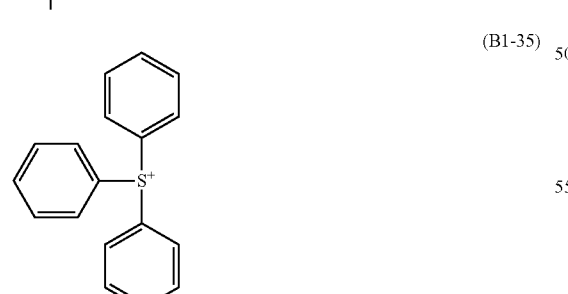
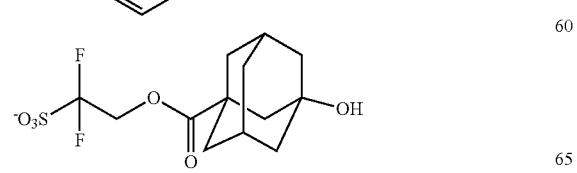
(B1-36)
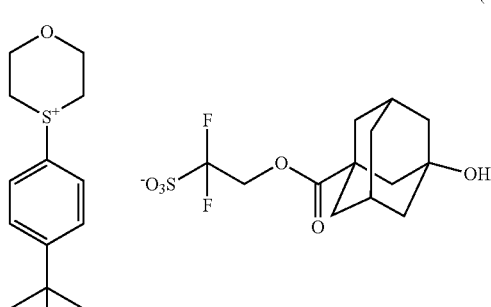
(B1-37)
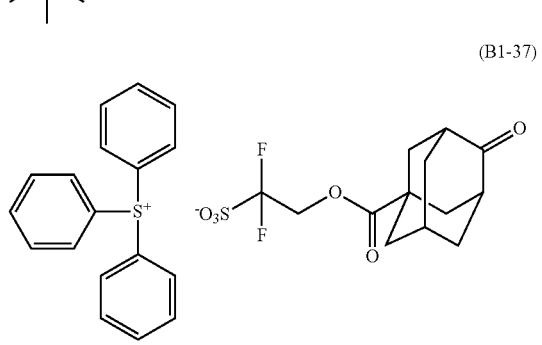
(B1-38)
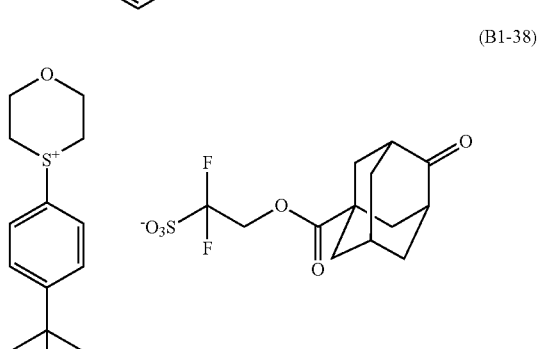
(B1-39)
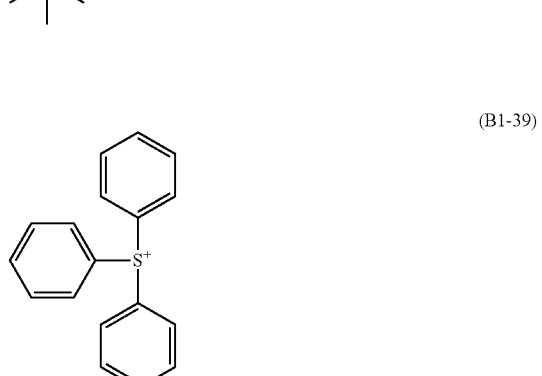
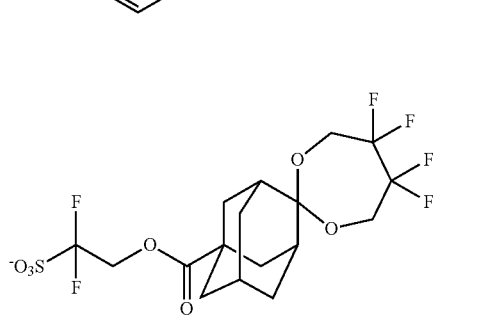

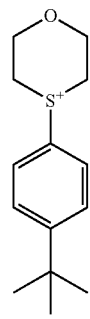
(B1-40)
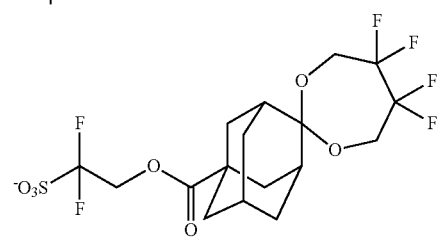
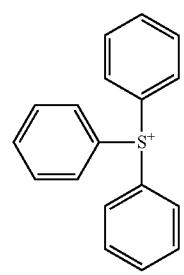
(B1-41)
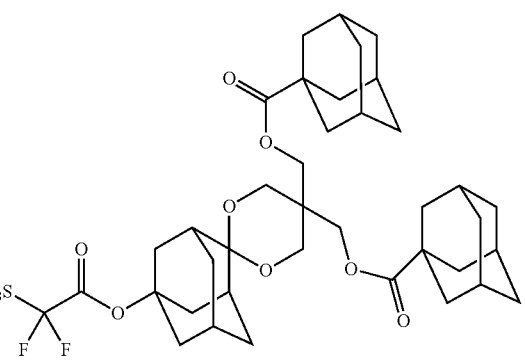
(B1-42)
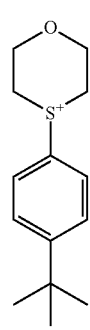
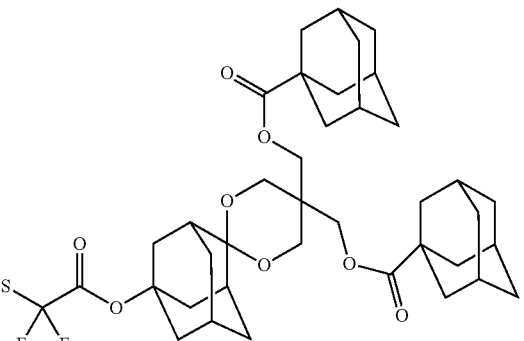
(B1-43)
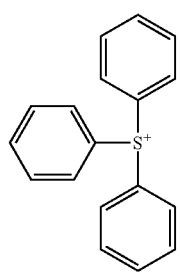
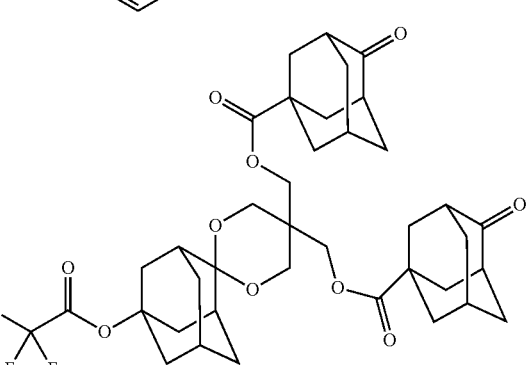
(B1-44)
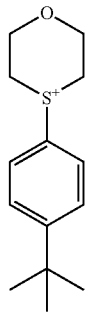
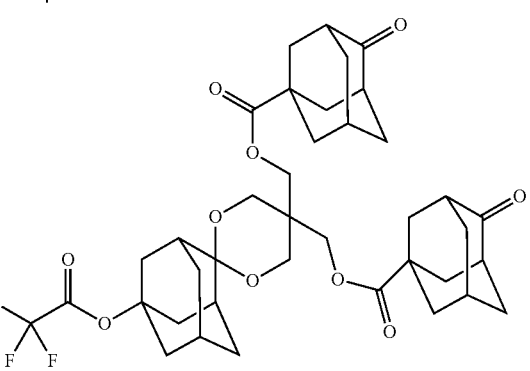

(B1-45)

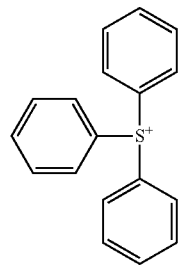

(B1-46)

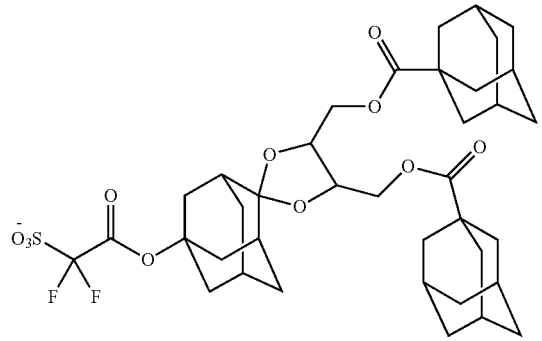

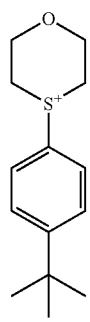

(B1-47)

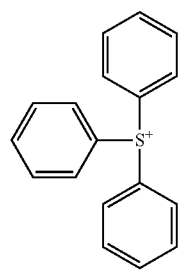

(B1-48)

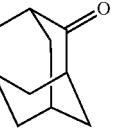

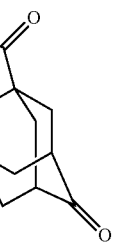

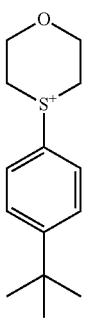

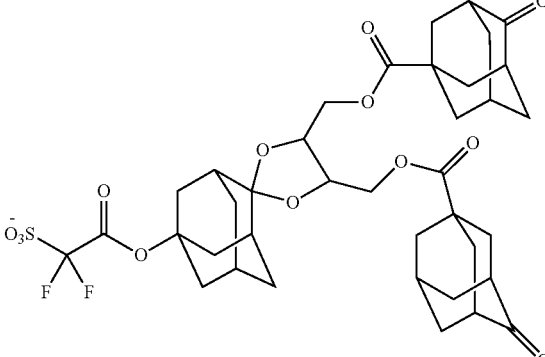

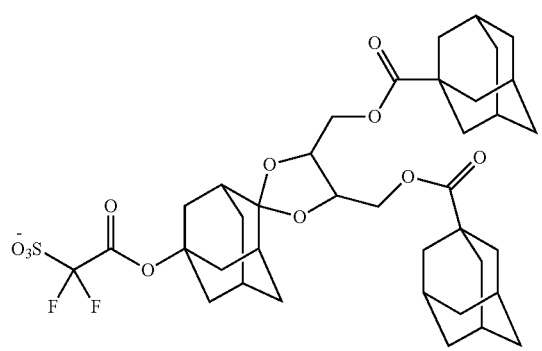

In the photoresist composition of the disclosure, the proportion of the acid generator (B) is preferably 1 parts by mass or more and more preferably 3 parts by mass or more, and preferably 30 parts by mass or less and more preferably 25 parts by mass or less with respect to 100 parts by mass of Resin (A).

In the photoresist composition of the disclosure, the acid generator (B) can be used as one kind of the salt or as two or more kinds of them.

<Solvent (E)>

The proportion of a solvent (E) is 90% by mass or more, preferably 92% by mass or more, and more preferably 94% by mass or more, and also preferably 99% by mass or less and more preferably 99.9% by mass or less of the total amount of the photoresist composition. The proportion of the solvent (E) can be measured with a known analytical method such as, for example, liquid chromatography and gas chromatography.

Examples of the solvent (E) include glycol ether esters such as ethylcellosolve acetate, methylcellosolve acetate and propyleneglycolmonomethylether acetate; glycol ethers such as propyleneglycolmonomethylether; esters such as ethyl lactate, butyl acetate, amyl acetate and ethyl pyruvate;

ketones such as acetone, methyl isobutyl ketone, 2-heptanone and cyclohexanone; and cyclic esters such as γ-butyrolactone. These solvents may be used as a single solvent or as a mixture of two or more solvents.

<Quencher>

The photoresist composition of the present disclosure can further contain a quencher such as a basic nitrogen-containing organic compound or a salt which generates an acid lower in acidity than an acid generated from the acid generators and which is sometimes referred to as "weak acid salt".

Examples of the basic nitrogen-containing organic compound include an amine and ammonium salts. The amine can be an aliphatic amine or an aromatic amine. The aliphatic amine includes any of a primary amine, secondary amine and tertiary amine.

Specific examples of the amine include 1-naphtylamine, 2-naphtylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane, 4,4'-diamino-3,3'-diethyldiphenylmethane, 2,2'-methylenebisaniline, imidazole, 4-methylimidazole, pyridine, 4-methylpyridine, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine and bipyridine. Among them, diisopropylaniline is preferred, particularly 2,6-diisopropylaniline is more preferred.

Specific examples of the ammonium salt include tetramethylammonium hydroxide, tetraisopropylammonium hydroxide, tetrabutylammonium hydroxide, tetrahexylanuonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

As to a weak acid salt, the "acidity" for a weak acid salt can be represented by acid dissociation constant, pKa, of an acid generated from the weak acid salt. Examples of the weak acid salt include a salt generating an acid of pKa represents generally more than −3, preferably −1 to 7, and more preferably 0 to 5.

Specific examples of the weak acid salt include the following salts, the weak acid inner salt of formula (D), and salts as disclosed in JP2012-229206A1, JP2012-6908A1, JP2012-72109A1, JP2011-39502A1 and JP2011-191745A1, preferably the salt of formula (D).

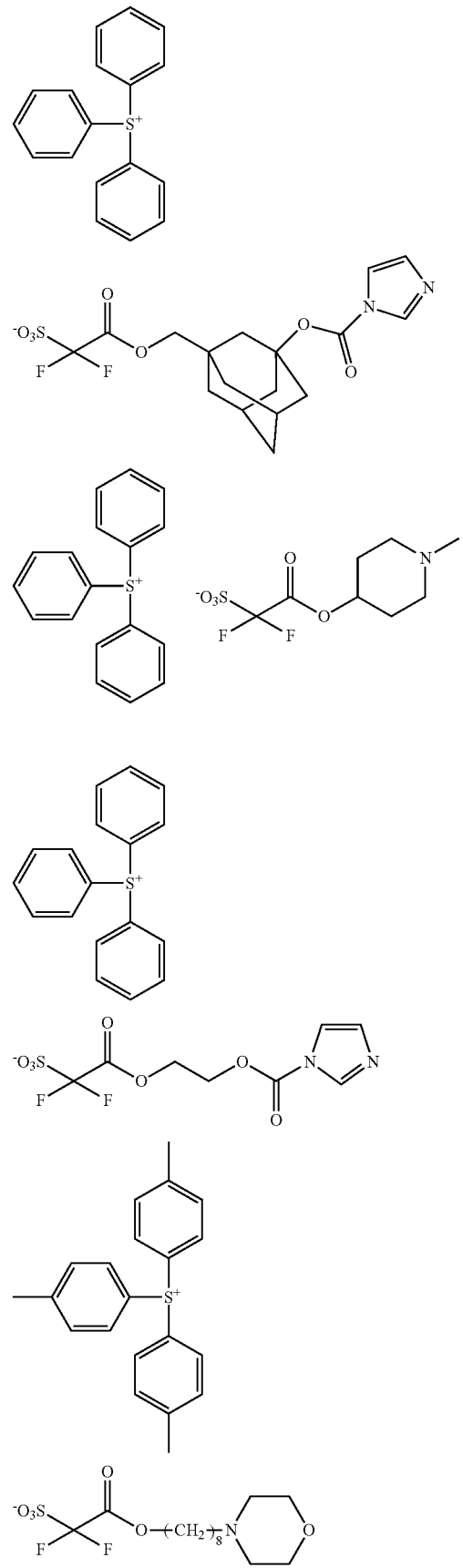

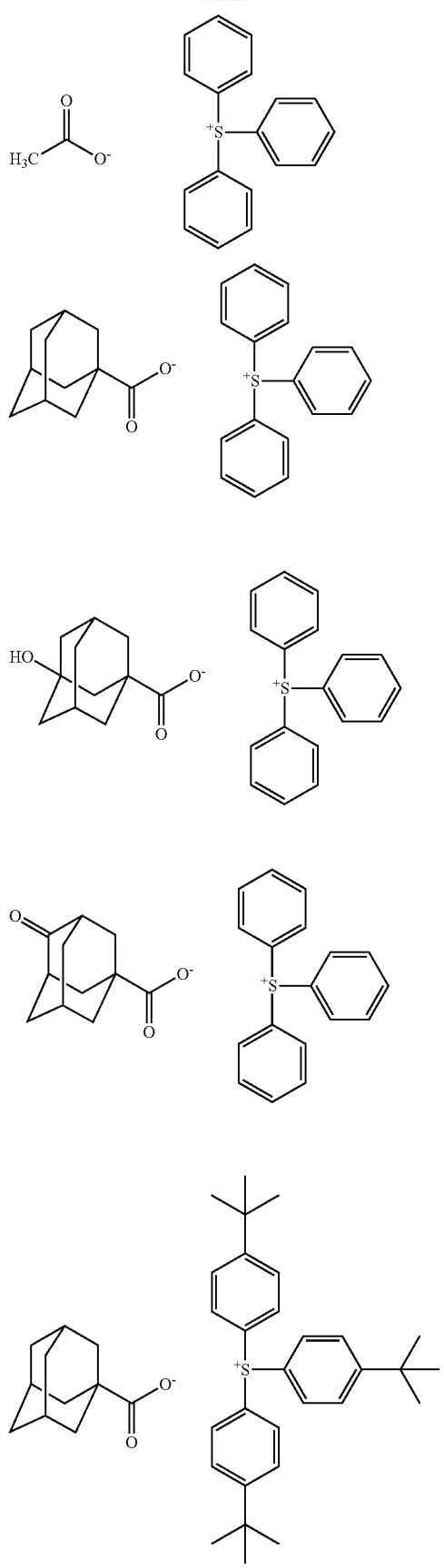
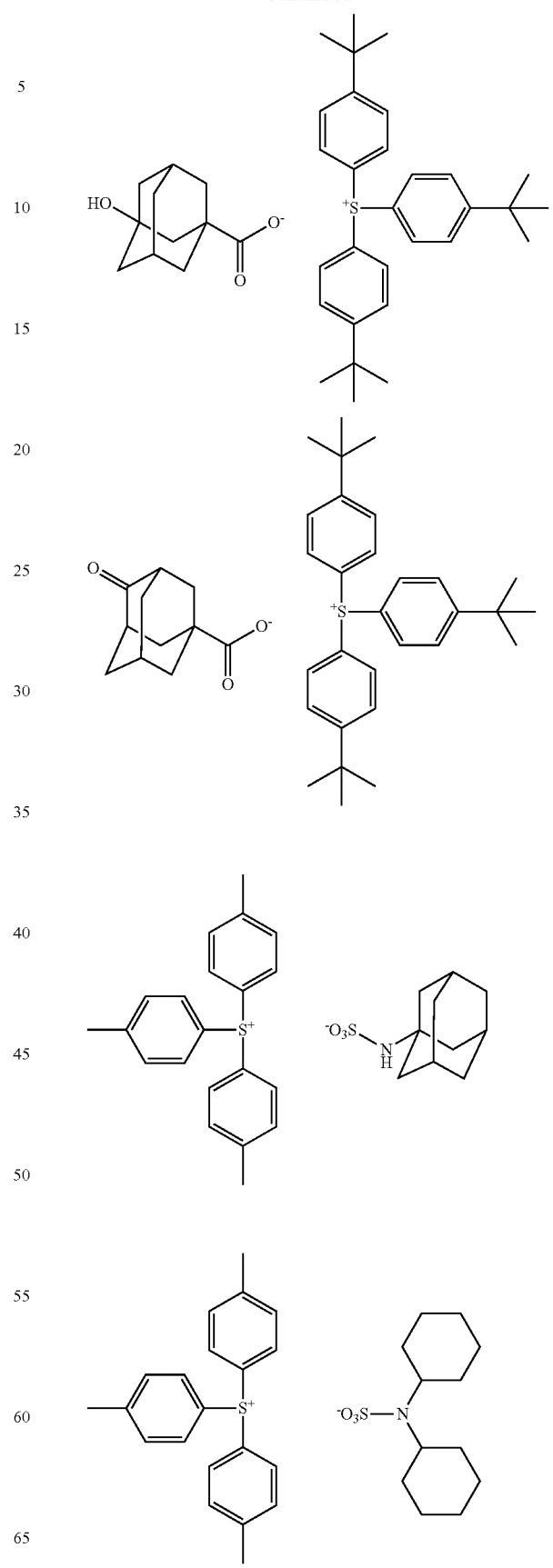

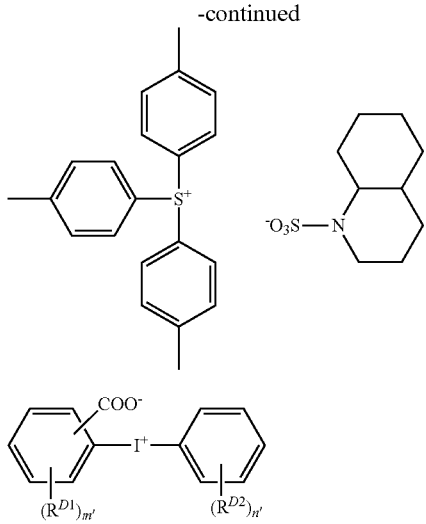

wherein $R^{D1}$ and $R^{D2}$ in each occurrence independently represent a C1 to C12 hydrocarbon group, a C1 to C6 alkoxy group, a C2 to C7 acyl group, a C2 to C7 acyloxy group, a C2 to C7 alkoxycarbonyl group, a nitro group or a halogen atom, and m' and n' independently represent an integer of 0 to 4.

The hydrocarbon group for $R^{D1}$ and $R^{D2}$ includes any of an aliphatic hydrocarbon group, an alicyclic hydrocarbon group, an aromatic hydrocarbon group and a combination thereof.

Examples of the aliphatic hydrocarbon group include an alkyl group such as methyl, ethyl, propyl, isopropyl, butyl, sec-butyl, tert-butyl, pentyl, hexyl and nonyl groups.

The alicyclic hydrocarbon group is any one of monocyclic or polycyclic hydrocarbon group, and saturated or unsaturated hydrocarbon group. Examples thereof include a cycloalkyl group such as cyclopropyl, cyclobutyl, cyclopentyl, cyclohexyl, cyclononyl and cyclododecyl groups; adamantyl and norbornyl groups. The alicyclic hydrocarbon group is preferably saturated hydrocarbon group.

Examples of the aromatic hydrocarbon group include an aryl group such as phenyl, 1-naphthyl, 2-naphthyl, 2-methylphenyl, 3-methylphenyl, 4-methylphenyl, 4-ethylphenyl, 4-propylphenyl, 4-isopropylphenyl, 4-butylphenyl, 4-tert-butylphenyl, 4-hexylphenyl, 4-cyclohexylphenyl, anthryl, p-adamantylphenyl, tolyl, xylyl, cumenyl, mesityl, biphenyl, phenanthryl, 2,6-diethylphenyl and 2-methyl-6-ethylphenyl groups. Examples of the combination thereof include an alkyl-cycloalkyl group, a cycloalkyl-alkyl group, an aralkyl group such as phenylmethyl, 1-phenylethyl, 2-phenylethyl, 1-phenyl-1-propyl, 1-phenyl-2-propyl, 2-phenyl-2-propyl, 3-phenyl-1-propyl, 4-phenyl-1-butyl, 5-phenyl-1-pentyl and 6-phenyl-1-hexyl groups.

Examples of the alkoxy group include methoxy and ethoxy groups.

Examples of the acyl group include acetyl, propanonyl, benzoyl and cyclohexanecarbonyl groups.

Examples of the acyloxy group include a group in which oxy group (—O—) bonds to an acyl group.

Examples of the alkoxycarbonyl group include a group in which the carbonyl group (—CO—) bonds to the alkoxy group.

Examples of the halogen atom include a chlorine atom, a fluorine atom and bromine atom.

In the formula (D), $R^{D1}$ and $R^{D2}$ in each occurrence independently preferably represent a C1 to C8 alkyl group, a C3 to C10 cycloalkyl group, a C1 to C6 alkoxy group, a C2 to C4 acyl group, a C2 to C4 acyloxy group, a C2 to C4 alkoxycarbonyl group, a nitro group or a halogen atom.

m' and n' independently preferably represent an integer of 0 to 3, more preferably an integer of 0 to 2, and more preferably 0.

The proportion of the quencher is preferably 0.01% by mass to 5% by mass, more preferably 0.01% by mass to 4% by mass, still more preferably 0.01% by mass to 3% by mass, with respect to the total amount of solid components of the photoresist composition.

<Other Ingredients>

The photoresist composition can also include another ingredient (which is sometimes referred to as "other ingredient (F)"). The other ingredient (F) includes various additives such as sensitizers, dissolution inhibitors, surfactants, stabilizers, and dyes, as needed.

<Preparing the Photoresist Composition>

The photoresist composition of the disclosure can be prepared by mixing a resin (A) and an acid generator (B) as well as Resin (X), a quencher such as a weak acid inner salt (D), a solvent (E) and another ingredient (F), as needed. There is no particular limitation on the order of mixing. The mixing can be performed in an arbitrary order. The temperature of mixing may be adjusted to an appropriate temperature within the range of 10 to 40° C., depending on the kinds of the resin and solubility in the solvent (E) of the resin. The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present photoresist compositions can be prepared by filtering the mixture through a filter having about 0.003 to 0.2 µm of its pore diameter.

<Process for Producing a Photoresist Pattern>

The process for producing a photoresist pattern of the present disclosure includes the steps of:

(1) applying a photoresist composition of the present disclosure onto a substrate;

(2) drying the applied composition to form a composition layer;

(3) exposing the composition layer;

(4) heating the exposed composition layer, and (5) developing the heated composition layer with butyl acetate.

Applying the photoresist composition onto a substrate can generally be carried out through use of a photoresist application device, such as a spin coater known in the field of semiconductor microfabrication technique. Examples of the substrate include inorganic substrates such as silicon, SiN, $SiO_2$ or SiN, and Spin-on glass [SOG] or other coated inorganic substrates. Substrate which can be used include washed one, and one on which an organic antireflection film formed before application of the photoresist composition. A commercially available antireflection composition can be used for the organic antireflection film.

The solvent evaporates from the photoresist composition to form a composition layer. Drying the composition on a substrate can be carried out using a heating device such as a hotplate (so-called "prebake"), a decompression device, or a combination thereof. The temperature is preferably within the range of 50 to 200° C. The time for heating is preferably 10 to 180 seconds, more preferably 30 to 120 seconds. The pressure is preferably within the range of 1 to $1.0 \times 10^5$ Pa.

The thickness of the composition layer is usually 20 to 1000 nm, preferably 50 to 400 nm. The thickness can be adjusted by changing conditions for a photoresist application device.

The composition layer thus obtained is generally exposed using an exposure apparatus or a liquid immersion exposure apparatus. The exposure is generally carried out using with various types of exposure light source, such as irradiation with ultraviolet lasers, i.e., KrF excimer laser (wavelength: 248 nm), ArF excimer laser (wavelength: 193 nm), $F_2$ excimer laser (wavelength: 157 nm), irradiation with harmonic laser light of far-ultraviolet or vacuum ultra violet wavelength-converted laser light from a solid-state laser source (YAG or semiconductor laser or the like), or irradiation with electron beam, EUV or the like. The composition layer is preferably exposed using a liquid immersion exposure apparatus with ArF excimer laser. In the specification, such exposure to radiation is sometimes referred to be collectively called as exposure. The exposure is generally carried out in the manner of immersion exposure, e.g., in such a way that liquid medium is placed in contact with a composition layer. When immersion exposure is conducted, the surface of composition layer can optionally be washed with an aqueous chemical before and/or after the exposure.

The liquid immersion medium for liquid immersion exposure is preferably a liquid which can maintain transparent for exposing with ArF excimer laser and whose temperature coefficient of the refractive index is so as small to minimize the distortion of the optics image reflected on the composition layer. Preferred examples of such liquid immersion medium include water, specifically ultrapure water, owing to its availability.

When water is used for the liquid immersion medium, a small amount of an additive capable of decreasing surface tension of the water and increasing surface activity of the water can be added to the water.

As such additive, preferred is an additive which does not dissolve a composition layer and which has substantially no effect on optics coat at the undersurface of a lens element which the exposure apparatus has. The exposure amount or quantity can be controlled depending on the photoresist composition to be used, the photoresist pattern to be produced or the exposure source for the production. The exposure amount or quantity is preferably 5 to 50 $mJ/cm^2$.

Exposure can be conducted twice or more times. If exposure is conducted twice or more times, each step can be conducted using the same procedure and exposure source as those of another time or a different procedure and exposure source from those of another time.

After exposure, the composition layer is subjected to a heat treatment (so-called "post-exposure bake"). The heat treatment can be carried out using a heating device such as a hotplate. The heating temperature is generally in the range of 50 to 200° C., preferably in the range of 70 to 150° C. Temperature for heating is generally 5 to 60° C. The time for developing is preferably 10 to 180 seconds, more preferably 30 to 120 seconds.

The developing of the baked composition film is usually carried out with a developer using a development apparatus.

The development for obtaining a photoresist pattern is usually carried out with a developer containing butyl acetate. The developer can further include a solvent other than butyl acetate.

The solvent other than butyl acetate can be any one of various organic solvents used in the art, examples of which include ketone solvents such as 2-hexanone, 2-heptanone; glycol ether ester solvents such as propyleneglycolmonomethylether acetate; ester solvents; glycol ether solvents such as the propyleneglycolmonomethylether; amide solvents such as N,N-dimethylacetamide; aromatic hydrocarbon solvents such as anisole.

In the developer containing butyl acetate, the amount of butyl acetate is preferably 50% by mass to 100% by mass of the developer. The developer still more preferably consists essentially of butyl acetate.

Developers containing an organic solvent can contain a surfactant.

The surfactant is not limited to a specific one, and examples of that include an ionic surfactant or a nonionic surfactant, specifically a fluorine-based surfactant and a silicon-based surfactant.

Developing can be conducted in the manner of dipping method, paddle method, spray method and dynamic dispensing method.

Examples of developing procedure include dipping method in which a post-exposure baked composition layer together with the substrate having the layer is immersed in a developing solution with which a vessel is filled for a certain period of time;

paddle method in which developing is conducted through heaping up and keeping a developer on a post-exposure baked composition layer by surface tension for a certain period of time;

spray method in which developing is conducted by spraying a developer to a post-exposure baked composition layer on its surface tension; and dynamic dispensing method in which dispensing a developer is conducted while adjusting a dispensing nozzle to a certain speed and rotating the substrate on which a post-exposure baked composition layer form.

For the process of the present disclosure, the paddle method and the dynamic dispensing method are preferred, and the dynamic dispensing method is more preferred.

Developing temperature is preferably in the range of 5 to 60° C., more preferably in the range of 10 to 40° C. The time for developing is preferably 5 to 300 seconds, more preferably 5 to 90 seconds. For the dynamic dispensing method, the time for developing is preferably 5 to 30 seconds. For the paddle method, the time for developing is preferably 20 to 60 seconds.

After development, the photoresist pattern formed is preferably washed with a rinse agent. Such rinse agent is not limited as long as it is incapable of dissolving a photoresist pattern. Examples of the agent include solvents which contain organic solvents other than the above-mentioned developers, such as alcohol agents or ester agents. After washing, the residual rinse agent remained on the substrate or photoresist film is preferably removed therefrom.

In the process of the disclosure, the film retention ratio of the photoresist pattern is not less than 65%.

Here, the film retention ratio represents the rate of change of the film thickness between the composition layer and the photoresist film obtained by development. The film thickness is determined at an area undissolved by a developer in the film.

To determine the film retention ratio as to a photoresist composition, a composition film the thickness of which is 85 nm is prepared, the composition film is dried usually at 75 to 130° C., e.g., 90° C. for 30 to 180 seconds, e.g., 60 seconds, exposure is usually conducted with an exposure quantity of 5 to 50 $mJ/cm^2$, e.g., 30 $mJ/cm^2$, post-exposure bake is usually conducted at 75 to 130° C., e.g., 90° C. for 30 to 180 seconds, e.g., 60 seconds, and development is usually conducted in the manner of dynamic dispensing method using a developer composed of butyl acetate, at a developing temperature of 23° C. for a developing time within a range of 10 to 90 seconds, e.g., 20 seconds. Upon exposure of the composition layer to radiation, an acid is generated from an acid generator, and acid-labile groups in a Resin (A) are eliminated owing to the acid and hydrophilic groups (e.g., hydroxy groups or carboxy groups) are thereby formed, so that the solubility in butyl acetate decreases. As a result, exposed portions decrease in solubility in butyl acetate to remain as composition layers, and unexposed portions are dissolved because of being formed of a resin having high affinity for butyl acetate. Thus, a photoresist pattern is formed.

The film retention ratio can be increased to 65% or more by reducing the proportion of an acid-labile group having a bulky leaving group.

<Application>

The photoresist composition of the present disclosure is useful for excimer laser lithography such as with ArF, KrF, electron beam (EB) exposure lithography or extreme-ultraviolet (EUV) exposure lithography, and is more useful for electron beam (EB) exposure lithography, ArF excimer laser exposure lithography and extreme-ultraviolet (EUV) exposure lithography. The photoresist composition of the present disclosure can be used in semiconductor microfabrication.

EXAMPLES

All percentages and parts expressing the contents or amounts used in the Examples and Comparative Examples are based on mass, unless otherwise specified.

The weight average molecular weight is a value determined by gel permeation chromatography.

Equipment: HLC-8120GPC type (Tosoh Co. Ltd.)
Column: TSK gel Multipore HXL-M×3+guardcolumn (Tosoh Co. Ltd.)
Eluant: tetrahydrofuran
Flow rate: 1.0 mL/min.
Detecting device: RI detector
Column temperature: 40° C.
Injection amount: 100 μL
Standard material for calculating molecular weight: standard polystyrene (Tosoh Co. ltd.)

Structures of compounds were determined by mass spectrometry (Liquid Chromatography: 1100 Type, manufactured by AGILENT TECHNOLOGIES LTD., Mass Spectrometry: LC/MSD Type, manufactured by AGILENT TECHNOLOGIES LTD.).

Synthesis Examples of Resins

The monomers used for Synthesis Examples of the resins are shown below. These monomers are referred to as "monomer (X)" where "(X)" is the symbol of the formula representing the structure of each monomer.

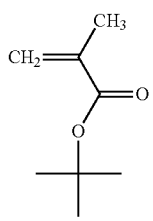

(a1-0-1)

-continued

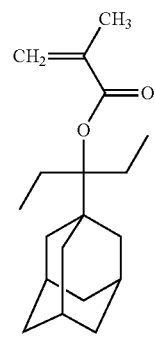

(a1-0-10)

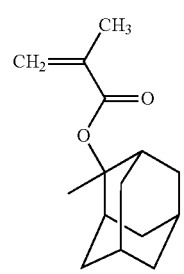

(a1-1-1)

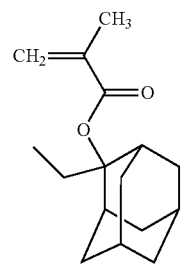

(a1-1-2)

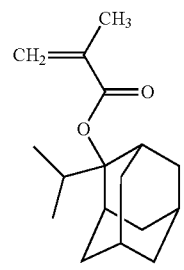

(a1-1-3)

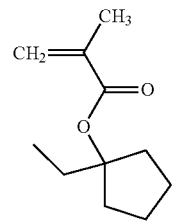

(a1-2-7)

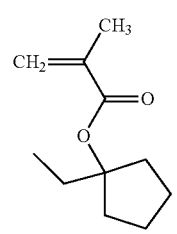

(a1-2-9)

-continued (a1-2-11)
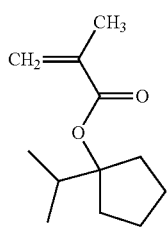

(a2-1-1)
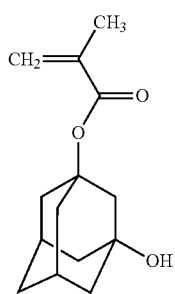

(a2-1-3)
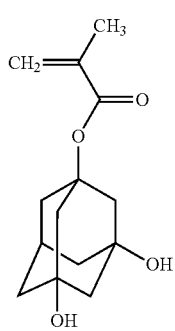

(a3-1-1)
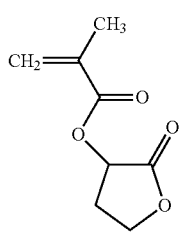

(a3-2-3)
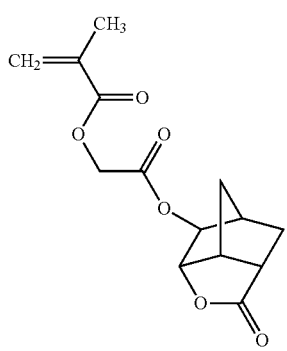

-continued (a3-4-2)
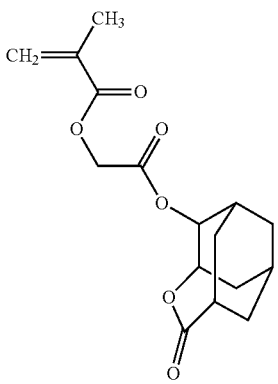

(a4-0-12)
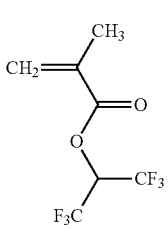

(a5-1-1)
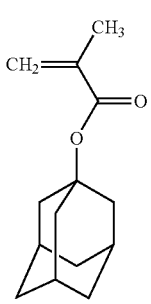

Each of these monomers shows HSP coordinates as listed in Table 1. The coordinates listed therein were determined using HSPiP version 4.1.

TABLE 1

| Monomer | δ d | δ p | δ h |
|---|---|---|---|
| (a1-0-1) | 15.2 | 3.0 | 3.9 |
| (a1-0-10) | 16.5 | 2.1 | 1.7 |
| (a1-1-1) | 16.9 | 3.1 | 2.7 |
| (a1-1-2) | 16.8 | 3.0 | 2.5 |
| (a1-1-3) | 16.7 | 2.6 | 1.9 |
| (a1-2-1) | 16.9 | 3.1 | 3.8 |
| (a1-2-3) | 16.8 | 2.9 | 3.5 |
| (a1-2-7) | 16.7 | 3.0 | 4.0 |
| (a1-2-9) | 16.6 | 2.9 | 3.6 |
| (a1-2-11) | 16.4 | 2.4 | 2.9 |
| (a2-1-1) | 17.5 | 5.9 | 7.4 |
| (a2-1-3) | 18.1 | 8.0 | 10.9 |
| (a3-1-1) | 17.1 | 11.1 | 7.3 |
| (a3-2-3) | 17.3 | 9.8 | 6.3 |
| (a3-4-2) | 17.1 | 9.6 | 5.9 |
| (a4-0-12) | 14.1 | 3.7 | 3.2 |
| (a5-1-1) | 16.9 | 3.7 | 3.4 |

HSP coordinates of the following resins were determined as the product sum of the values obtained by multiplying a HSP coordinate of each one monomer by the mole ratio of the monomer. Specifically, the coordinate of the parameter δd of Resin A1 was calculated by the following formula. The parameter δd=[the mole ratio of Monomer (a1-1-3)/100]× [the parameter δd of Monomer (a1-1-3)]+[the mole ratio of Monomer (a1-2-9)/100]×[the parameter δd of Monomer (a1-2-9)]+[the mole ratio of Monomer (a2-1-3)/100]×[the parameter δd of Monomer (a2-1-3)]+[the mole ratio of Monomer (a3-4-2)/100]×[the parameter δd of Monomer (a3-4-2)]

<Distance of Hansen Solubility Parameters>

A distance of Hansen solubility parameters is sometimes referred to as "HSP distance".

A HSP distance between each resin and butyl acetate was calculated according to the formula represented by formula (1), using version 4.1.

$$R=(4\times(\delta d_R-15.8)^2+(\delta p_R-3.7)^2+(\delta h_R-6.3)^2)_{1/2} \quad (1)$$

(In the formula, $\delta d_R$, $\delta p_R$, $\delta h_R$ and R are as defined above.)

Synthesis Example 1

Monomer (a1-1-3), monomer (a1-2-9), monomer (a2-1-3) and monomer (a3-4-2) were mixed together with the mole ratio of the monomers being 35:15:3:47 [monomer (a1-1-3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Azobisisobutyronitrile and azobis(2,4-dimethylvaleronitrile) were added as initiators to the solution in the amounts of 1% by mole and 3% by mole respectively with respect to the total amount of monomers, and the resultant mixture was heated at 75° C. for about 5 hours. Then, the obtained reaction mixture was poured into a large amount of a mixture of methanol and ion exchanged water to precipitate a resin. The obtained resin was filtrated. The obtained resin was dissolved in propyleneglycolmonomethylether acetate to obtain a solution, and the solution was poured into a mixture of methanol and ion exchanged water to precipitate a resin. The obtained resin was filtrated. These operations were conducted twice to provide the resin having a weight average molecular weight of about 7700 in 70% yield. This resin, which had the structural units of the following formulae, was referred to Resin A1. The HSP distance between the resin and butyl acetate was 3.83.

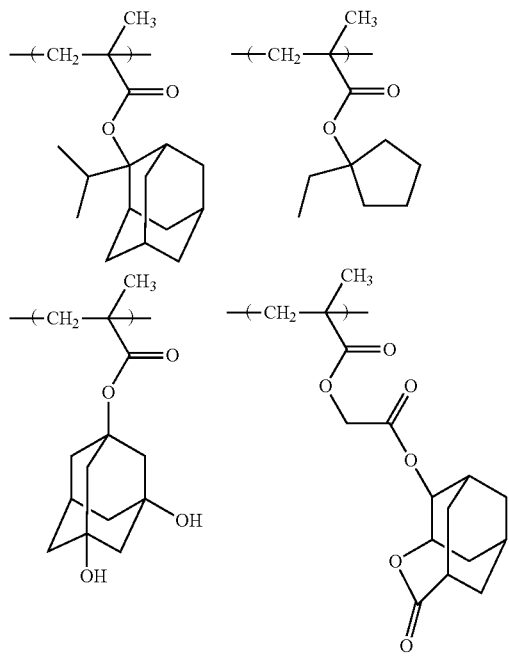

Synthesis Example 2

Monomer (a1-1-3), monomer (a1-2-9), monomer (a2-1-3) and monomer (a3-4-2) were mixed together with the mole ratio of the monomers being 30:20:3:47 [monomer (a1-1-3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8000 in 72% yield. This resin, which had the structural units of the following formulae, was referred to Resin A2. The HSP distance between the resin and butyl acetate was 3.79.

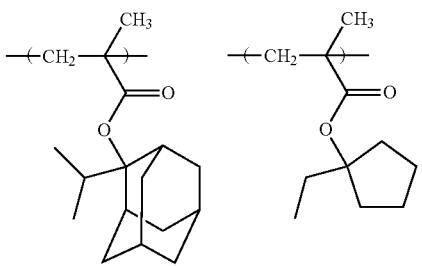

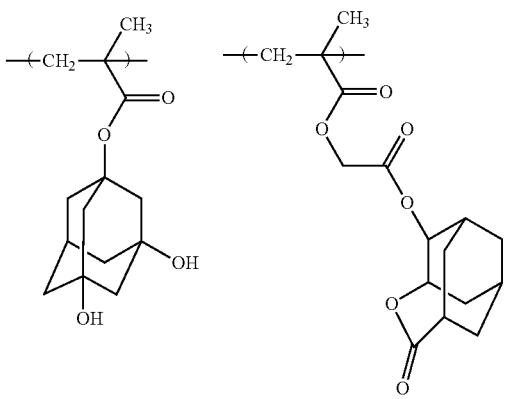

Synthesis Example 3

Monomer (a1-1-3), monomer (a1-2-9), monomer (a2-1-3) and monomer (a3-4-2) were mixed together with the mole ratio of the monomers being 25:25:3:47 [monomer (a1-1-3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8300 in 74% yield. This resin, which had the structural units of the following formulae, was referred to Resin A3. The HSP distance between the resin and butyl acetate was 3.76.

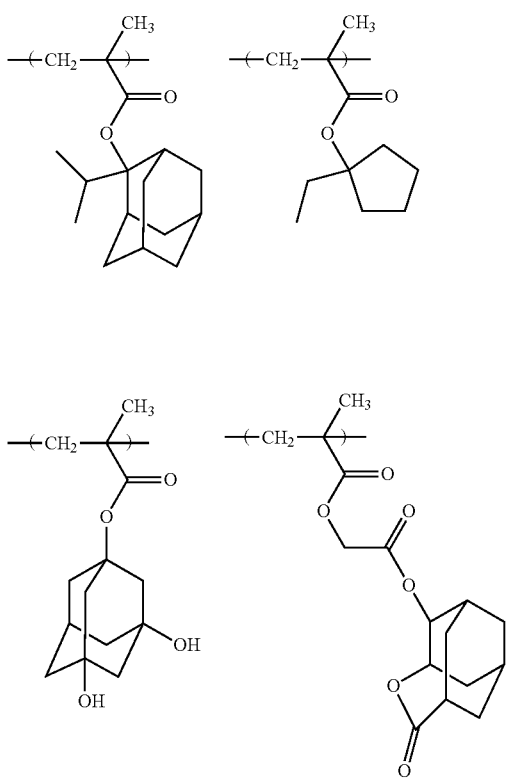

Synthesis Example 4

Monomer (a1-1-3), monomer (a1-2-9), monomer (a2-1-3) and monomer (a3-4-2) were mixed together with the mole ratio of the monomers being 20:30:3:47 [monomer (a1-1-3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8400 in 75% yield. This resin, which had the structural units of the following formulae, was referred to Resin A4. The HSP distance between the resin and butyl acetate was 3.72.

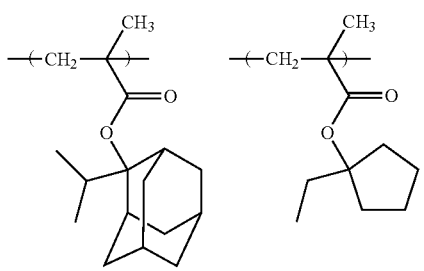

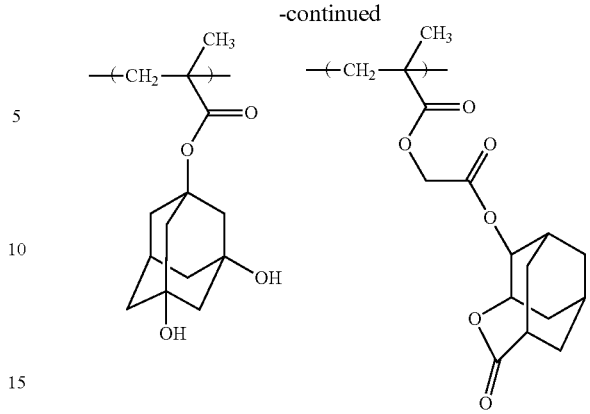

Synthesis Example 5

Monomer (a1-1-3), monomer (a1-2-9), monomer (a2-1-3) and monomer (a3-4-2) were mixed together with the mole ratio of the monomers being 15:35:3:47 [monomer (a1-1-3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8600 in 76% yield. This resin, which had the structural units of the following formulae, was referred to Resin A5. The HSP distance between the resin and butyl acetate was 3.68.

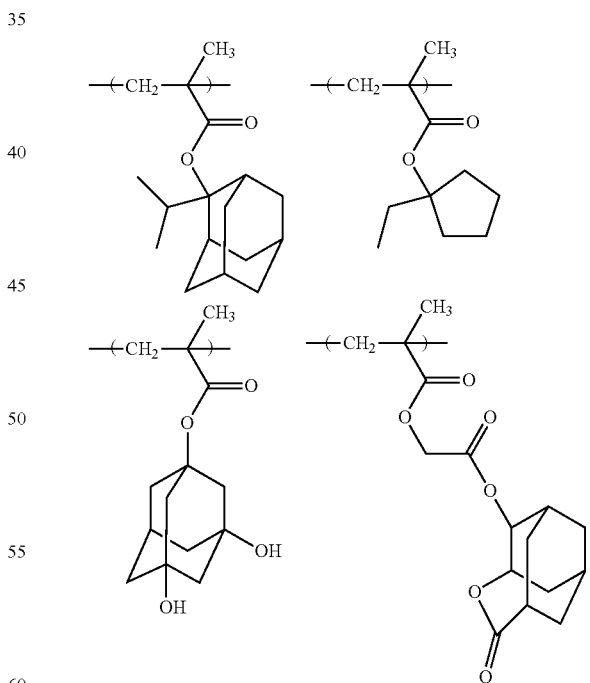

Synthesis Example 6

Monomer (a1-1-3), monomer (a1-2-9), monomer (a2-1-3) and monomer (a3-4-2) were mixed together with the mole ratio of the monomers being 10:40:3:47 [monomer (a1-1-

3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8800 in 78% yield. This resin, which had the structural units of the following formulae, was referred to Resin A6. The HSP distance between the resin and butyl acetate was 3.65.

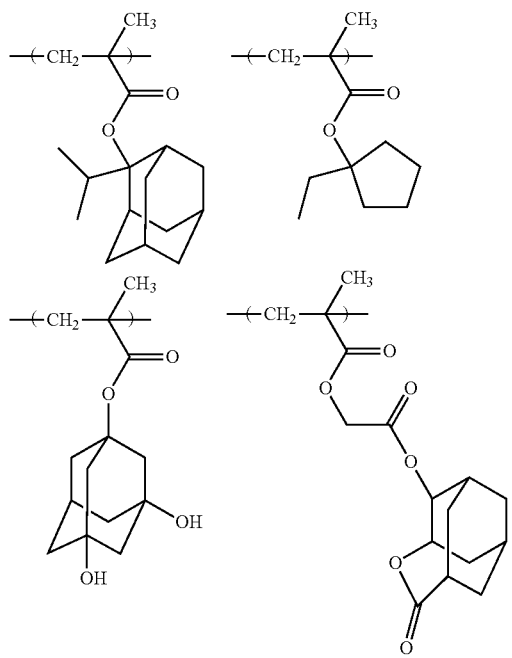

Synthesis Example 7

Monomer (a1-1-3), monomer (a1-2-9), monomer (a2-1-3) and monomer (a3-4-2) were mixed together with the mole ratio of the monomers being 5:45:3:47 [monomer (a1-1-3): monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8900 in 80% yield. This resin, which had the structural units of the following formulae, was referred to Resin A7. The HSP distance between the resin and butyl acetate was 3.62.

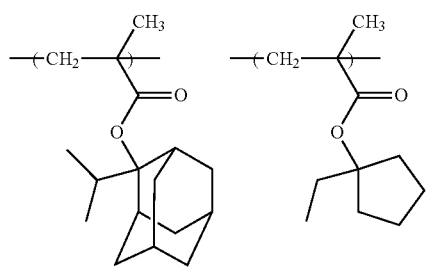

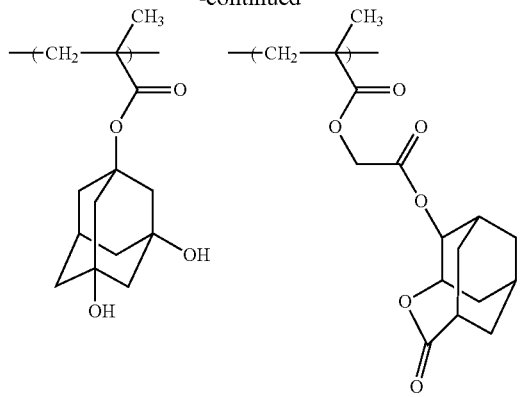

Synthesis Example 8

Monomer (a1-1-3), monomer (a1-2-9) and monomer (a3-4-2) were mixed together with the mole ratio of the monomers being 35:15:50 [monomer (a1-1-3):monomer (a1-2-9):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7600 in 73% yield. This resin, which had the structural units of the following formulae, was referred to Resin A8. The HSP distance between the resin and butyl acetate was 3.91.

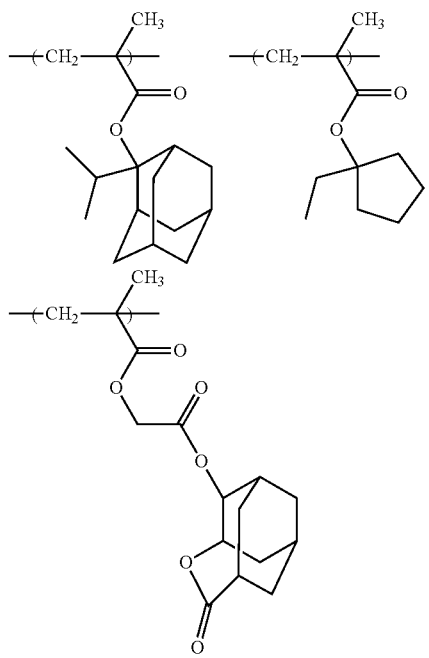

Synthesis Example 9

Monomer (a1-1-3), monomer (a1-2-9) and monomer (a3-4-2) were mixed together with the mole ratio of the monomers being 25:25:50 [monomer (a1-1-3):monomer (a1-2-9): monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7900 in 77% yield. This resin, which had the structural units of the following formulae, was referred to Resin A9. The HSP distance between the resin and butyl acetate was 3.83.

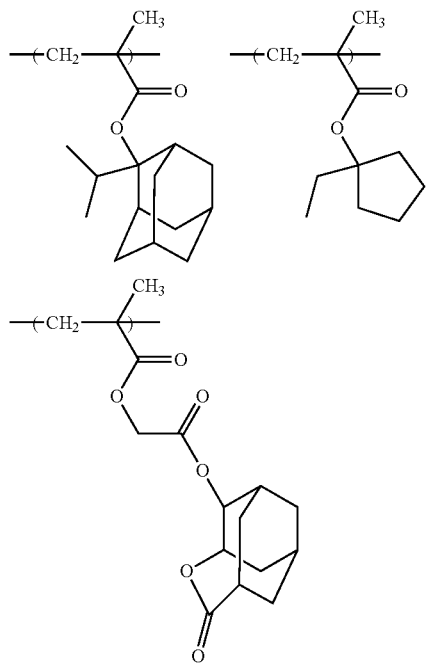

Synthesis Example 10

Monomer (a1-1-3), monomer (a1-2-9) and monomer (a3-4-2) were mixed together with the mole ratio of the monomers being 15:35:50 [monomer (a1-1-3):monomer (a1-2-9):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8200 in 79% yield. This resin, which had the structural units of the following formulae, was referred to Resin A10. The HSP distance between the resin and butyl acetate was 3.75.

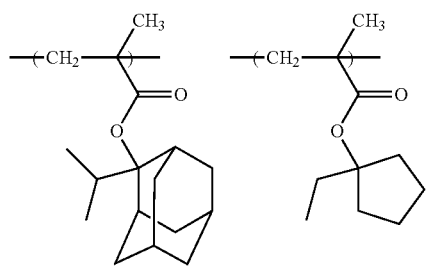

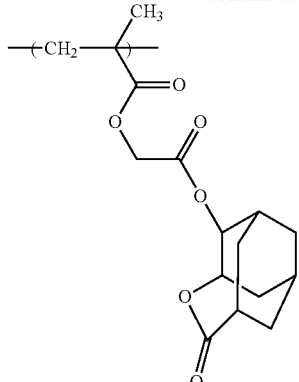

Synthesis Example 11

Monomer (a1-1-3), monomer (a1-2-9), monomer (a2-1-1) and monomer (a3-4-2) were mixed together with the mole ratio of the monomers being 20:20:5:55 [monomer (a1-1-3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7800 in 69% yield. This resin, which had the structural units of the following formulae, was referred to Resin A11. The HSP distance between the resin and butyl acetate was 4.07.

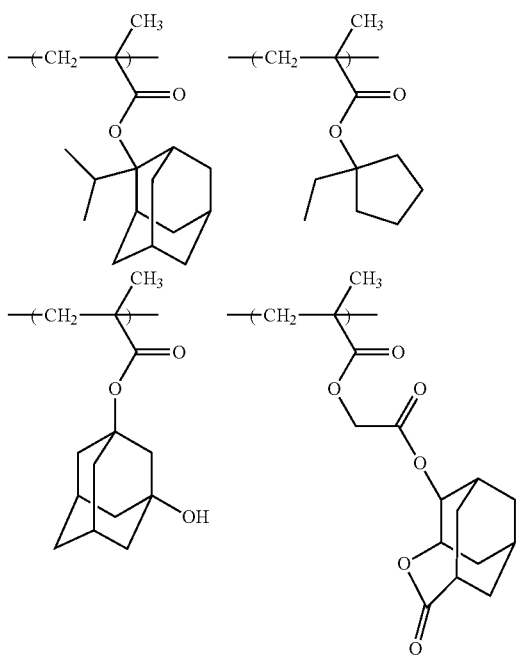

Synthesis Example 12

Monomer (a1-1-2), monomer (a1-2-9), monomer (a2-1-1) and monomer (a3-4-2) were mixed together with the mole ratio of the monomers being 20:20:5:55 [monomer (a1-1-

2):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7900 in 79% yield. This resin, which had the structural units of the following formulae, was referred to Resin A12. The HSP distance between the resin and butyl acetate was 4.11.

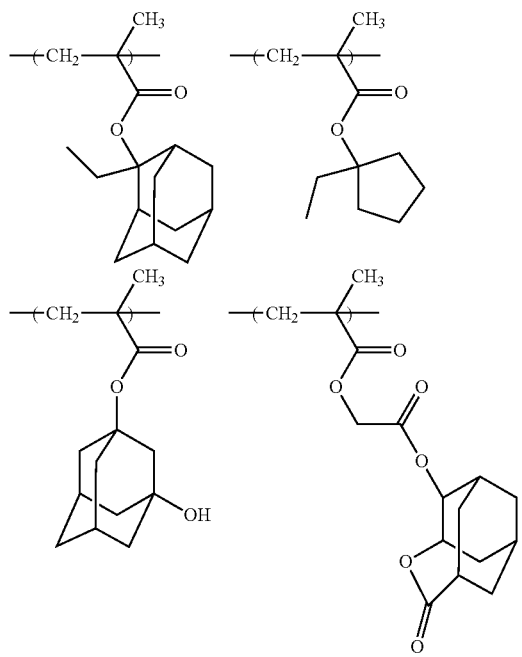

Synthesis Example 13

Monomer (a1-1-1), monomer (a 1-2-9), monomer (a2-1-1) and monomer (a3-4-2) were mixed together with the mole ratio of the monomers being 20:20:5:55 [monomer (a1-1-1):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8300 in 88% yield. This resin, which had the structural units of the following formulae, was referred to Resin A13. The HSP distance between the resin and butyl acetate was 4.13.

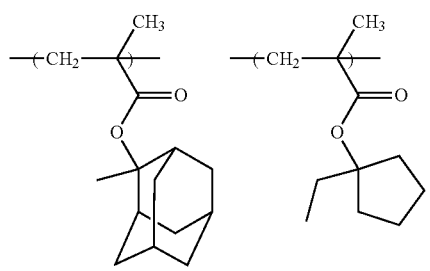

-continued

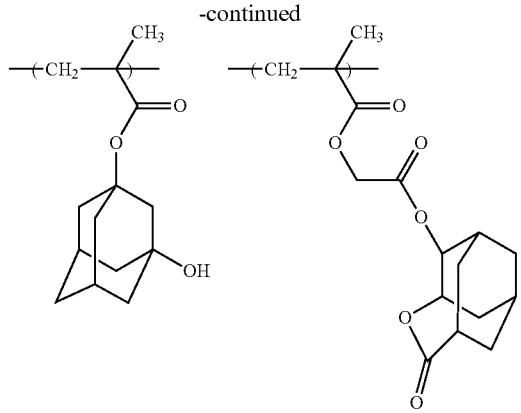

Synthesis Example 14

Monomer (a1-1-3), monomer (a1-2-11), monomer (a2-1-1) and monomer (a3-4-2) were mixed together with the mole ratio of the monomers being 21:24:9:46 [monomer (a1-1-3):monomer (a1-2-11):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8000 in 75% yield. This resin, which had the structural units of the following formulae, was referred to Resin A14. The HSP distance between the resin and butyl acetate was 3.69.

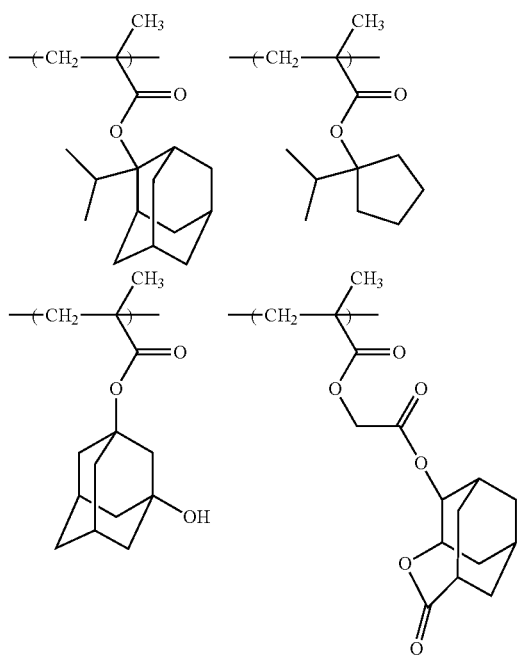

Synthesis Example 15

Monomer (a1-1-3), monomer (a1-2-9), monomer (a2-1-1) and monomer (a3-4-2) were mixed together with the mole ratio of the monomers being 25:25:5:45 [monomer (a1-1-

3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8000 in 74% yield. This resin, which had the structural units of the following formulae, was referred to Resin A15. The HSP distance between the resin and butyl acetate was 3.69.

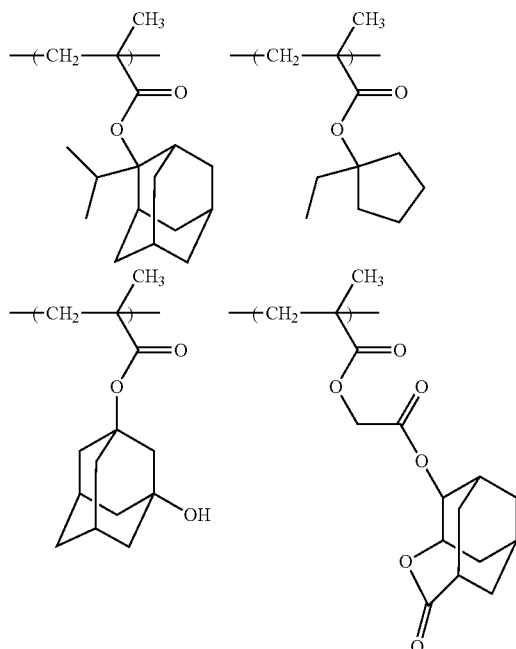

Synthesis Example 16

Monomer (a1-1-3), monomer (a1-2-9), monomer (a2-1-1) and monomer (a3-4-2) were mixed together with the mole ratio of the monomers being 25:15:5:55 [monomer (a1-1-3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7800 in 70% yield. This resin, which had the structural units of the following formulae, was referred to Resin A16. The HSP distance between the resin and butyl acetate was 4.10.

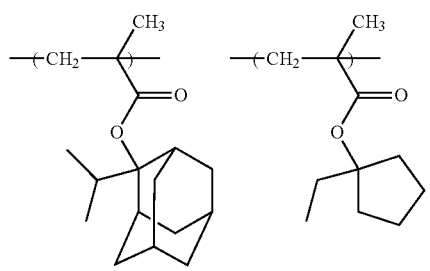

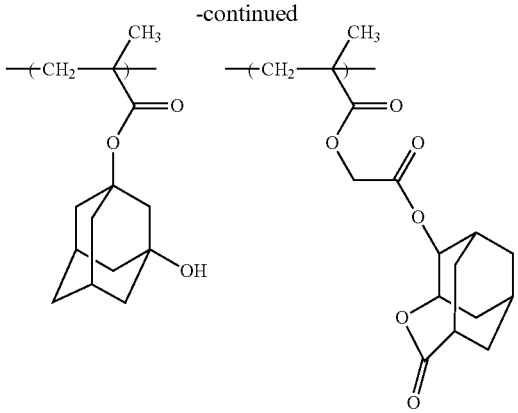

Synthesis Example 17

Monomer (a1-1-3), monomer (a1-2-9), monomer (a2-1-1) and monomer (a3-4-2) were mixed together with the mole ratio of the monomers being 5:30:5:60 [monomer (a1-1-3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8500 in 78% yield. This resin, which had the structural units of the following formulae, was referred to Resin A17. The HSP distance between the resin and butyl acetate was 4.25.

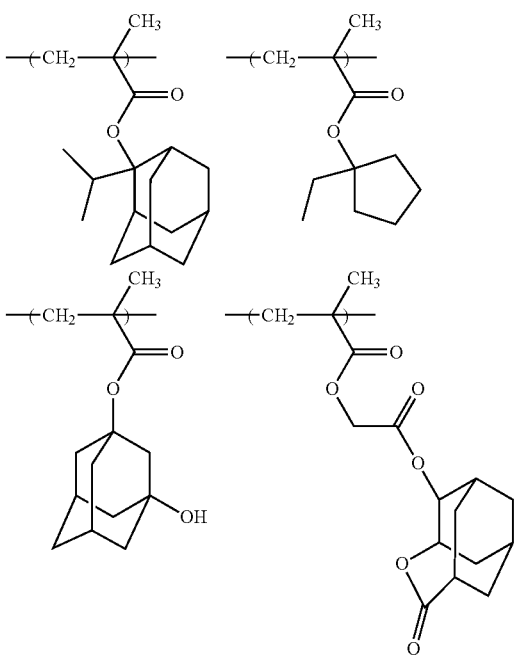

Synthesis Example 18

Monomer (a1-1-3), monomer (a1-2-9), monomer (a2-1-1) and monomer (a3-4-2) were mixed together with the mole ratio of the monomers being 30:20:20:30 [monomer (a1-1-

3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7800 in 63% yield. This resin, which had the structural units of the following formulae, was referred to Resin A18. The HSP distance between the resin and butyl acetate was 3.83.

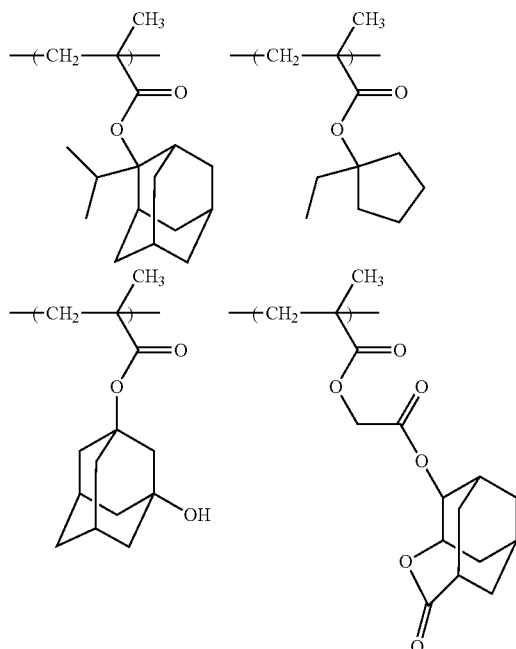

Synthesis Example 19

Monomer (a1-1-3), monomer (a1-0-1) and monomer (a3-4-2) were mixed together with the mole ratio of the monomers being 35:15:50 [monomer (a1-1-3): monomer (a1-0-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7900 in 64% yield. This resin, which had the structural units of the following formulae, was referred to Resin A19. The HSP distance between the resin and butyl acetate was 3.68.

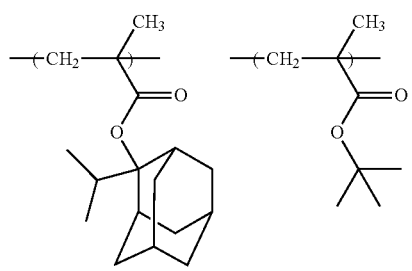

-continued

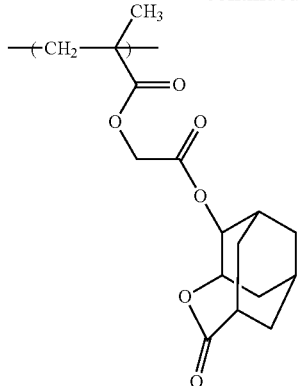

Synthesis Example 20

Monomer (a1-1-3), monomer (a1-2-9), monomer (a1-0-1) and monomer (a3-4-2) were mixed together with the mole ratio of the monomers being 25:15:10:50 [monomer (a1-1-3):monomer (a1-2-9):monomer (a1-0-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7900 in 67% yield. This resin, which had the structural units of the following formulae, was referred to Resin A20. The HSP distance between the resin and butyl acetate was 3.67.

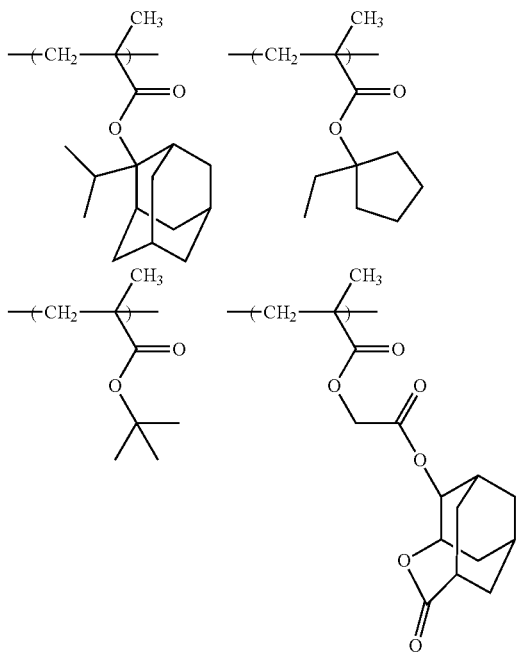

Synthesis Example 21

Monomer (a1-1-3), monomer (a1-2-9), monomer (a2-1-3) and monomer (a3-1-1) were mixed together with the mole ratio of the monomers being 35:15:3:47 [monomer (a1-1-

3):monomer (a1-2-9):monomer (a2-1-3):monomer (a3-1-1)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8500 in 68% yield. This resin, which had the structural units of the following formulae, was referred to Resin A21. The HSP distance between the resin and butyl acetate was 4.05.

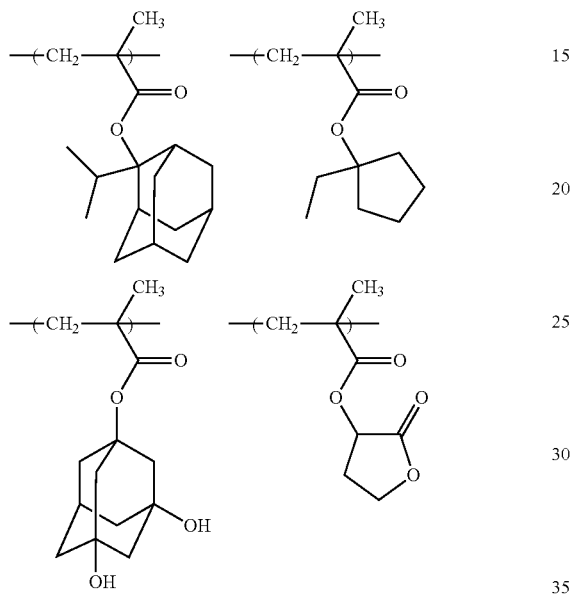

Synthesis Example 22

Monomer (a1-1-3), monomer (a1-2-9), monomer (a2-1-3) and monomer (a3-2-3) were mixed together with the mole ratio of the monomers being 35:15:3:47 [monomer (a1-1-3):monomer (a1-2-9):monomer (a2-1-3):monomer (a3-2-3)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8200 in 66% yield. This resin, which had the structural units of the following formulae, was referred to Resin A22. The HSP distance between the resin and butyl acetate was 3.91.

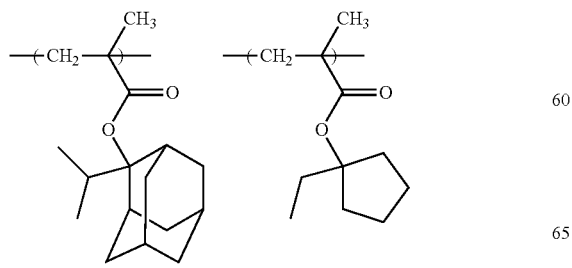

-continued

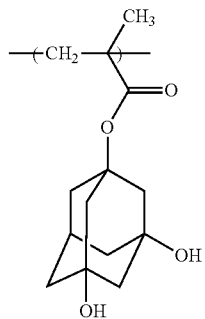

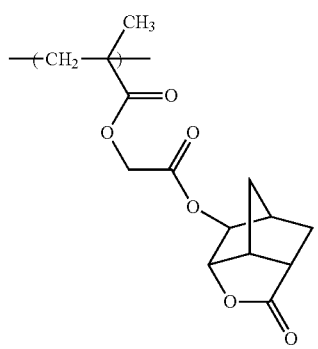

Synthesis Example 23

Monomer (a1-1-3), monomer (a1-0-10) and monomer (a3-4-2) were mixed together with the mole ratio of the monomers being 35:15:50 [monomer (a1-1-3):monomer (a1-0-10):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7900 in 60% yield. This resin, which had the structural units of the following formulae, was referred to Resin A23. The HSP distance between the resin and butyl acetate was 3.99.

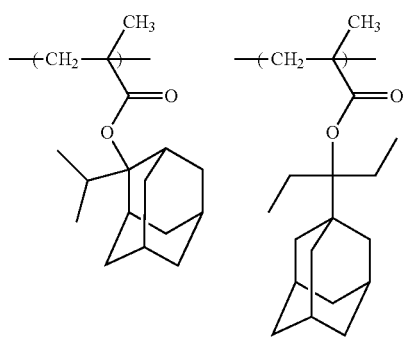

-continued

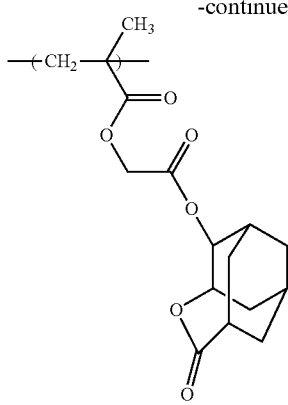

Synthesis Example 24

Monomer (a1-1-3), monomer (a1-O-10) and monomer (a3-4-2) were mixed together with the mole ratio of the monomers being 25:25:50 [monomer (a1-1-3):monomer (a1-O-10):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7800 in 65% yield. This resin, which had the structural units of the following formulae, was referred to Resin A24. The HSP distance between the resin and butyl acetate was 3.95.

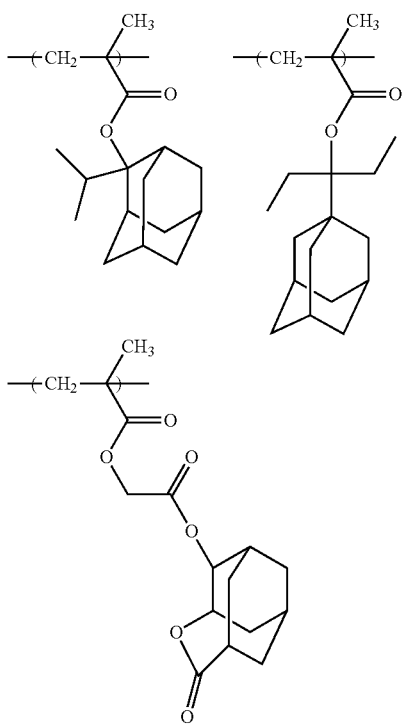

Synthesis Example 25

Monomer (a1-1-3), monomer (a1-O-10) and monomer (a3-4-2) were mixed together with the mole ratio of the monomers being 15:35:50 [monomer (a1-1-3):monomer (a1-O-10):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8100 in 70% yield. This resin, which had the structural units of the following formulae, was referred to Resin A25. The HSP distance between the resin and butyl acetate was 3.91.

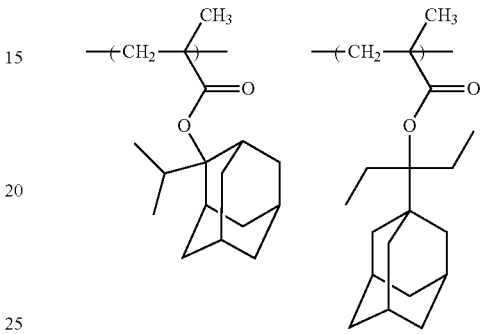

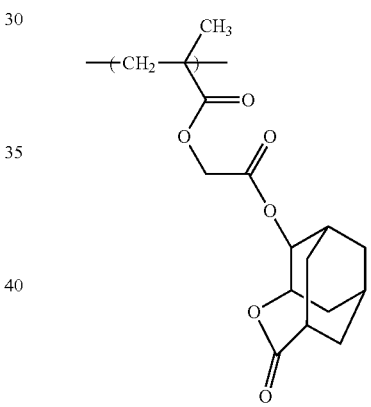

Synthesis Example 26

Monomer (a1-1-3), monomer (a1-2-9), monomer (a1-O-10) and monomer (a3-4-2) were mixed together with the mole ratio of the monomers being 25:15:10:50 [monomer (a1-1-3):monomer (a1-2-9):monomer (a1-O-10):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8000 in 64% yield. This resin, which had the structural units of the following formulae, was referred to Resin A26. The HSP distance between the resin and butyl acetate was 3.87.

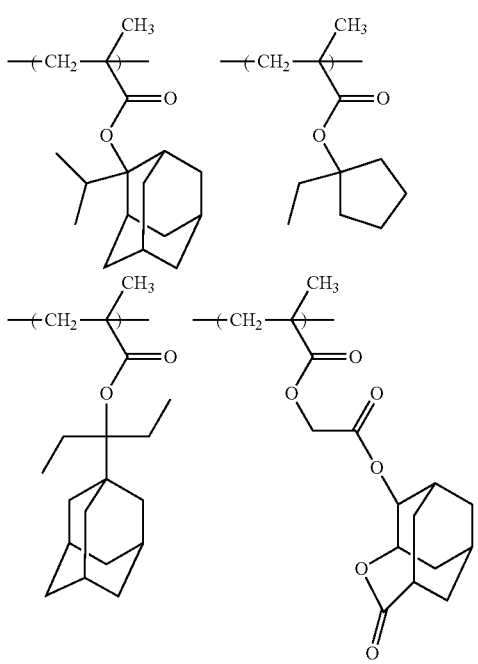

Synthesis Example 27

To a mixture of Monomer (a5-1-1) and monomer (a4-0-12) the molar ratio of which was 50:50, methylisobutylketone was added in the amount equal to 1.2 times by mass of the total amount of monomers to obtain a solution. Azobisisobutyronitrile was added as initiators to the solution in the amounts of 3% by mole respectively with respect to the total amount of monomers, and the resultant mixture was heated at 70° C. for about 5 hours. The obtained reaction mixture was poured into a large amount of a mixture of methanol and ion exchanged water to precipitate a resin. The obtained resin was filtrated to provide the copolymer having a weight average molecular weight of about 10000 in 91% yield. This resin, which had the structural units of the following formulae, was referred to Resin X1.

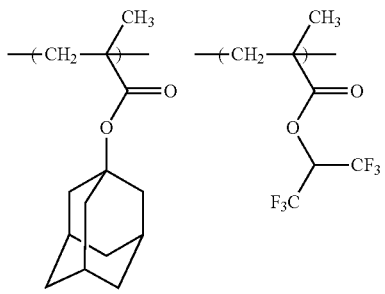

Synthesis Example 28

Monomer (a1-1-3), monomer (a1-2-9), monomer (a2-1-3) and monomer (a3-4-2) were mixed together with the mole ratio of the monomers being 45:14:2.5:38.5 [monomer (a1-1-3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7600 in 68% yield. This resin, which had the structural units of the following formulae, was referred to Resin AX1. The HSP distance between the resin and butyl acetate was 3.68.

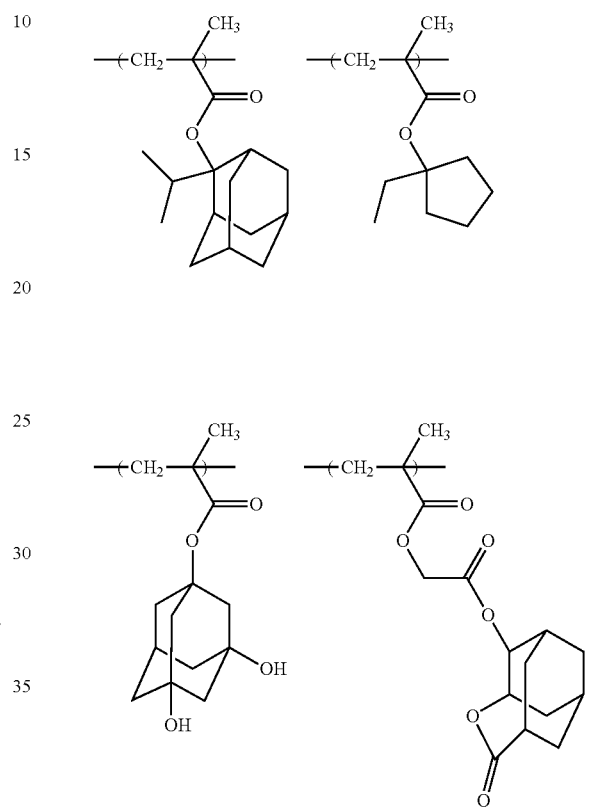

Synthesis Example 29

Monomer (a1-1-3), monomer (a1-2-9), monomer (a2-1-3) and monomer (a3-4-2) were mixed together with the mole ratio of the monomers being 45:5:3:47 [monomer (a1-1-3):monomer (a1-2-9):monomer (a2-1-3):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7900 in 61% yield. This resin, which had the structural units of the following formulae, was referred to Resin AX2. The HSP distance between the resin and butyl acetate was 3.92.

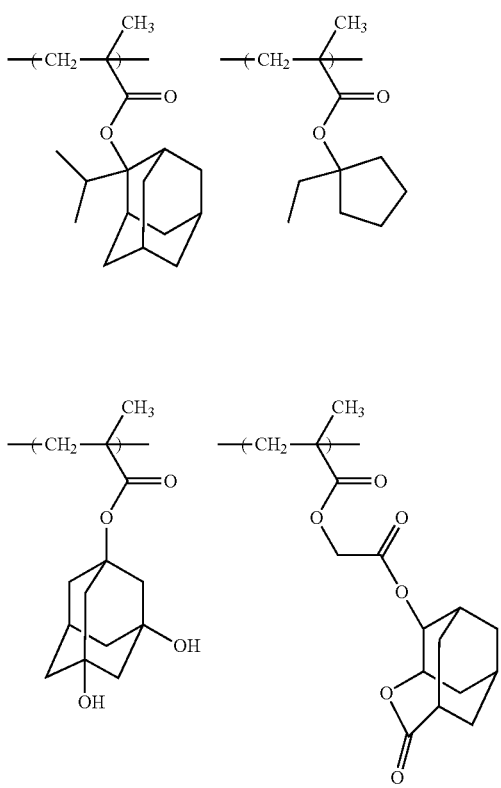

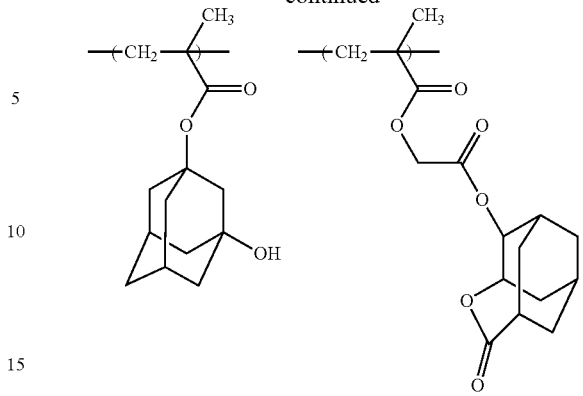

Synthesis Example 31

Monomer (a1-1-3), monomer (a1-2-9), monomer (a2-1-1) and monomer (a3-4-2) were mixed together with the mole ratio of the monomers being 25:10:5:60 [monomer (a1-1-3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 8200 in 69% yield. This resin, which had the structural units of the following formulae, was referred to Resin AX4. The HSP distance between the resin and butyl acetate was 4.33.

Synthesis Example 30

Monomer (a1-1-3), monomer (a1-2-9), monomer (a2-1-1) and monomer (a3-4-2) were mixed together with the mole ratio of the monomers being 35:25:20:20 [monomer (a1-1-3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Using the mixture, a resin was produced in the same manner as Synthesis Example 1. The obtained resin had a weight average molecular weight of about 7900 in 60% yield. This resin, which had the structural units of the following formulae, was referred to Resin AX3. The HSP distance between the resin and butyl acetate was 3.22.

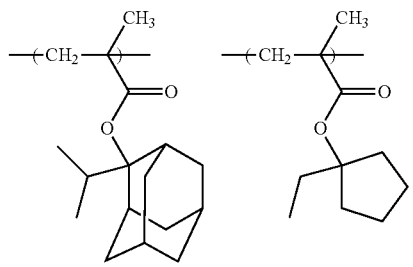

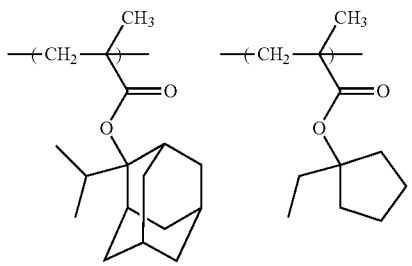

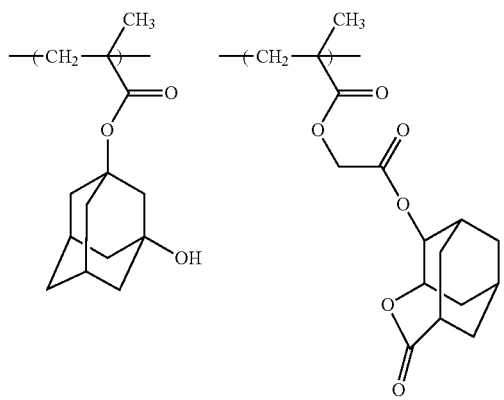

TABLE 2

| Photoresist Comp. | Resin (Kind/parts) | Acid Generator (B) (Kind/parts) | Quencher (D) ((Kind/parts) | PB/PEB |
|---|---|---|---|---|
| Composition 1 | X1/0.2<br>A1/10 | B1-21/0.90<br>B1-22/0.45 | D1/0.28 | 90° C./90° C. |
| Composition 2 | X1/0.2<br>A2/10 | B1-21/0.90<br>B1-22/0.45 | D1/0.28 | 90° C./90° C. |
| Composition 3 | X1/0.2<br>A3/10 | B1-21/0.90<br>B1-22/0.45 | D1/0.28 | 90° C./90° C. |
| Composition 4 | X1/0.2<br>A4/10 | B1-21/0.55<br>B1-22/0.45 | D1/0.28 | 90° C./90° C. |
| Composition 5 | X1/0.2<br>A5/10 | B1-21/0.90<br>B1-22/0.45 | D1/0.28 | 90° C./90° C. |
| Composition 6 | X1/0.2<br>A6/10 | B1-21/0.90<br>B1-22/0.45 | D1/0.28 | 90° C./90° C. |
| Composition 7 | X1/0.2<br>A7/10 | B1-21/0.55<br>B1-22/0.45 | D1/0.28 | 90° C./90° C. |
| Composition 8 | X1/0.2<br>A8/10 | B1-21/0.55<br>B1-22/0.45 | D1/0.28 | 90° C./90° C. |
| Composition 9 | X1/0.2<br>A9/10 | B1-21/0.55<br>B1-22/0.45 | D1/0.28 | 90° C./90° C. |
| Composition 10 | X1/0.2<br>A10/10 | B1-21/0.55<br>B1-22/0.45 | D1/0.28 | 90° C./90° C. |
| Composition 11 | X1/0.2<br>A11/10 | B1-21/0.55<br>B1-22/0.45 | D1/0.28 | 90° C./90° C. |
| Composition 12 | X1/0.2<br>A12/10 | B1-21/0.55<br>B1-22/0.45 | D1/0.28 | 100° C./100° C. |
| Composition 13 | X1/0.2<br>A13/10 | B1-21/0.55<br>B1-22/0.45 | D1/0.28 | 110° C./110° C. |
| Composition 14 | X1/0.2<br>A14/10 | B1-21/0.55<br>B1-22/0.45 | D1/0.28 | 90° C./90° C. |
| Composition 15 | X1/0.2<br>A15/10 | B1-21/0.55<br>B1-22/0.45 | D1/0.28 | 90° C./90° C. |
| Composition 16 | X1/0.2<br>A16/10 | B1-21/0.55<br>B1-22/0.45 | D1/0.28 | 90° C./90° C. |
| Composition 17 | X1/0.2<br>A17/10 | B1-21/0.55<br>B1-22/0.45 | D1/0.28 | 90° C./90° C. |
| Composition 18 | X1/0.2<br>A18/10 | B1-21/0.55<br>B1-22/0.45 | D1/0.28 | 90° C./90° C. |
| Composition 19 | X1/0.2<br>A19/10 | B1-21/0.55<br>B1-22/0.45 | D1/0.28 | 90° C./90° C. |
| Composition 20 | X1/0.2<br>A20/10 | B1-21/0.55<br>B1-22/0.45 | D1/0.28 | 90° C./90° C. |
| Composition 21 | X1/0.2<br>A21/10 | B1-21/0.55<br>B1-22/0.45 | D1/0.28 | 90° C./90° C. |
| Composition 22 | X1/0.2<br>A22/10 | B1-21/0.55<br>B1-22/0.45 | D1/0.28 | 90° C./90° C. |
| Composition 23 | X1/0.2<br>A23/10 | B1-21/0.55<br>B1-22/0.45 | D1/0.28 | 90° C./90° C. |
| Composition 24 | X1/0.2<br>A24/10 | B1-21/0.55<br>B1-22/0.45 | D1/0.28 | 90° C./90° C. |
| Composition 25 | X1/0.2<br>A25/10 | B1-21/0.55<br>B1-22/0.45 | D1/0.28 | 90° C./90° C. |
| Composition 26 | X1/0.2<br>A26/10 | B1-21/0.55<br>B1-22/0.45 | D1/0.28 | 90° C./90° C. |
| Comparative Composition 1 | X1/0.2<br>AX-1/10 | B1-21/0.90<br>B1-22/0.45 | D1/0.28 | 90° C./90° C. |
| Comparative Composition 2 | X1/0.2<br>AX-2/10 | B1-21/0.90<br>B1-22/0.45 | D1/0.28 | 90° C./90° C. |
| Comparative Composition 3 | X1/0.2<br>AX-3/10 | B1-21/0.90<br>B1-22/0.45 | D1/0.28 | 90° C./90° C. |
| Comparative Composition 4 | X1/0.2<br>AX-4/10 | B1-21/0.90<br>B1-22/0.45 | D1/0.28 | 90° C./90° C. |

The symbols listed in Table 2 represent the following ones.

<Resin>

A1 to A26, AX-1 to AX-4: Resins A1 to A26, Resins AX-1 to AX-4, each prepared by the methods as described above.

<Acid Generator (B)>

B1-21: The salt represented by the formula (B1-21), prepared according to JP2012-224611A1

B1-22: The salt represented by the formula (B1-22), prepared according to JP2012-224611A1

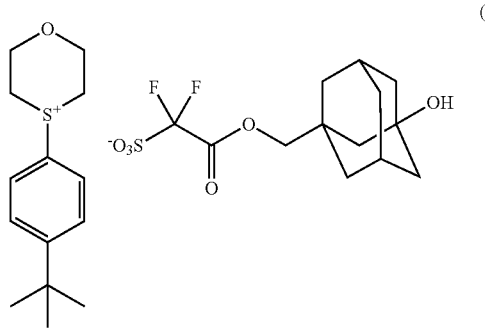

(B1-21)

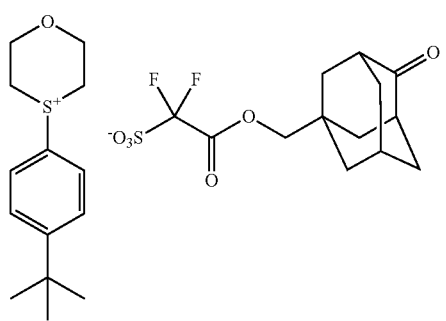

(B1-22)

<Quencher (D)>

D1: The compound as follow, a product of Tokyo Chemical Industry Co., LTD

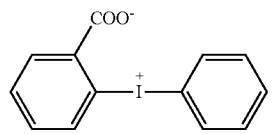

<Solvent for Photoresist Compositions>

| | |
|---|---|
| Propyleneglycolmonomethyl ether acetate | 265 parts |
| Propyleneglycolmonomethyl ether | 20 parts |
| 2-Heptanone | 20 parts |
| γ-butyrolactone | 3.5 parts |

<Producing Photoresist Patterns>

A composition for an organic antireflective film ("ARC-29", by Nissan Chemical Co. Ltd.) was applied onto 12-inch silicon wafer and baked for 60 seconds at 205° C. to form a 78 nm thick organic antireflective film. One of the photoresist compositions was then applied thereon by spin coating in such a manner that the thickness of the film after drying (pre-baking) became 85 nm.

The obtained wafer was then pre-baked for 60 seconds on a direct hot plate at the temperature given in the "PB" column in Table 2.

On the wafers on which the photoresist film had thus formed, the film was then exposed through a mask for forming contact hole patterns (hole pitch 90 nm/hole diameter 55 nm) while changing exposure quantity stepwise, with an ArF excimer laser stepper for liquid-immersion lithography ("XT:1900Gi" by ASML Ltd.: NA=1.35, 3/4 Annular X-Y-pol. lighting). Ultrapure water was used as medium for liquid-immersion.

After the exposure, post-exposure baking was carried out for 60 seconds at the temperature given in the "PEB" column in Table 2.

Then, development was carried out with butyl acetate (a product of Tokyo Chemical Industry Co., LTD) at 23° C. for 20 seconds in the manner of dynamic dispensing method to obtain negative photoresist patterns.

Effective sensitivity was determined as the exposure quantity at which the photoresist pattern having 50 nm hole diameter was obtained by the exposure using the above-mentioned mask.

<Evaluation as to Critical Dimension Uniformity (CDU)>

The photoresist patterns were formed by the same method as described above in which exposure was conducted at the effective sensitivity. The hole diameter was measured at 24 points per one hole of the pattern. The average of the values determined as the hole diameter was defined as the average hole diameter of the hole.

As to the average hole diameter, the standard deviation was obtained based on the population which consisted of 400 holes within the same wafer.

When the standard deviation was not more than 1.70 nm, it was evaluated as "∘∘" (very good). When the standard deviation was from 1.7 nm to 2 nm, it was evaluated as "∘" (good).

When the standard deviation was more than 2 nm, it was evaluated as "×" (bad).

<Film Retention Ratio>

The film retention ratio was determined as the change of the film thickness at an exposed portion between a pre-baked composition film and a photoresist film obtained by development. For the evaluation, exposure was conducted with the effective sensitivity in the production of a photoresist pattern.

<Residue>

The patterns obtained by the above-mentioned process in which exposure was conducted at the effective sensitivity were checked with a scanning electron microscope [product name: CG-5000, made by Hitachi High technologies corporation] at 200000-fold magnification.

When no residue was observed on the unexposed areas, it was evaluated as "∘" (good). When any residue was observed on the areas, it was evaluated as "×" (bad).

Table 3 illustrates the results thereof. The parenthetical number in each column of "CDU" represents the standard deviation (nm).

TABLE 3

| | Photoresist Composition | CDU | Residue | Film retention ratio |
|---|---|---|---|---|
| Ex. 1 | Composition 1 | ∘∘(1.68) | ∘ | 67% |
| Ex. 2 | Composition 2 | ∘∘(1.67) | ∘ | 68% |
| Ex. 3 | Composition 3 | ∘∘(1.65) | ∘ | 71% |

TABLE 3-continued

| | Photoresist Composition | CDU | Residue | Film retention ratio |
|---|---|---|---|---|
| Ex. 4 | Composition 4 | ∘∘(1.66) | ∘ | 74% |
| Ex. 5 | Composition 5 | ∘∘(1.67) | ∘ | 76% |
| Ex. 6 | Composition 6 | ∘∘(1.69) | ∘ | 78% |
| Ex. 7 | Composition 7 | ∘∘(1.69) | ∘ | 80% |
| Ex. 8 | Composition 8 | ∘∘(1.65) | ∘ | 70% |
| Ex. 9 | Composition 9 | ∘∘(1.63) | ∘ | 75% |
| Ex. 10 | Composition 10 | ∘∘(1.63) | ∘ | 80% |
| Ex. 11 | Composition 11 | ∘(1.71) | ∘ | 70% |
| Ex. 12 | Composition 12 | ∘(1.80) | ∘ | 71% |
| Ex. 13 | Composition 13 | ∘(1.86) | ∘ | 72% |
| Ex. 14 | Composition 14 | ∘∘(1.63) | ∘ | 73% |
| Ex. 15 | Composition 15 | ∘∘(1.65) | ∘ | 71% |
| Ex. 16 | Composition 16 | ∘(1.79) | ∘ | 69% |
| Ex. 17 | Composition 17 | ∘(1.76) | ∘ | 75% |
| Ex. 18 | Composition 18 | ∘(1.88) | ∘ | 65% |
| Ex. 19 | Composition 19 | ∘∘(1.65) | ∘ | 69% |
| Ex. 20 | Composition 20 | ∘∘(1.64) | ∘ | 74% |
| Ex. 21 | Composition 21 | ∘(1.92) | ∘ | 65% |
| Ex. 22 | Composition 22 | ∘(1.74) | ∘ | 67% |
| Ex. 23 | Composition 23 | ∘∘(1.64) | ∘ | 68% |
| Ex. 24 | Composition 24 | ∘∘(1.62) | ∘ | 71% |
| Ex. 25 | Composition 25 | ∘∘(1.61) | ∘ | 74% |
| Ex. 26 | Composition 26 | ∘∘(1.62) | ∘ | 72% |
| Comparative Ex. 1 | Comparative Composition 1 | ∘(1.71) | ∘ | 60% |
| Comparative Ex. 2 | Comparative Composition 2 | ∘(1.78) | ∘ | 63% |
| Comparative Ex. 3 | Comparative Composition 3 | x(2.17) | ∘ | 64% |
| Comparative Ex. 4 | Comparative Composition 4 | x(2.23) | x | 68% |

The photoresist composition of the disclosure can provide a photoresist pattern with excellent CDU and few residues. Therefore, the photoresist composition can be used for semiconductor microfabrication.

The invention claimed is:

1. A process for producing a photoresist pattern comprising steps (1) to (5);
   (1) applying a photoresist composition onto a substrate, said photoresist composition comprising an acid generator and a resin which comprises a structural unit having an acid-labile group;
   (2) drying the applied composition to form a composition layer;
   (3) exposing the composition layer;
   (4) heating the exposed composition layer; and
   (5) developing the heated composition layer with a developer which comprises butyl acetate,
   wherein a distance of Hansen solubility parameters between the resin and butyl acetate is from 3.3 to 4.3, the distance is calculated from formula (1):

$$R = (4 \times (\delta d_R - 15.8)^2 + (\delta p_R - 3.7)2 + (\delta h_R - 6.3)^2)^{1/2} \quad (1)$$

in which $\delta d_R$ represents a dispersion parameter of a resin, $\delta p_R$ represents a polarity parameter of a resin, $\delta h_R$ represents a hydrogen bonding parameter of a resin, and R represents a distance of Hansen solubility parameters,
   a film retention ratio of an exposed portion in the photoresist pattern relative to the composition layer is adjusted to 65% or more,
   the resin comprises
   a structural unit represented by formula (a1-1) and
   at least one selected from the group consisting of a structural unit represented by formula (a1-0) and a structural unit represented by formula (a1-2):

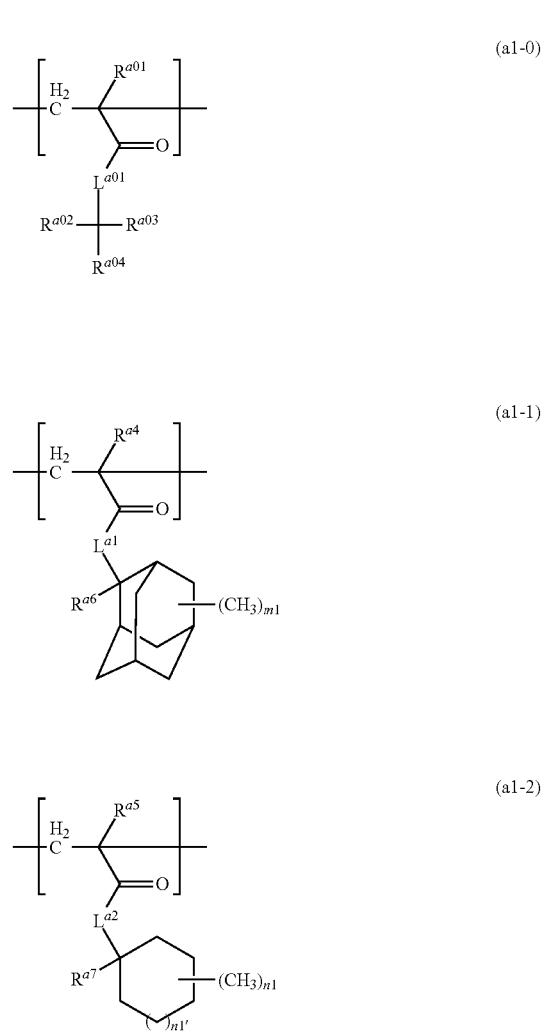

wherein, in each formula, $L^{a01}$, $L^{a1}$ and $L^{a2}$ independently represent —O— or *—O—$(CH_2)_{k01}$—CO—O—, where k01 represents an integer of 1 to 7, and * represents a binding position to —CO—, $R^{a01}$, $R^{a4}$ and $R^{a5}$ independently represent a hydrogen atom or a methyl group, and $R^{a02}$, $R^{a03}$ and $R^{a04}$ independently represent a C1 to C8 alkyl group, a C3 to C18 alicyclic hydrocarbon group or combination thereof, $R^{a6}$ and $R^{a7}$ independently represents a C1 to C8 alkyl group, a C3 to C18 alicyclic hydrocarbon group or a combination thereof, m1 represents an integer of 0 to 14, n1 represents an integer of 0 to 10, and n1' represents an integer of 0 to 3, and the total proportion of the structural unit represented by formula (a1-1) is 35% by mole or less with respect to the total structural units of the resin, and the total proportion of the structural unit represented by formula (a1-0) and the structural unit represented by formula (a1-2) is 50% by mole or more with respect to all of the structural units having an acid-labile group, and a structural unit represented by formula (a3-4):

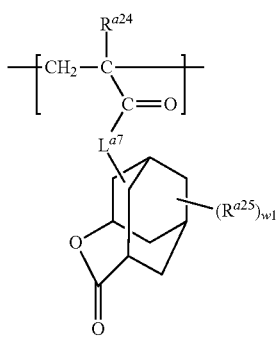

(a3-4)

wherein $R^{a24}$ represents a hydrogen atom, a halogen atom or a C1 to C6 alkyl group which can have a halogen atom,
$L^{a7}$ represents —O—, *—O-$L^{a8}$-O—, *—O-$L^{a8}$-CO—O—, *—O-$L^{a8}$-CO—O-$L^{a9}$-CO—O— or *—O-$L^{a8}$-O—CO-$L^{a9}$-O— where * represents a binding position to a carbonyl group, $L^{a8}$ and $L^{a9}$ independently represents a C1 to C6 alkanediyl group, and $R^{a25}$ in each occurrence represents a carboxy group, a cyano group or a C1 to C4 aliphatic hydrocarbon group, and
w1 represents an integer of 0 to 8, and
the proportion of the structural unit represented by formula (a3-4) is 30% by mole or more with respect to the total structural units of the resin, and
the photoresist composition further comprises a resin comprising a structural unit represented by formula (a4-0):

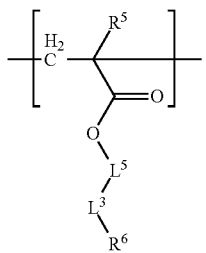

(a4-0)

wherein $R^5$ represents a hydrogen atom or a methyl group,
$L^5$ represent a single bond or a C1 to C4 saturated aliphatic hydrocarbon group, $L^3$ represents a C1 to C8 perfluoroalkanediyl group or a C3 to C12 perfluorocycloalkanediyl group, and $R^6$ represents a hydrogen atom or a fluorine atom, and
a structural unit represented by formula (a5-1):

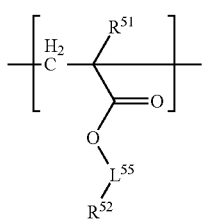

(a5-1)

wherein $R^{51}$ represents a hydrogen atom or a methyl group,
$R^{52}$ represents a C3 to C18 alicyclic hydrocarbon group where a hydrogen atom can be replaced by a C1 to C8 aliphatic hydrocarbon group or a hydroxy group, provided that a hydrogen atom contained in the carbon atom bonded to $L^{55}$ is not replaced by the C1 to C8 aliphatic hydrocarbon group, and
$L^{55}$ represents a single bond or a C1 to C18 divalent saturated hydrocarbon group where a methylene group can be replaced by an oxygen atom or a carbonyl group.

2. A photoresist composition comprising an acid generator and a resin which comprises a structural unit having an acid-labile group;
wherein a distance of Hansen solubility parameters between the resin and butyl acetate is from 3.3 to 4.3, the distance is calculated from formula (1):

$$R=(4\times(\delta d_R-15.8)^2+(\delta p_R-3.7)^2+(\delta h_R-6.3)^2)^{1/2} \quad (1)$$

in which $\delta d_R$ represents a dispersion parameter of a resin, $\delta p_R$ represents a polarity parameter of a resin, $\delta h_R$ represents a hydrogen bonding parameter of a resin, and R represents a distance of Hansen solubility parameters, and
the photoresist composition shows a film retention ratio of an exposed portion in the photoresist pattern relative to the composition layer in the range of 65% or more,
the resin comprises
a structural unit represented by formula (a1-1) and
at least one selected from the group consisting of a structural unit represented by formula (a1-0) and a structural unit represented by formula (a1-2):

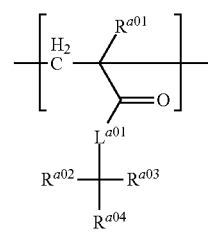

(a1-0)

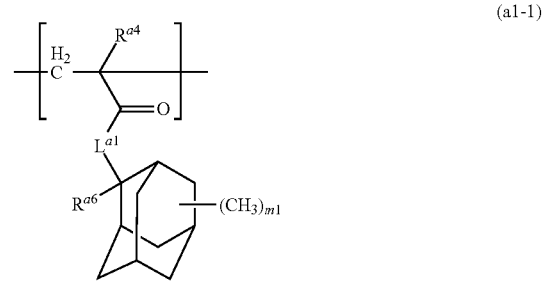

(a1-1)

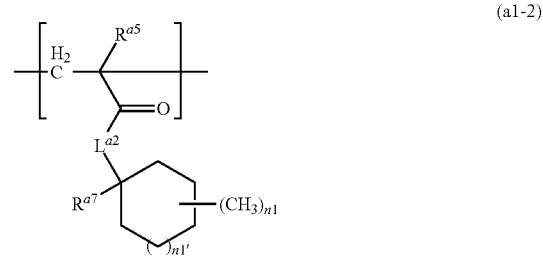

(a1-2)

wherein, in each formula, $L^{a01}$, $L^{a1}$ and $L^{a2}$ independently represent —O— or *—O—(CH$_2$)$_{k01}$—CO—O—, where k01 represents an integer of 1 to 7, and * represents a binding position to —CO—, $R^{a01}$, $R^{a4}$ and $R^{a5}$ independently represent a hydrogen atom or a methyl group, and $R^{a02}$, $R^{a03}$ and $R^{a04}$ independently represent a C1 to C8 alkyl group, a C3 to C18 alicyclic hydrocarbon group or combination thereof, $R^{a6}$ and $R^{a7}$ independently represents a C1 to C8 alkyl group, a C3 to C18 alicyclic hydrocarbon group or a combination thereof, m1 represents an integer of 0 to 14, n1 represents an integer of 0 to 10, and n1' represents an integer of 0 to 3, and the total proportion of the structural unit represented by formula (a1-1) is 35% by mole or less with respect to the total structural units of the resin, and the total proportion of the structural unit represented by formula (a1-0) and the structural unit represented by formula (a1-2) is 50% by mole or more with respect to all of the structural units having an acid-labile group, and a structural unit represented by formula (a3-4):

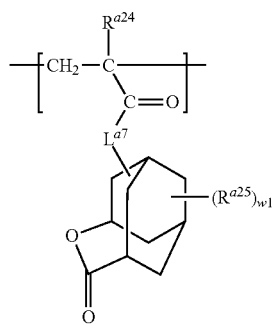

(a3-4)

wherein $R^{a24}$ represents a hydrogen atom, a halogen atom or a C1 to C6 alkyl group which can have a halogen atom, $L^{a1}$ represents —O—, *—O-$L^{a8}$-O—, *—O-$L^{a8}$-CO—O—, *—O-$L^{a8}$-CO—O-$L^{a9}$-CO—O—, or *—O-$L^{a8}$-O—CO-$L^{a9}$-O— where * represents a binding position to a carbonyl group, $L^{a8}$ and $L^{a9}$ independently represents a C1 to C6 alkanediyl group, and $R^{a25}$ in each occurrence represents a carboxy group, a cyano group or a C1 to C4 aliphatic hydrocarbon group, and w1 represents an integer of 0 to 8, and the proportion of the structural unit represented by formula (a3-4) is 30% by mole or more with respect to the total structural units of the resin, and the photoresist composition further comprises a resin comprising a structural unit represented by formula (a4-0):

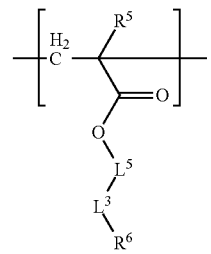

(a4-0)

wherein $R^5$ represents a hydrogen atom or a methyl group, $L^5$ represent a single bond or a C1 to C4 saturated aliphatic hydrocarbon group, $L^3$ represents a C1 to C8 perfluoroalkanediyl group or a C3 to C12 perfluorocycloalkanediyl group, and $R^6$ represents a hydrogen atom or a fluorine atom, and a structural unit represented by formula (a5-1):

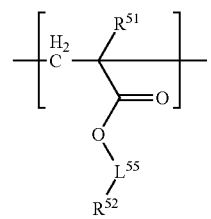

(a5-1)

wherein $R^{51}$ represents a hydrogen atom or a methyl group, $R^{52}$ represents a C3 to C18 alicyclic hydrocarbon group where a hydrogen atom can be replaced by a C1 to C8 aliphatic hydrocarbon group or a hydroxy group, provided that a hydrogen atom contained in the carbon atom bonded to $L^{55}$ is not replaced by the C1 to C8 aliphatic hydrocarbon group, and $L^{55}$ represents a single bond or a C1 to C18 divalent saturated hydrocarbon group where a methylene group can be replaced by an oxygen atom or a carbonyl group.

3. The photoresist composition according to claim 2 wherein the distance of Hansen solubility parameters is 3.6 to 4.0.

4. The photoresist composition according to claim 2 wherein the total proportion of the structural unit represented by formula (a3-4) is 35% by mole or more with respect to the structural units of the resin.

5. The photoresist composition according to claim 2 wherein the resin further comprises a structural unit having a hydroxyl group and no acid-labile group.

6. The photoresist composition according to claim 2 further comprising a salt which generates an acid having an acidity weaker than an acid generated from the acid generator.

7. The photoresist composition according to claim 2 wherein the acid generator is represented by formula (B1):

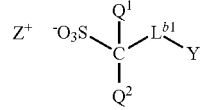

(B1)

wherein $Q^1$ and $Q^2$ each respectively represent a fluorine atom or a C1 to C6 perfluoroalkyl group, $L^{b1}$ represents a C1 to C24 divalent saturated hydrocarbon group where a methylene group can be replaced by an oxygen atom or a carbonyl group and a hydrogen atom can be replaced by a hydroxyl group or fluorine atom, and Y represents an optionally substituted methyl group or an optionally substituted C3 to C18 alicyclic hydrocarbon group where a methylene group can be replaced by an oxygen atom, a carbonyl group or a sulfonyl group, and $Z^+$ represents an organic cation represented by any one of formulae (b2-c-21) to (b2-c-27):

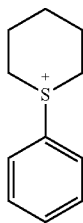

(b2-c-21)

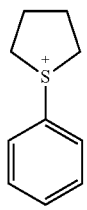

(b2-c-22)

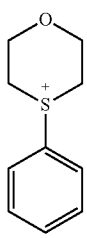

(b2-c-23)

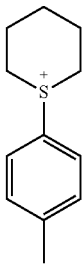

(b2-c-24)

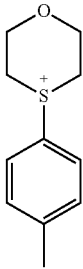

(b2-c-25)

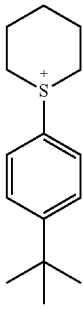

(b2-c-26)

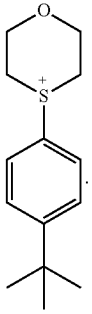

(b2-c-27)

* * * * *